United States Patent
Petti

(10) Patent No.: US 9,711,222 B2
(45) Date of Patent: Jul. 18, 2017

(54) CONTENT ADDRESSABLE MEMORY CELLS AND MEMORY ARRAYS

(71) Applicant: SanDisk Technologies LLC, Plano, TX (US)

(72) Inventor: Christopher J. Petti, Mountian View, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/233,111

(22) Filed: Aug. 10, 2016

(65) Prior Publication Data
US 2016/0351261 A1    Dec. 1, 2016

Related U.S. Application Data

(62) Division of application No. 14/512,552, filed on Oct. 13, 2014, now Pat. No. 9,443,590.

(51) Int. Cl.
| | | |
|---|---|---|
| G11C 15/00 | (2006.01) | |
| G11C 15/04 | (2006.01) | |
| H01L 27/24 | (2006.01) | |
| H01L 45/00 | (2006.01) | |
| G11C 13/00 | (2006.01) | |

(52) U.S. Cl.
CPC ........ *G11C 15/046* (2013.01); *H01L 27/2445* (2013.01); *H01L 27/2454* (2013.01); *H01L 27/2463* (2013.01); *H01L 27/2481* (2013.01); *H01L 45/145* (2013.01); *H01L 45/146* (2013.01); *H01L 45/1675* (2013.01); *G11C 13/0007* (2013.01)

(58) Field of Classification Search
CPC ...................................................... G11C 16/04
USPC ....................................................... 365/49.17
See application file for complete search history.

(56) References Cited

U.S. PATENT DOCUMENTS

| | | | |
|---|---|---|---|
| 2003/0179623 | A1 | 9/2003 | Inoue |
| 2007/0097740 | A1* | 5/2007 | Derhacobian ....... G11C 11/5678 365/163 |
| 2008/0068872 | A1 | 3/2008 | Lee |
| 2010/0328981 | A1 | 12/2010 | Deshpande |
| 2011/0051486 | A1 | 3/2011 | Chang |
| 2012/0014162 | A1 | 1/2012 | Shinozaki |
| 2012/0080725 | A1 | 4/2012 | Manos |
| 2014/0153310 | A1* | 6/2014 | Sekar ..................... G11C 15/00 365/49.15 |

OTHER PUBLICATIONS

Eshraghian et al., "Memristor MOS Content Addressable Memory (MCAM): Hybrid Architecture for Future High Performance Engines," IEEE Transactions of Very Large Scale Integrations (VLSI) Systems, May 11, 2010, 10 pages.
Requirement for Restriction/Election mailed Dec. 22, 2015 in U.S. Appl. No. 14/512,552.

(Continued)

*Primary Examiner* — Hoai V Ho
(74) *Attorney, Agent, or Firm* — Vierra Magen Marcus LLP

(57) ABSTRACT

A content addressable memory cell is provided that includes plurality of transistors having a minimum feature size F, and a plurality of memory elements coupled to the plurality of transistors. The content addressable memory cell occupies an area of between $18F^2$ and $36F^2$.

11 Claims, 56 Drawing Sheets

(56) References Cited

OTHER PUBLICATIONS

Amendment filed Feb. 12, 2016 in U.S. Appl. No. 14/512,552.
Non-Final Rejection mailed Mar. 16, 2016 in U.S. Appl. No. 14/512,552.
Amendment filed Jun. 14, 2016 in U.S. Appl. No. 14/512,552.
Notice of Allowance and Fees Due mailed Jul. 8, 2016 in U.S. Appl. No. 14/512,552.

* cited by examiner

MLXn, n = a, b, c, d

M3n, M4n, n = a, b, c, d

M1n, M2n, n = a, b, c, d

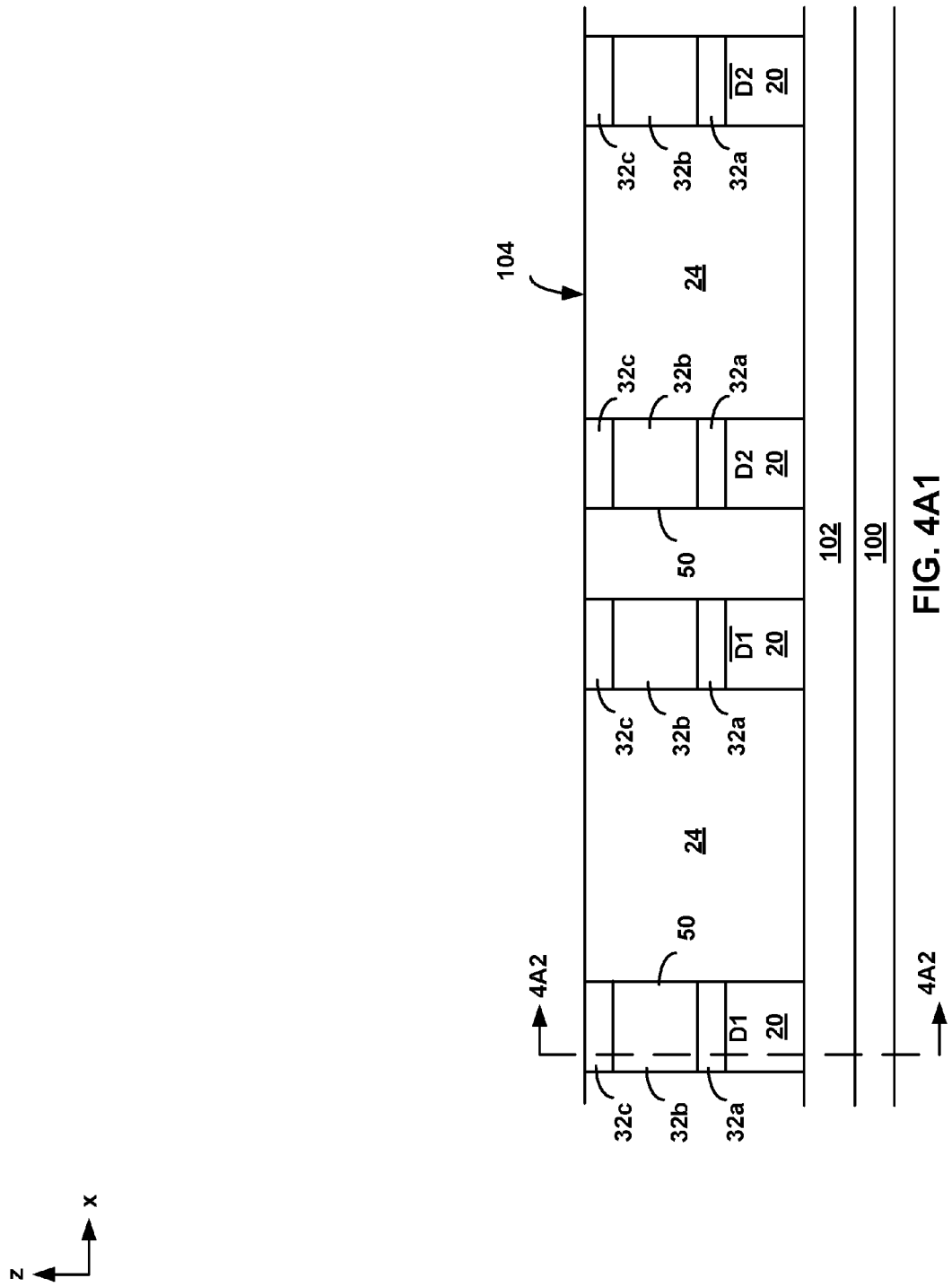

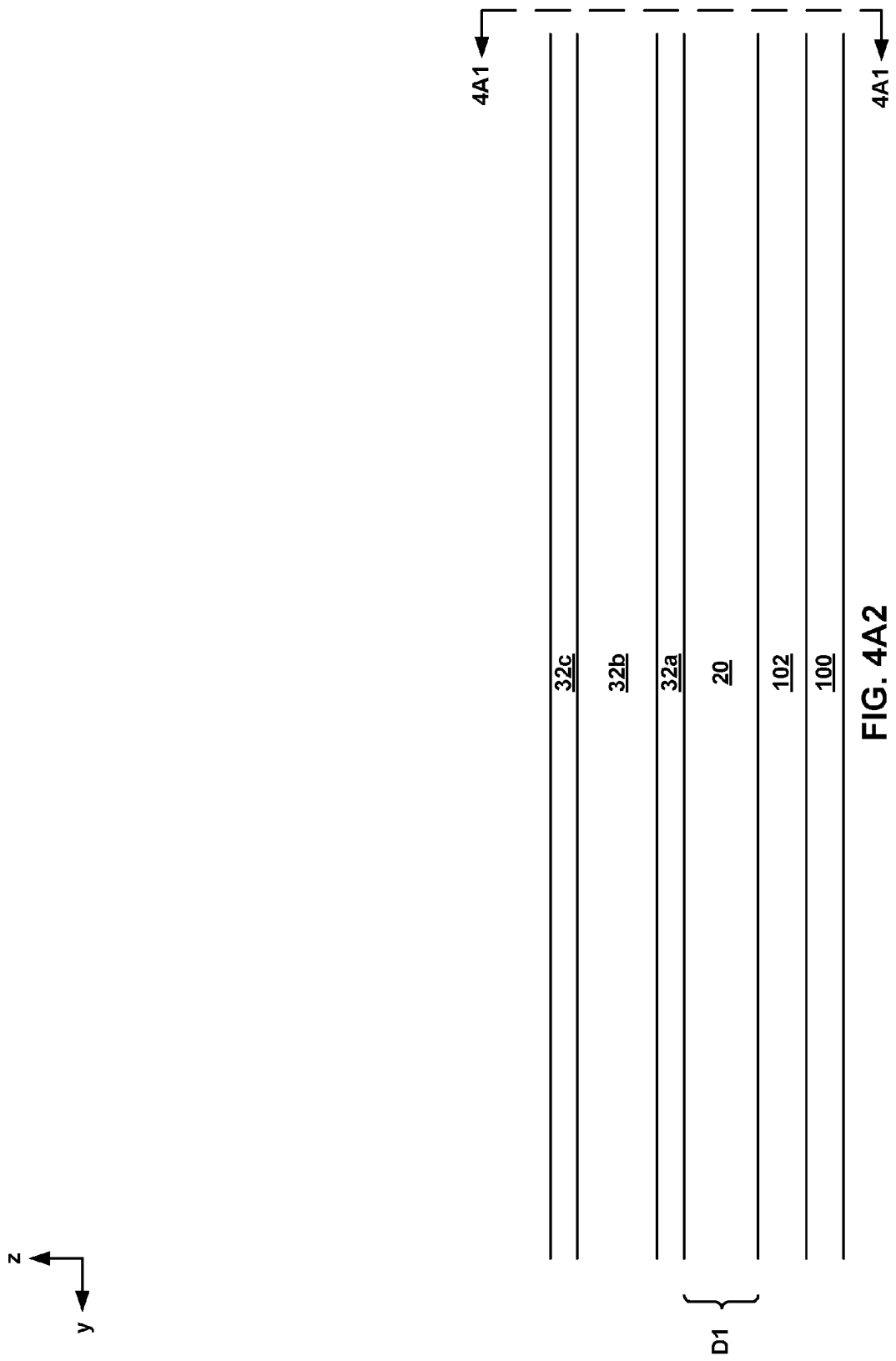

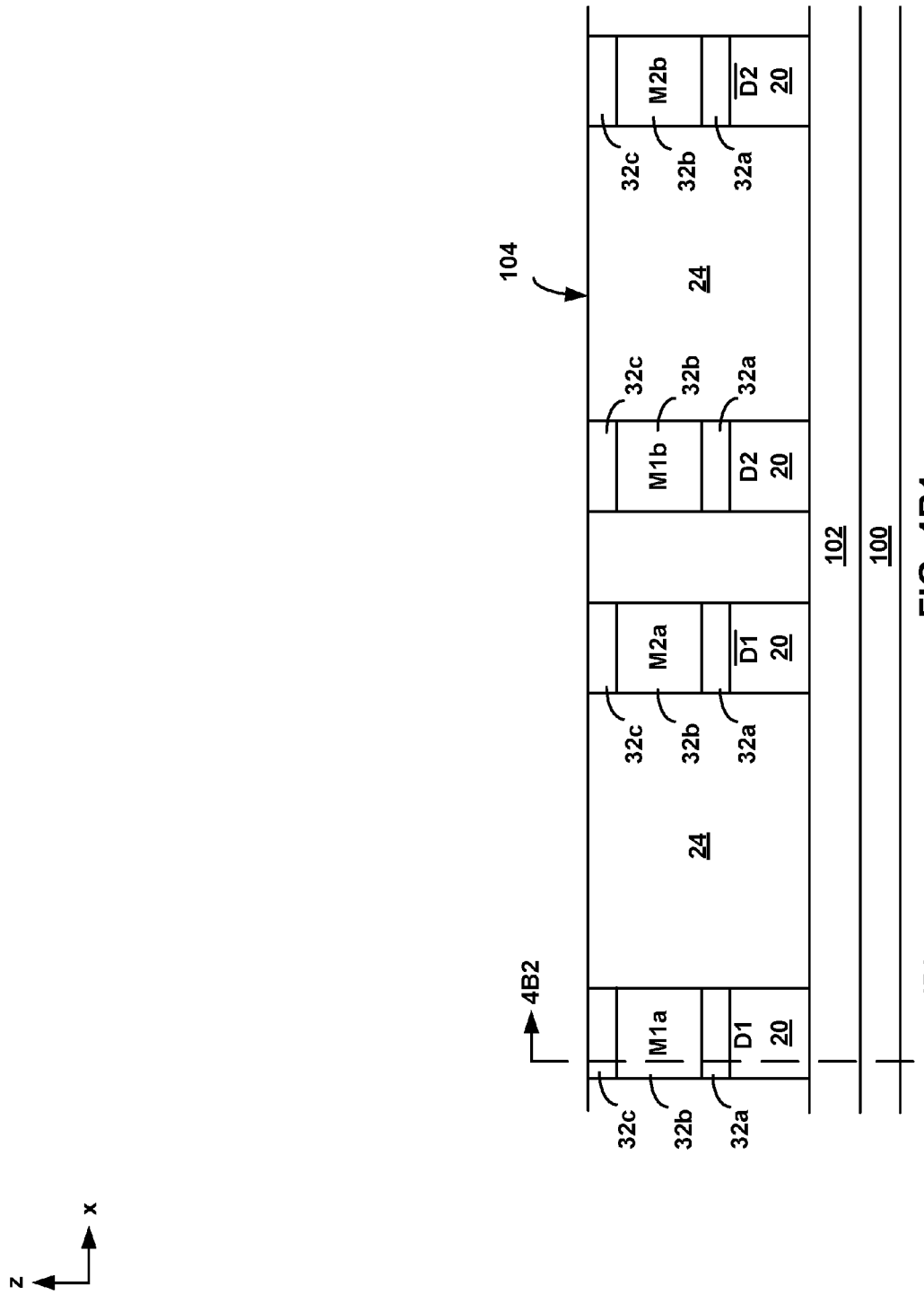

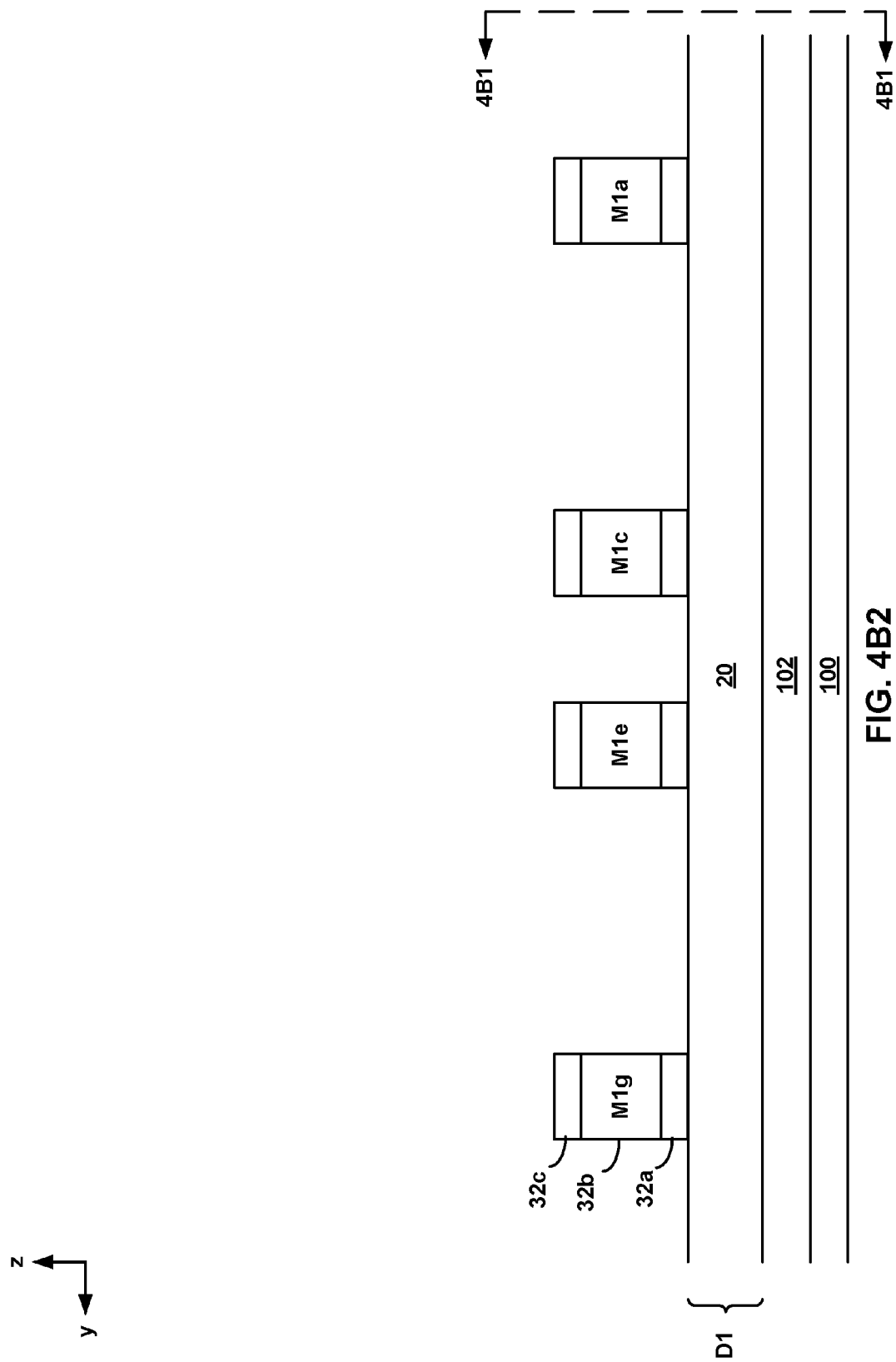

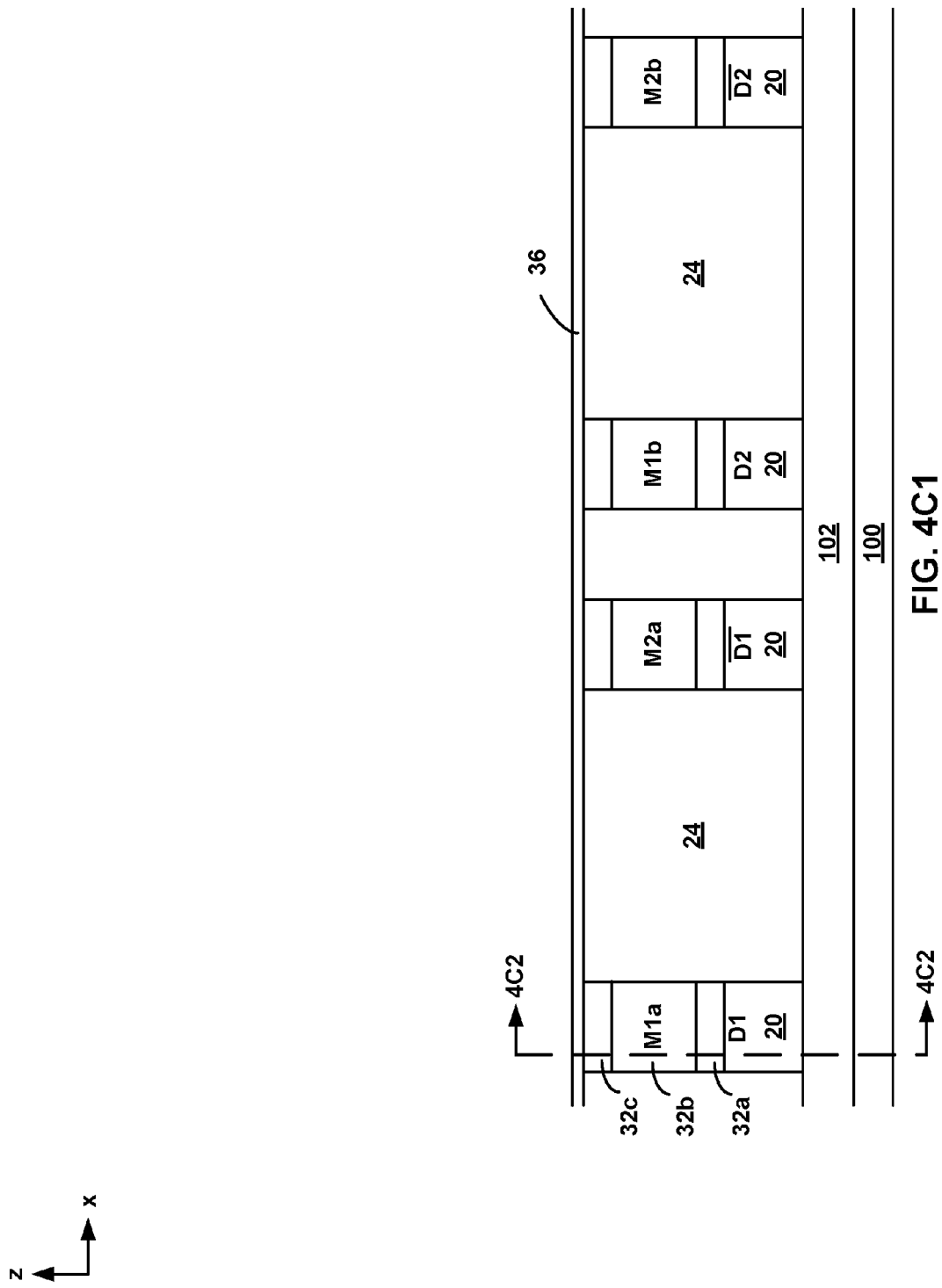

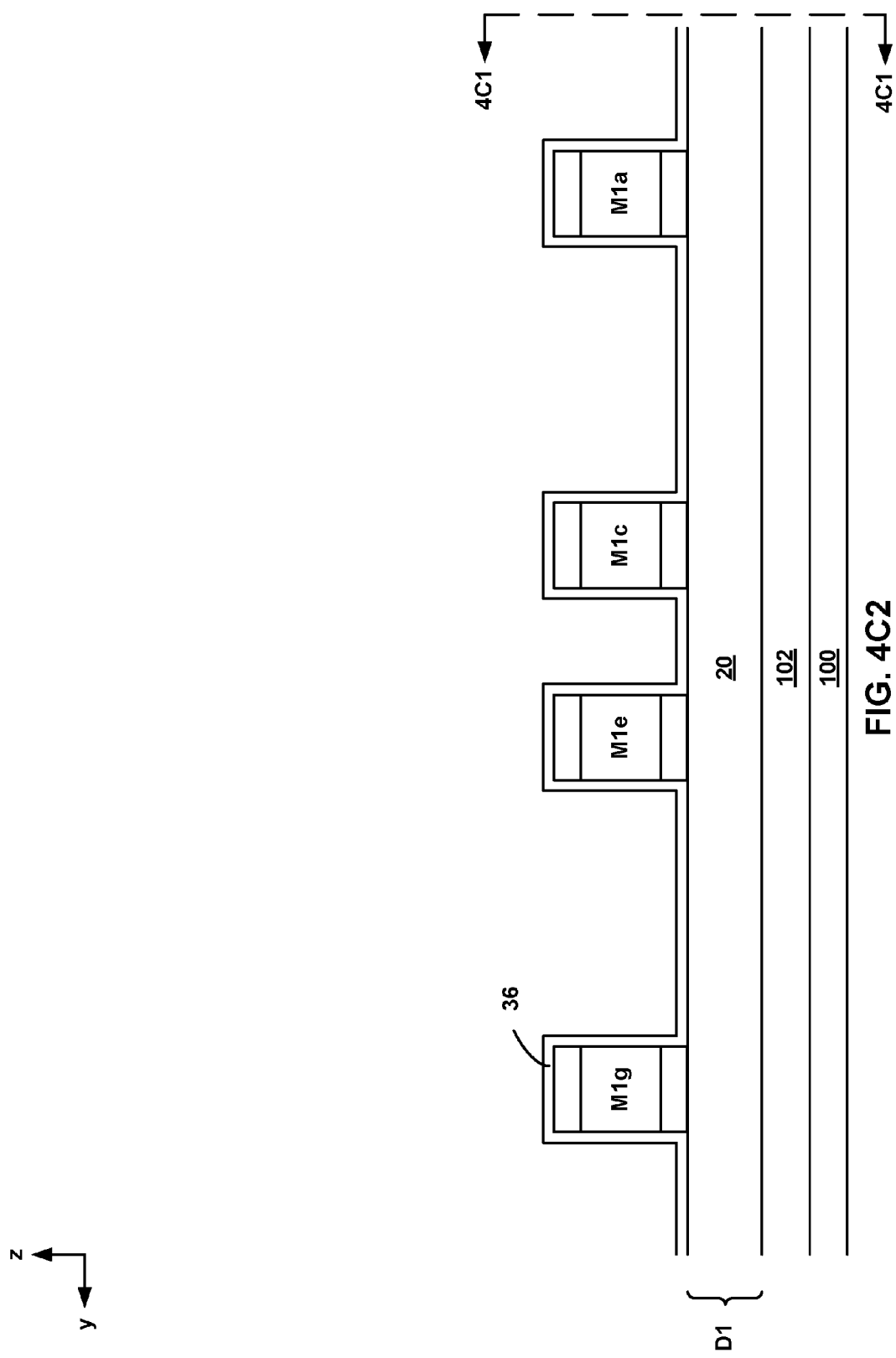

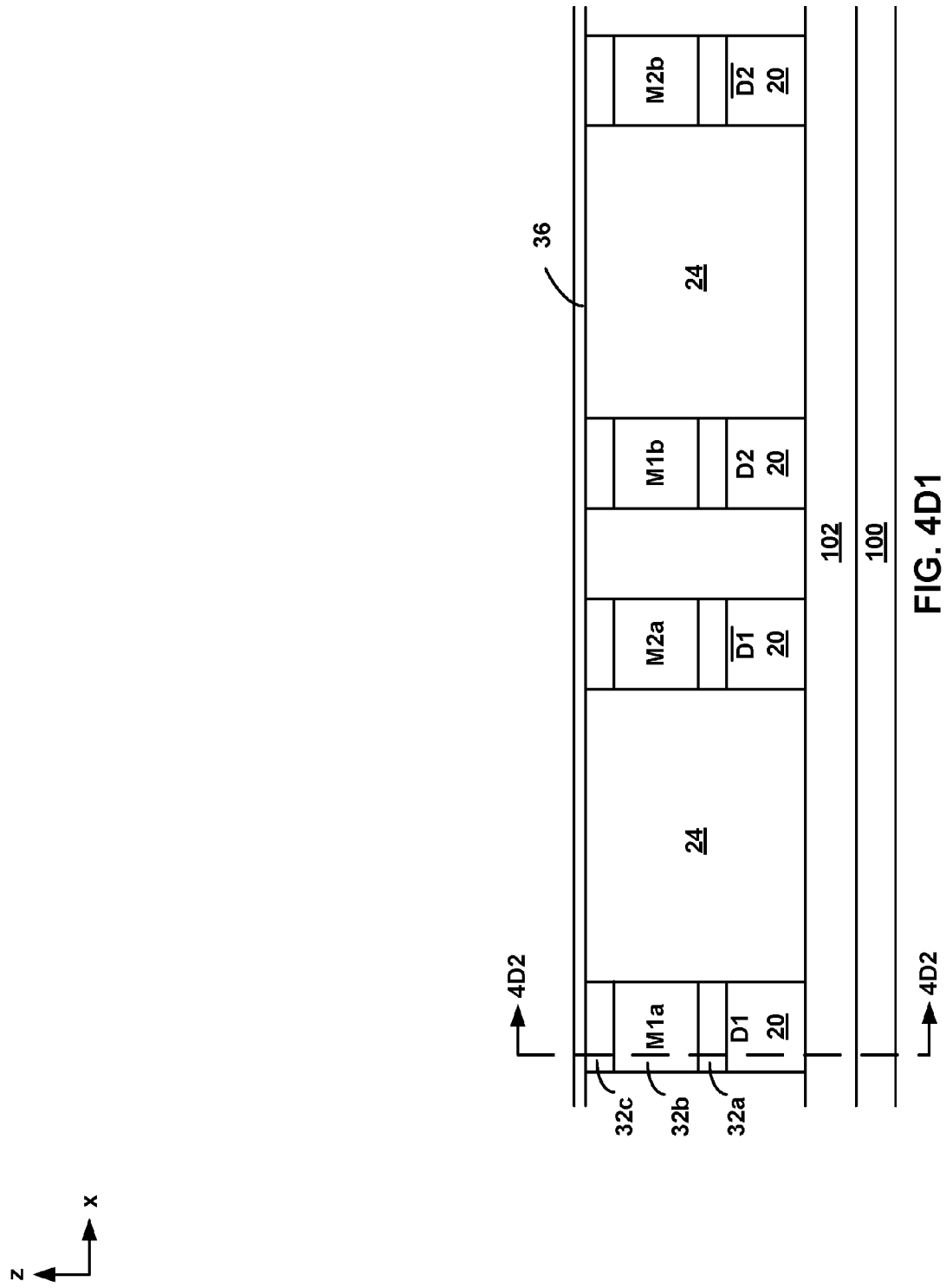
FIG. 4D1

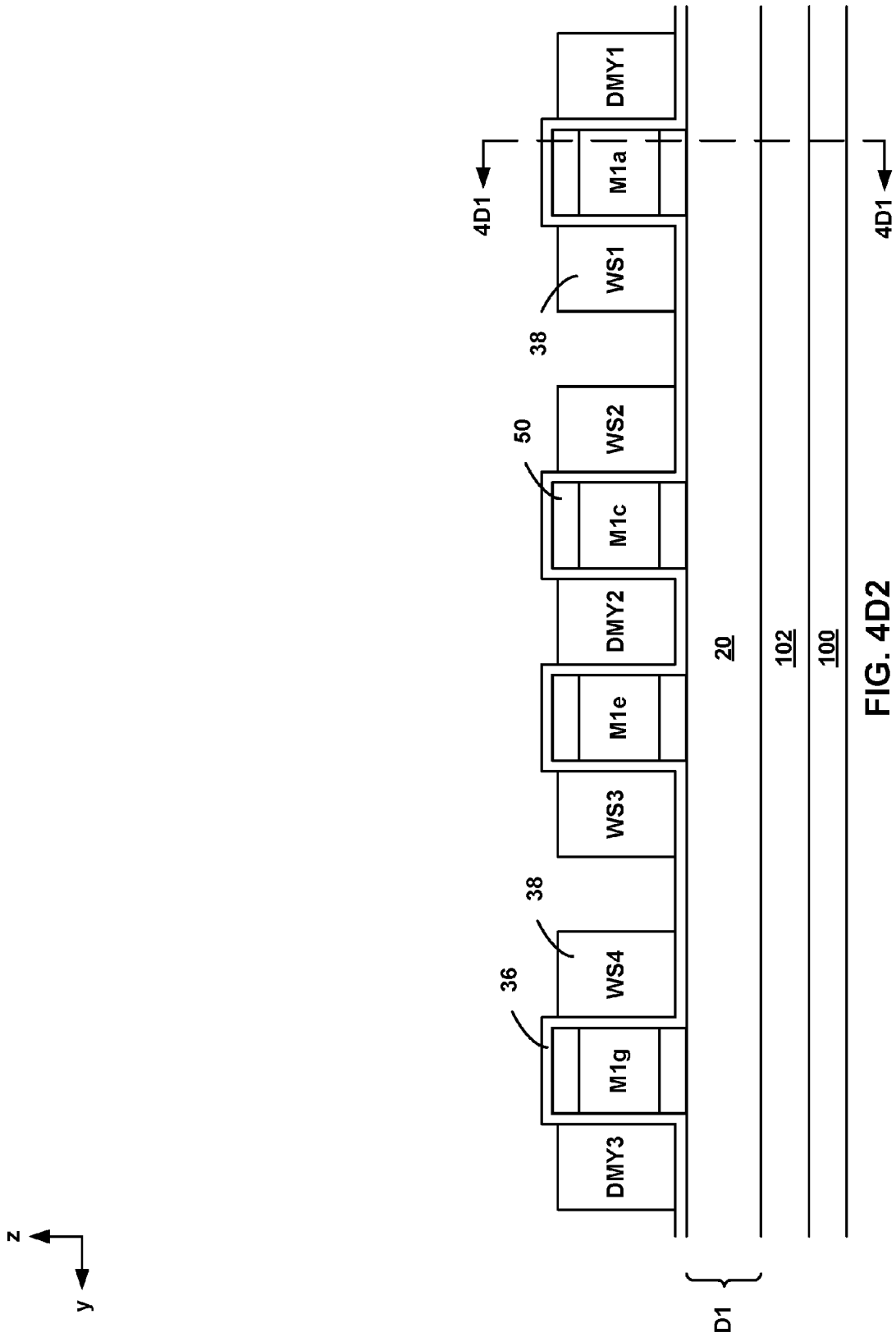
FIG. 4D2

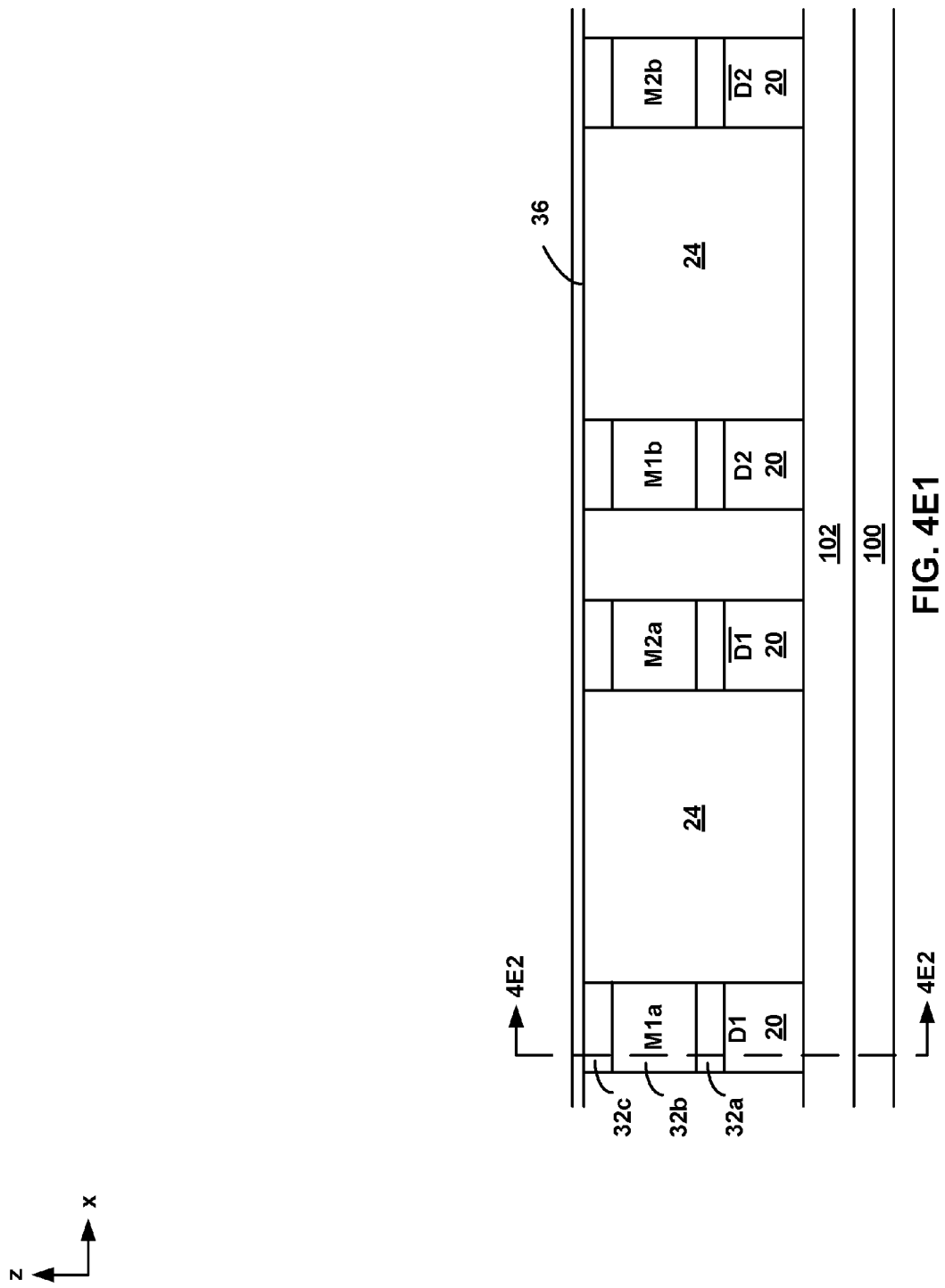

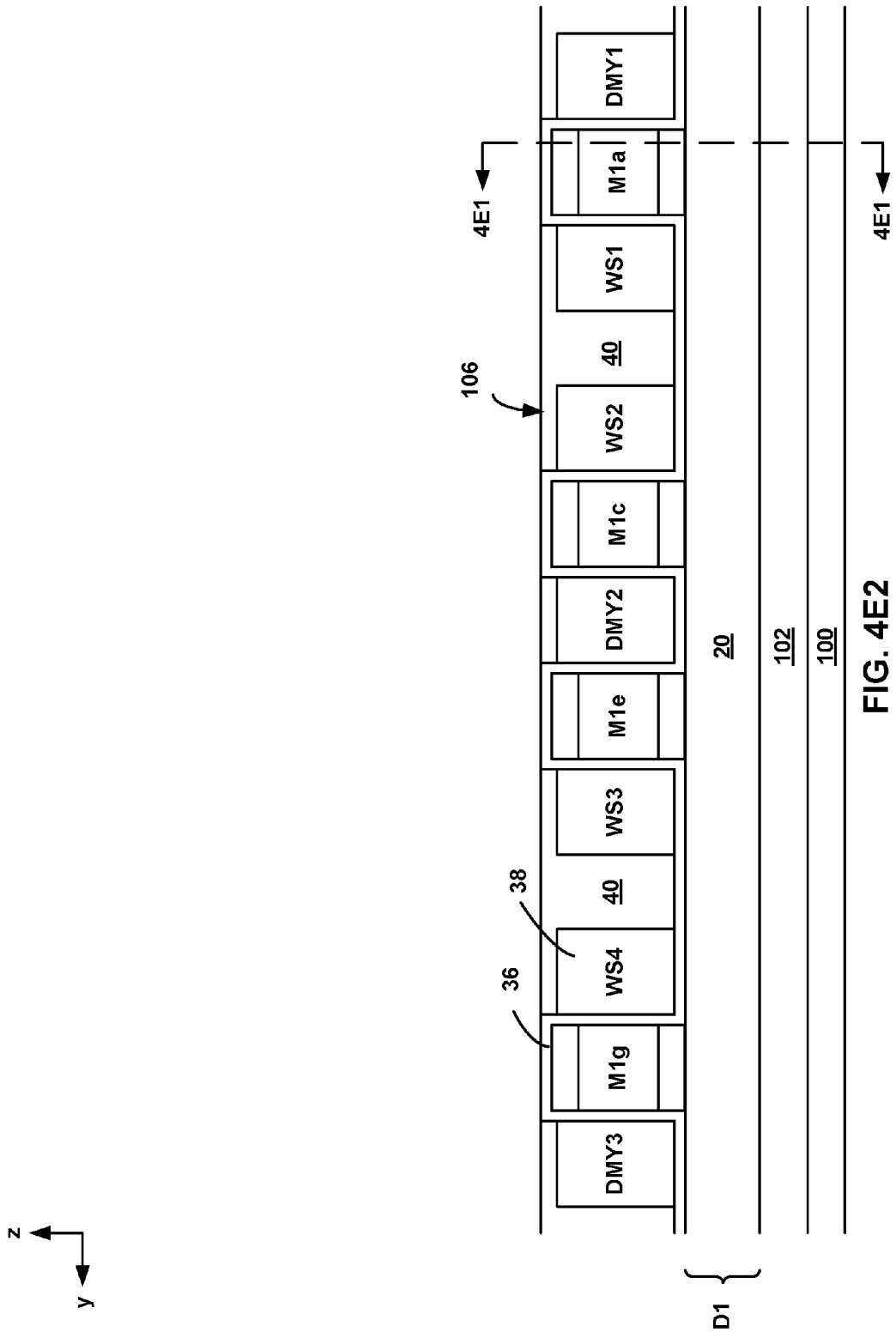

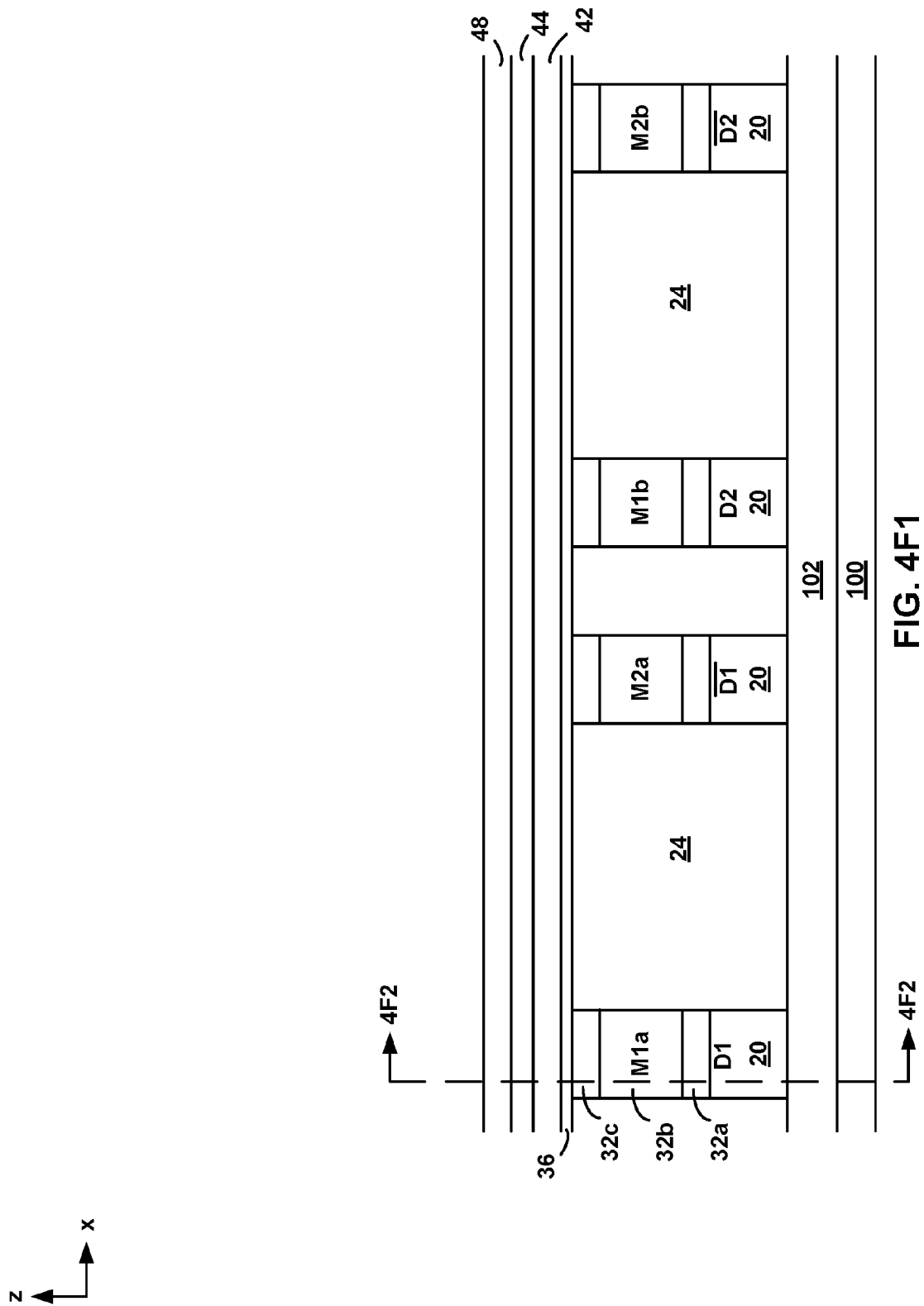

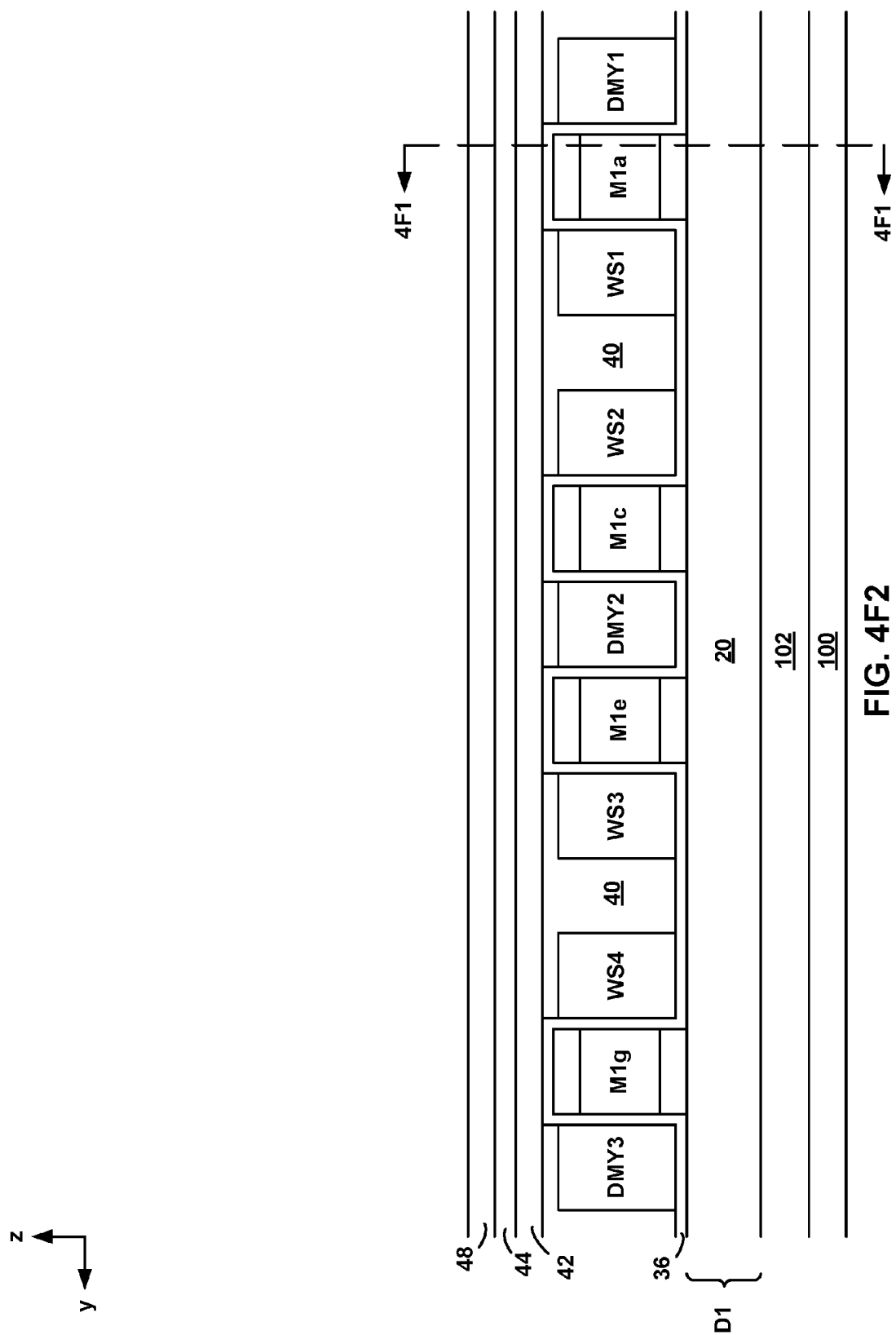
FIG. 4F2

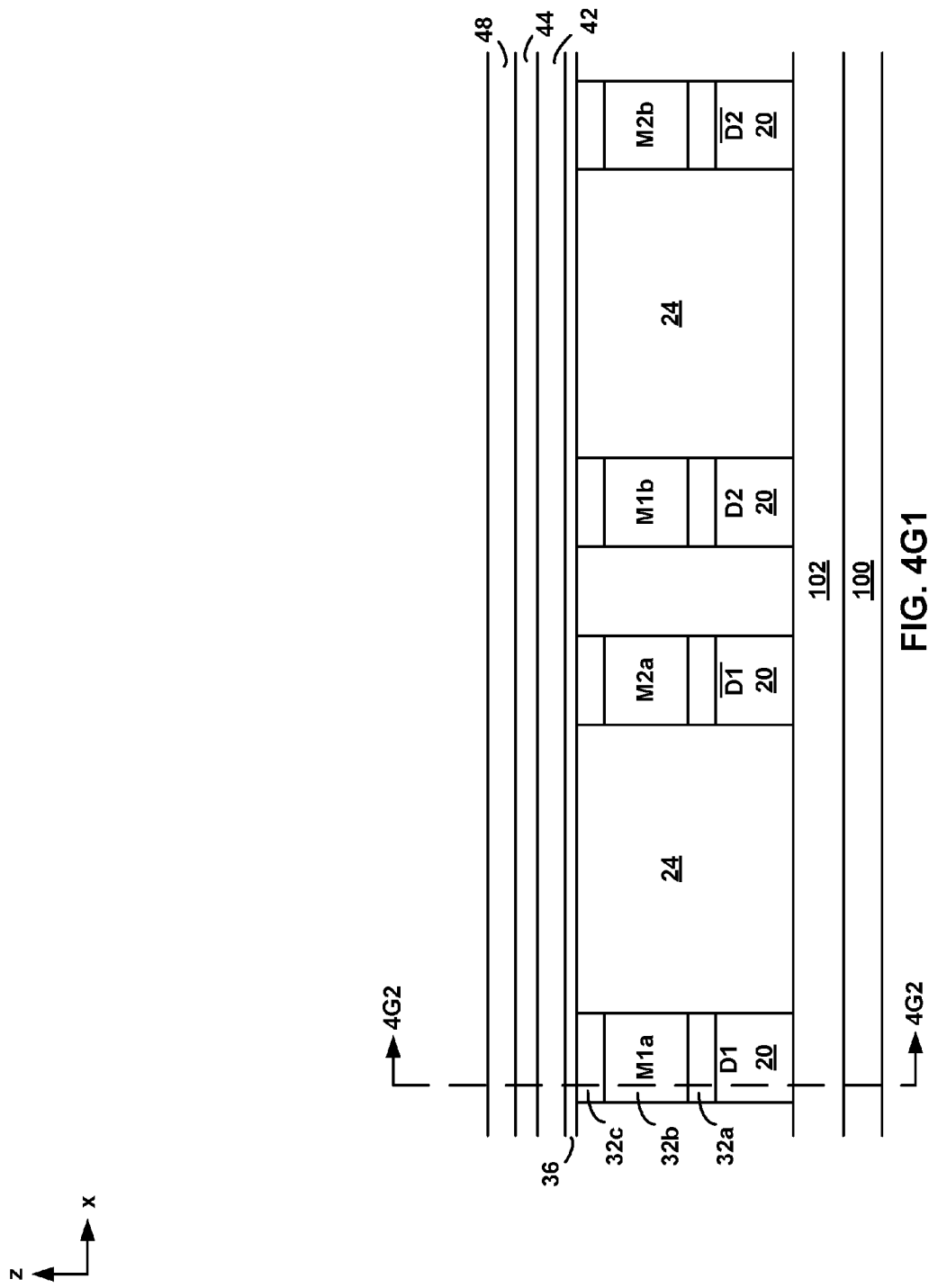

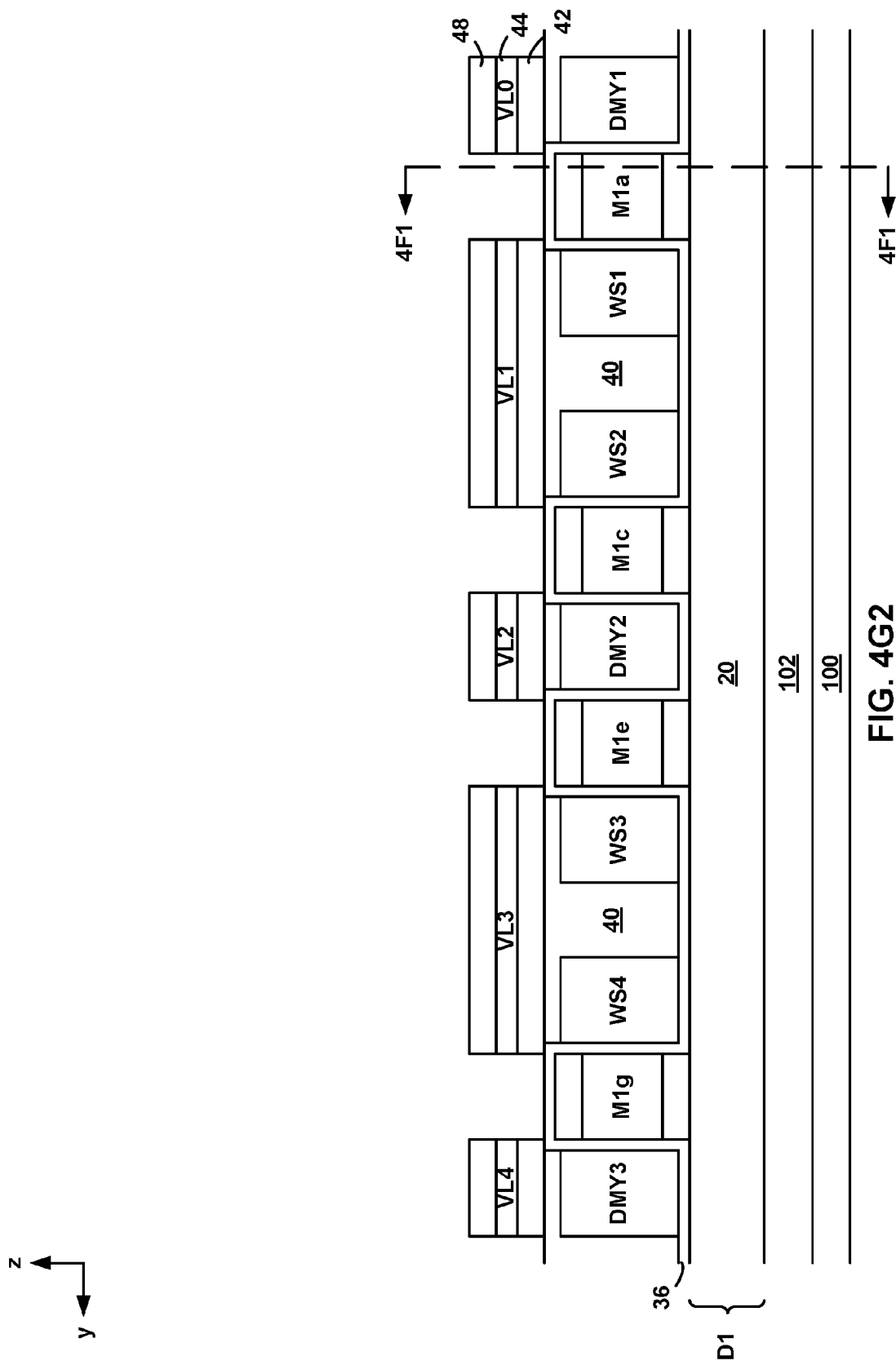

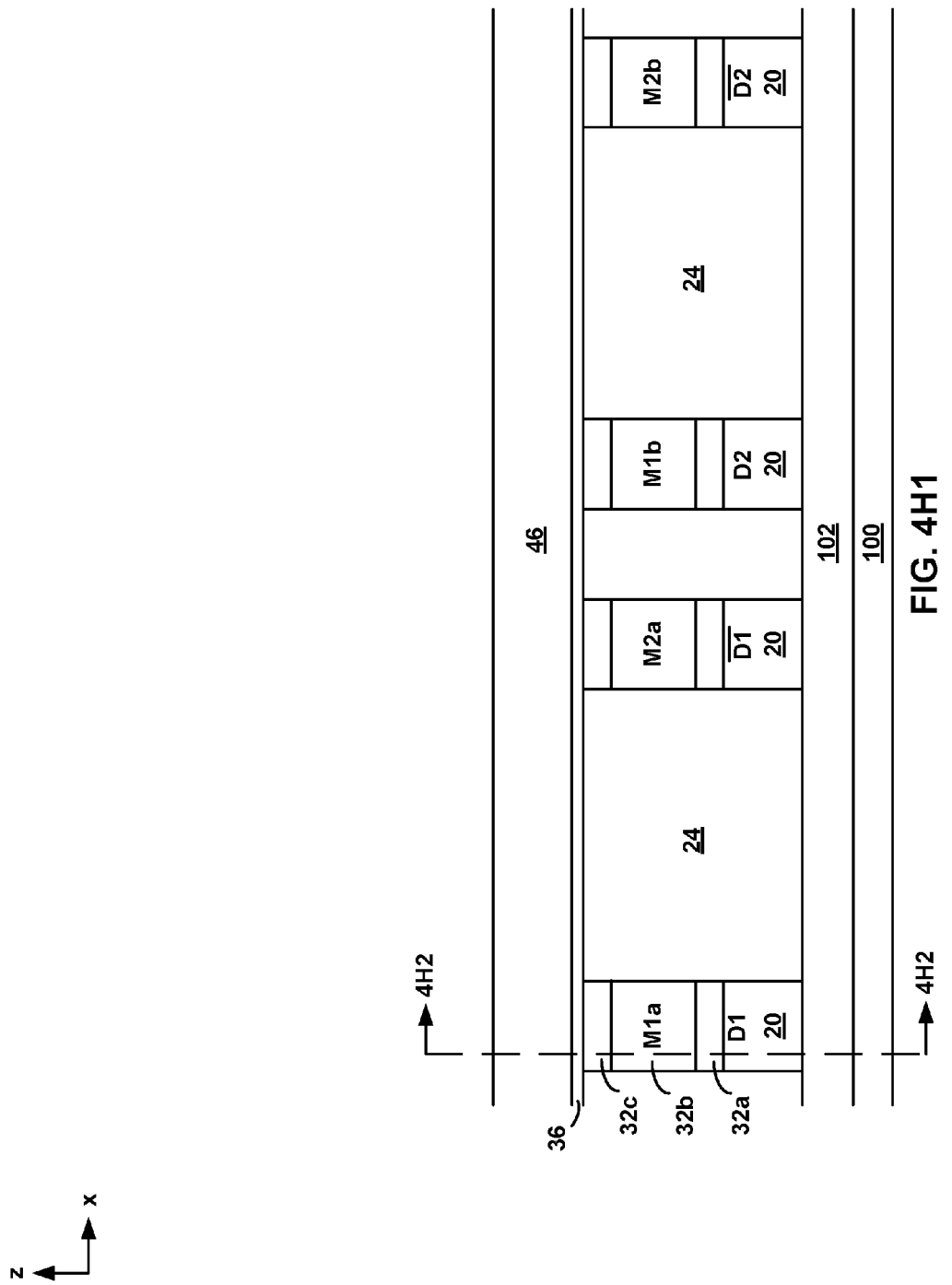

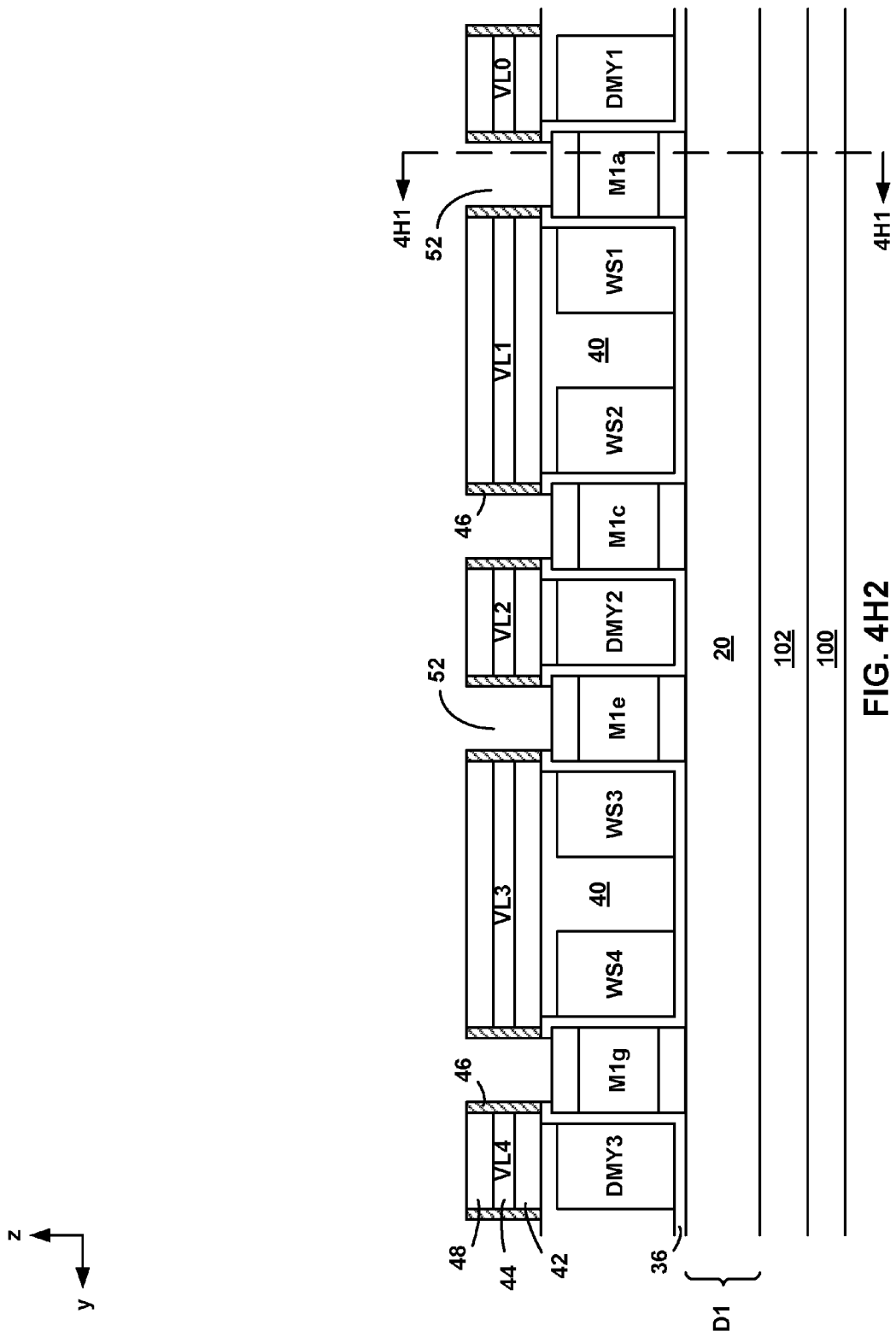

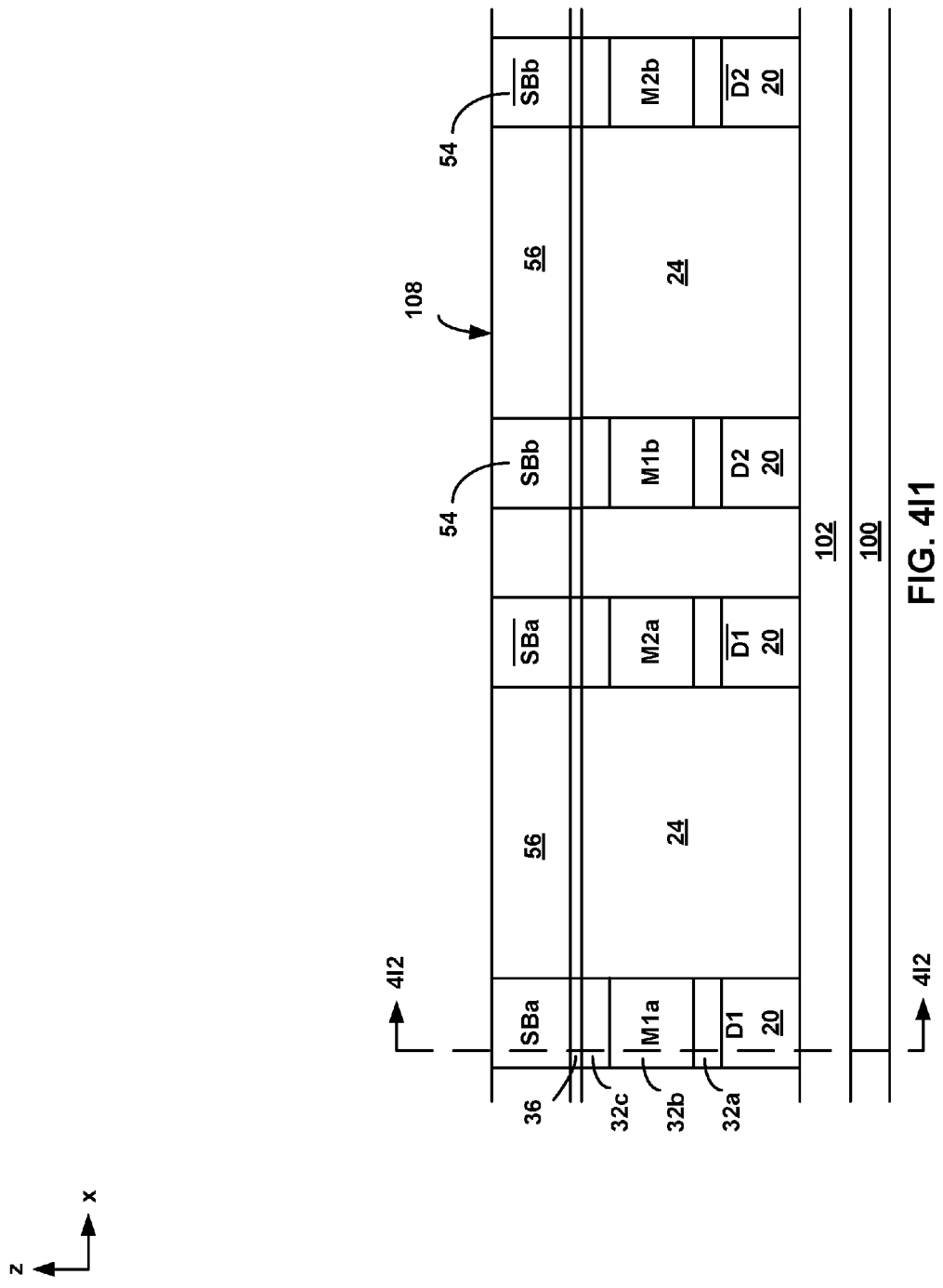
FIG. 4l1

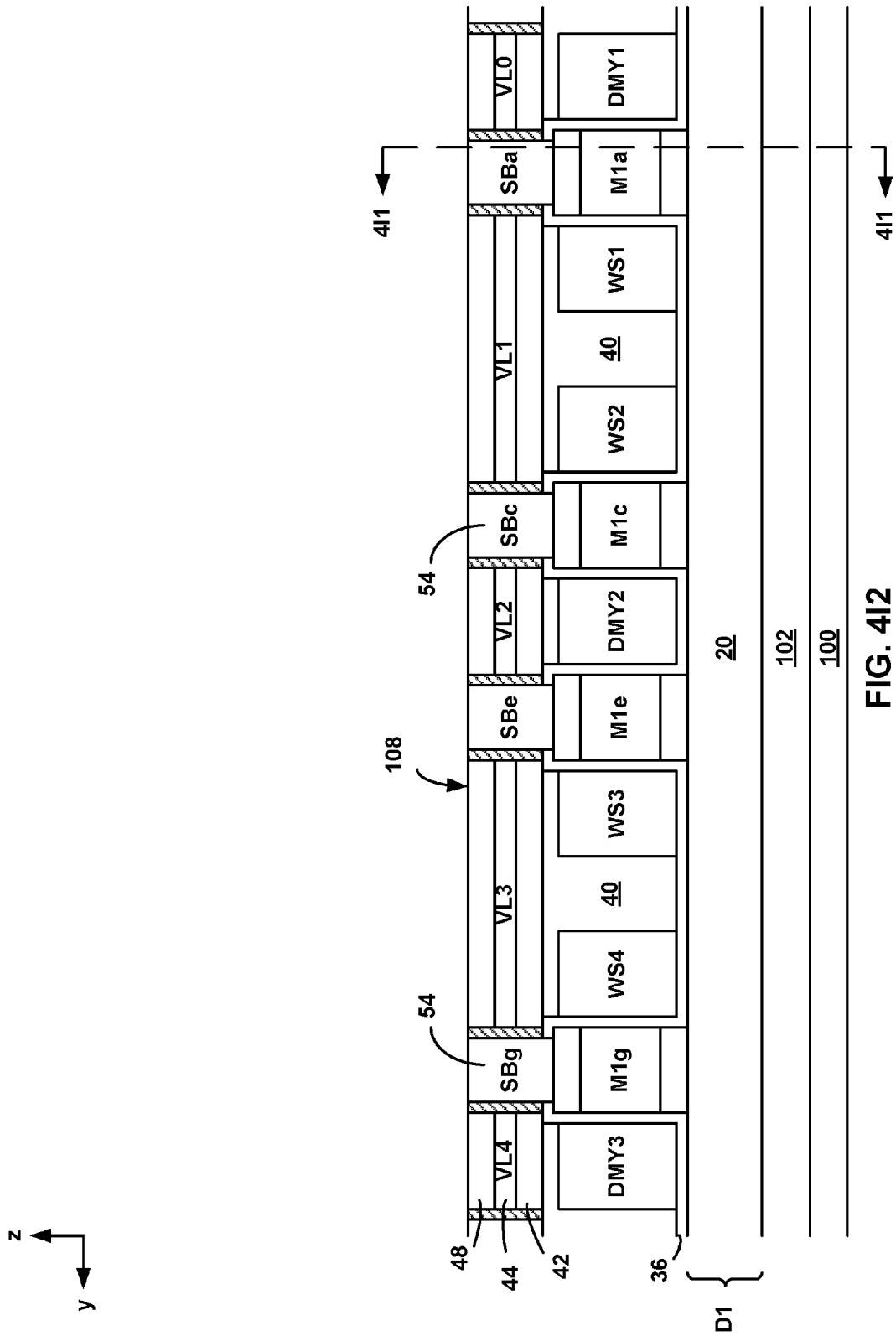
FIG. 4I2

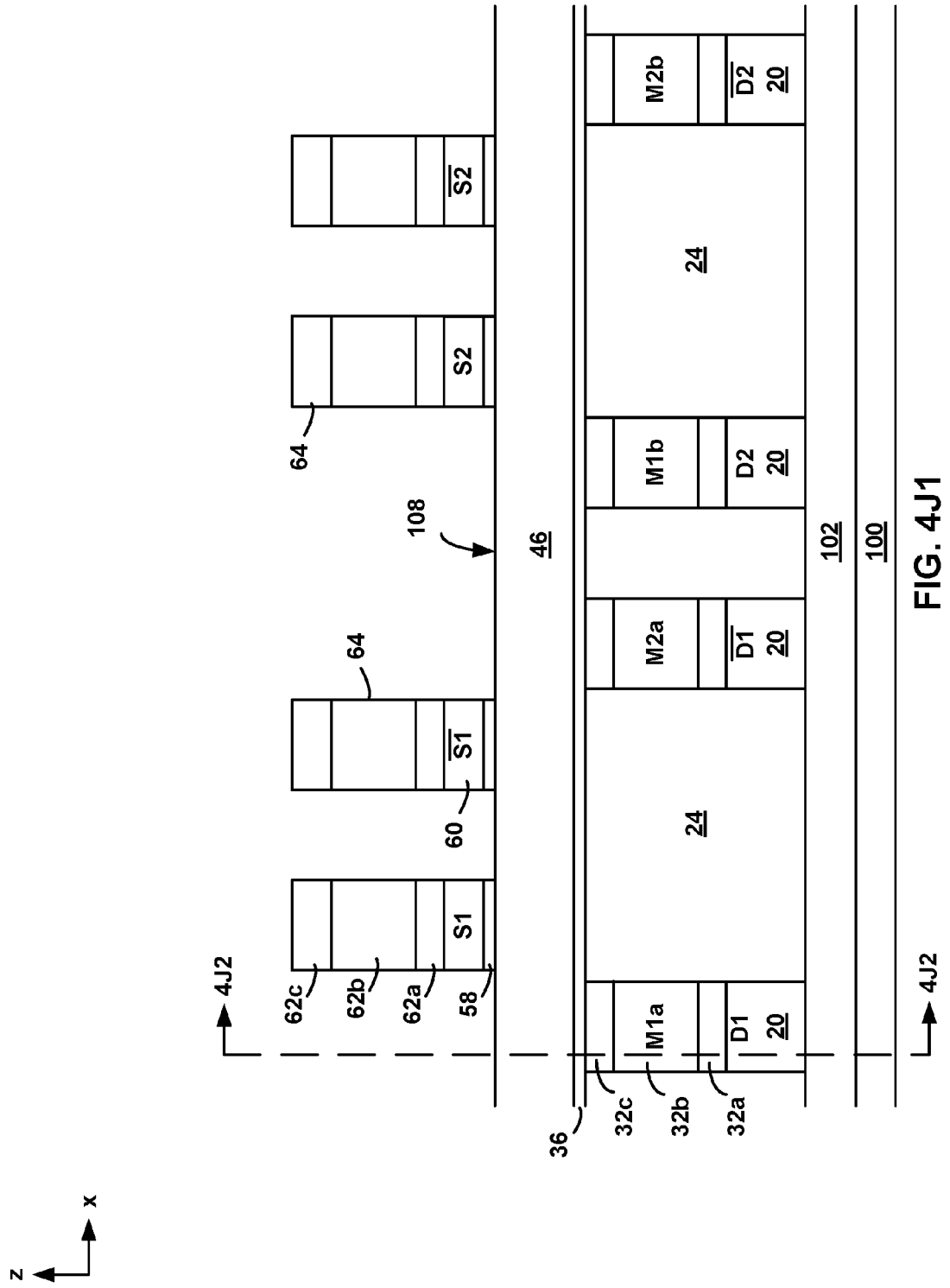
FIG. 4J1

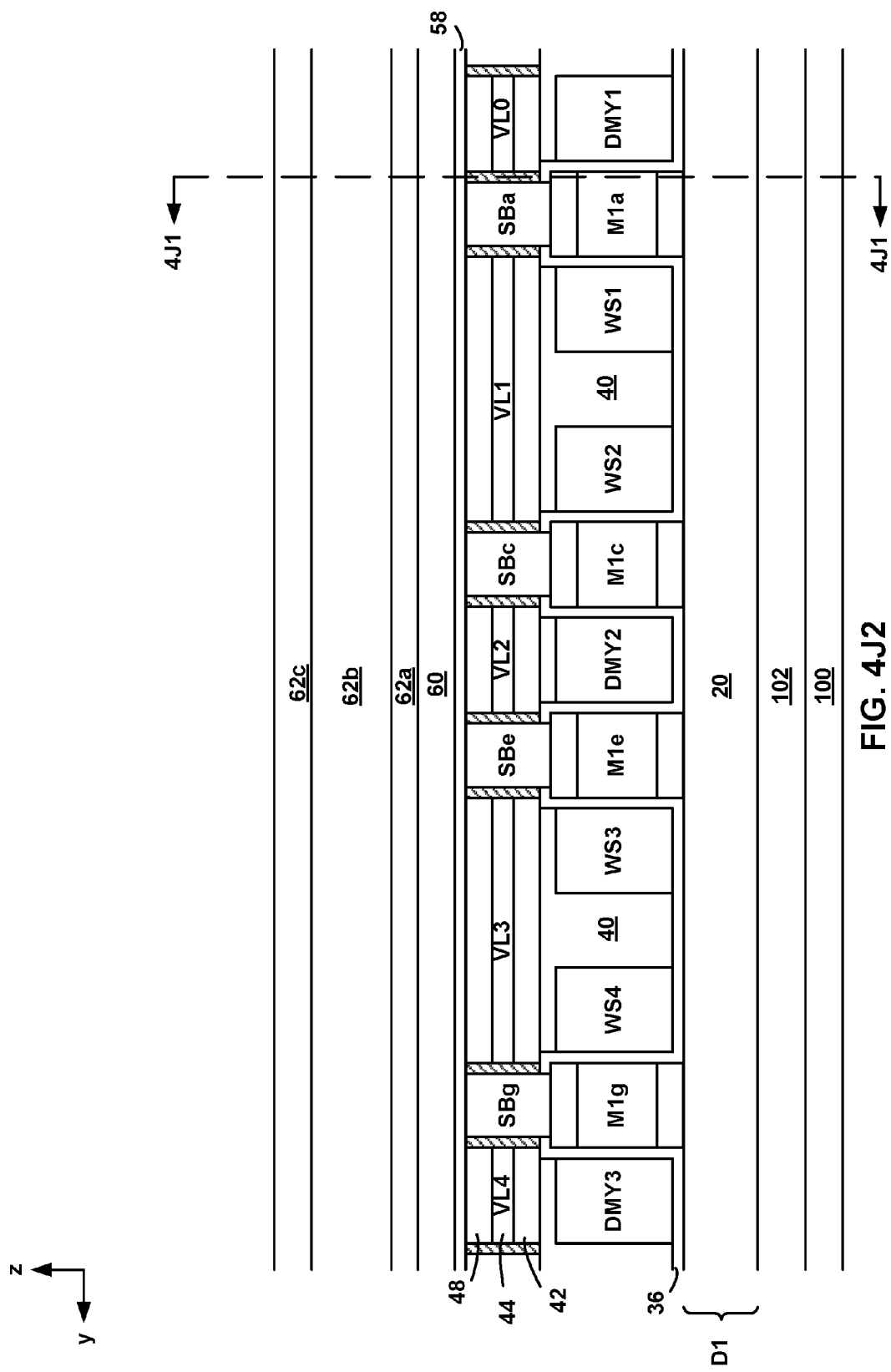
FIG. 4J2

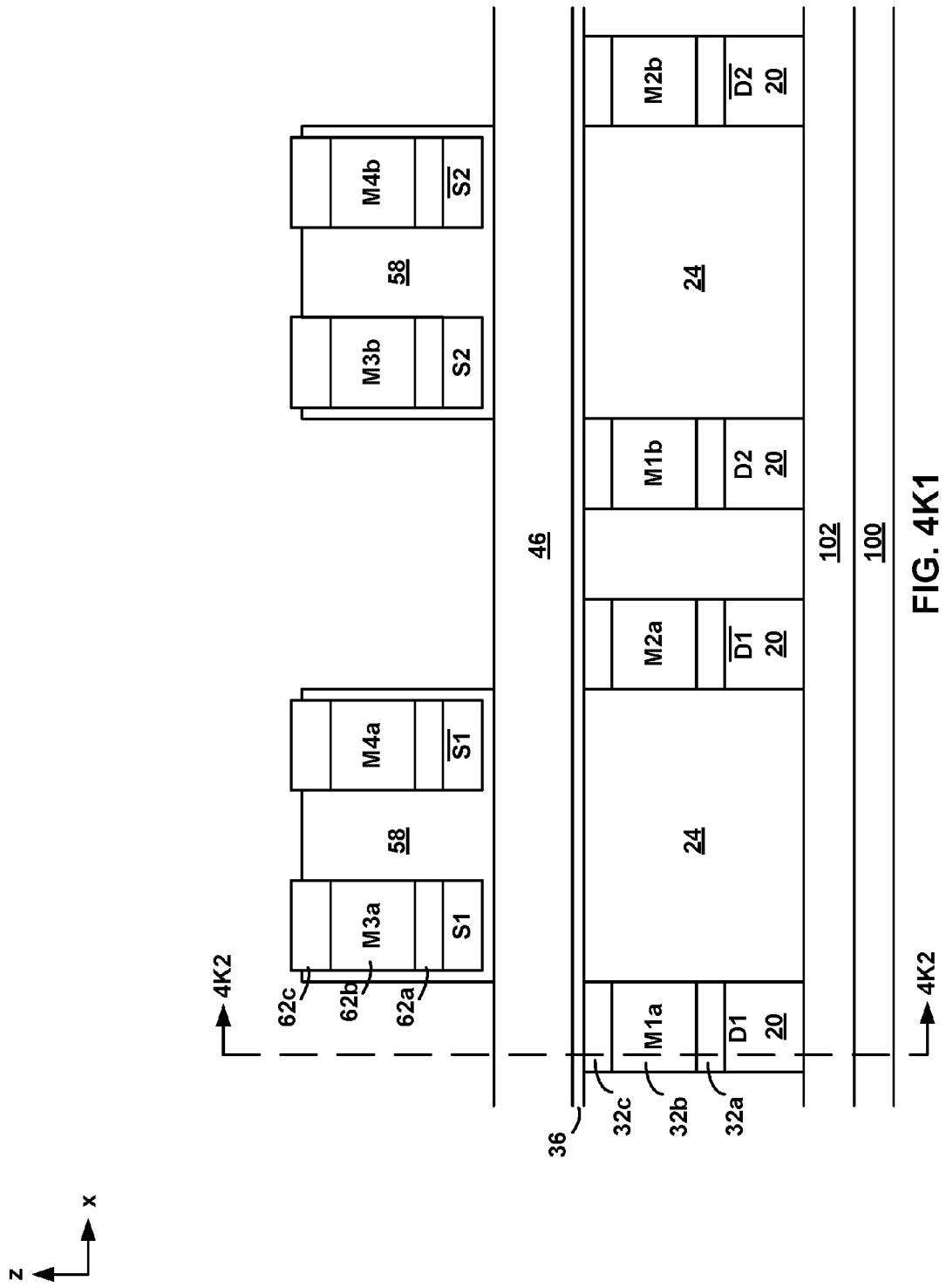

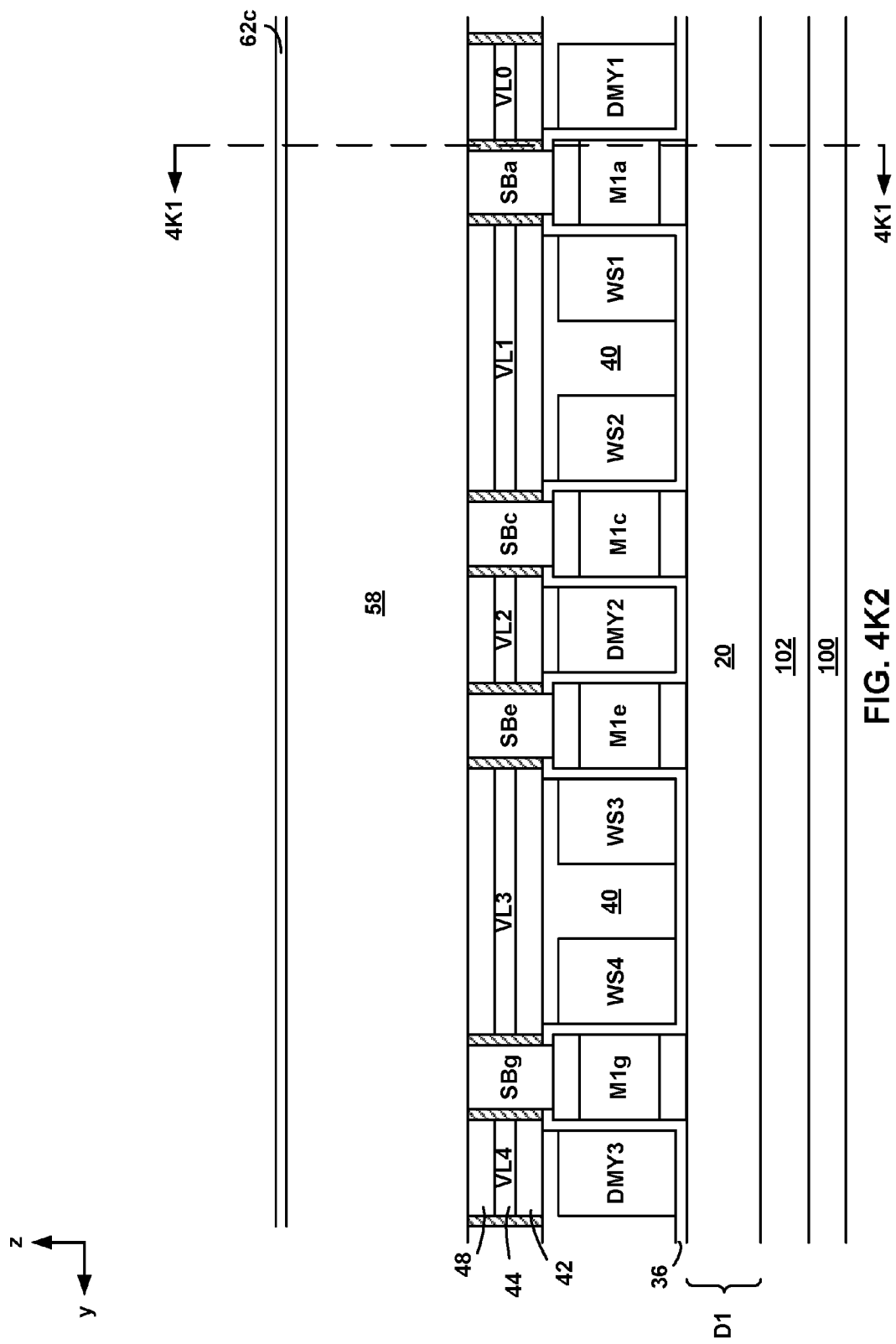
FIG. 4K2

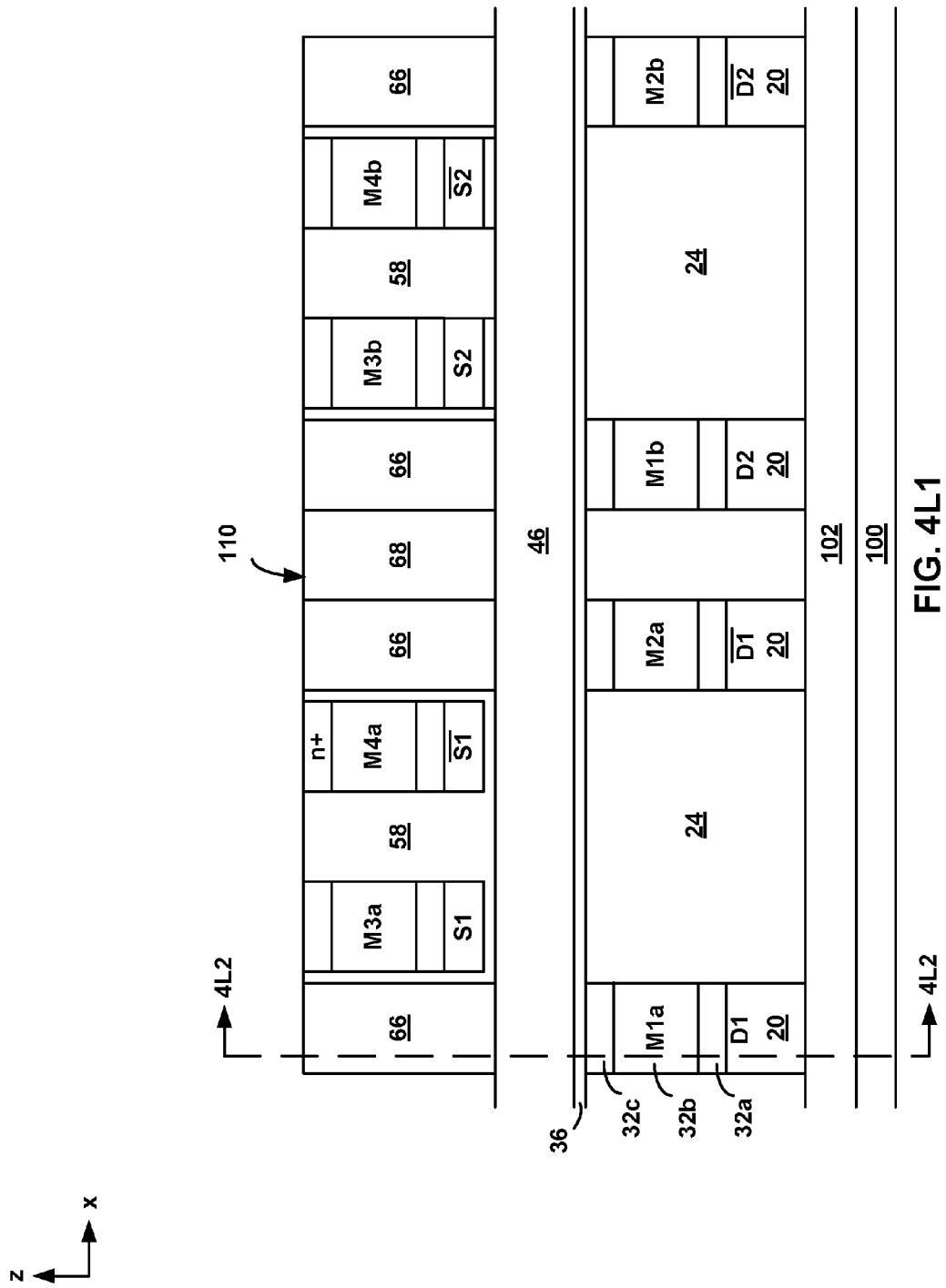

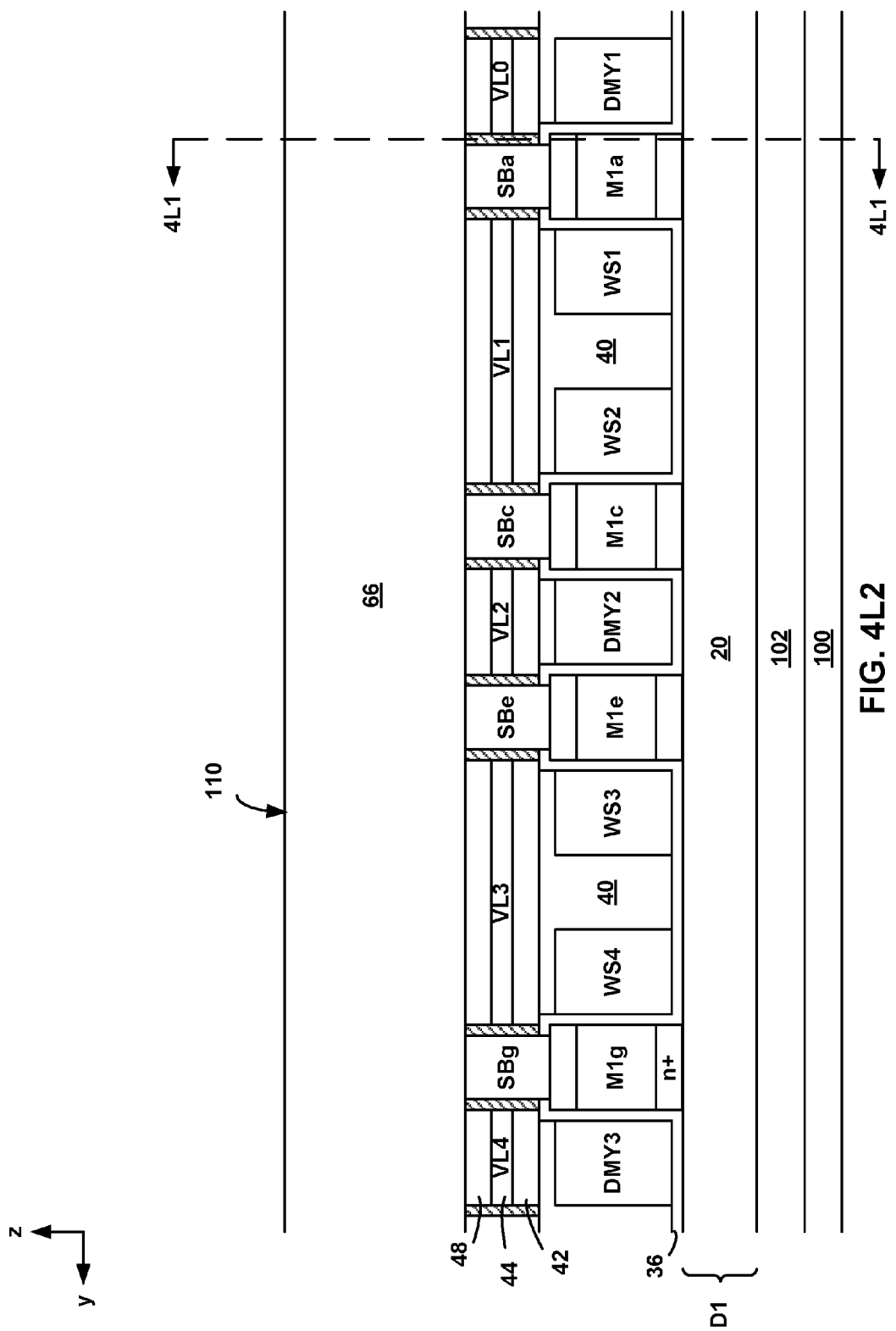

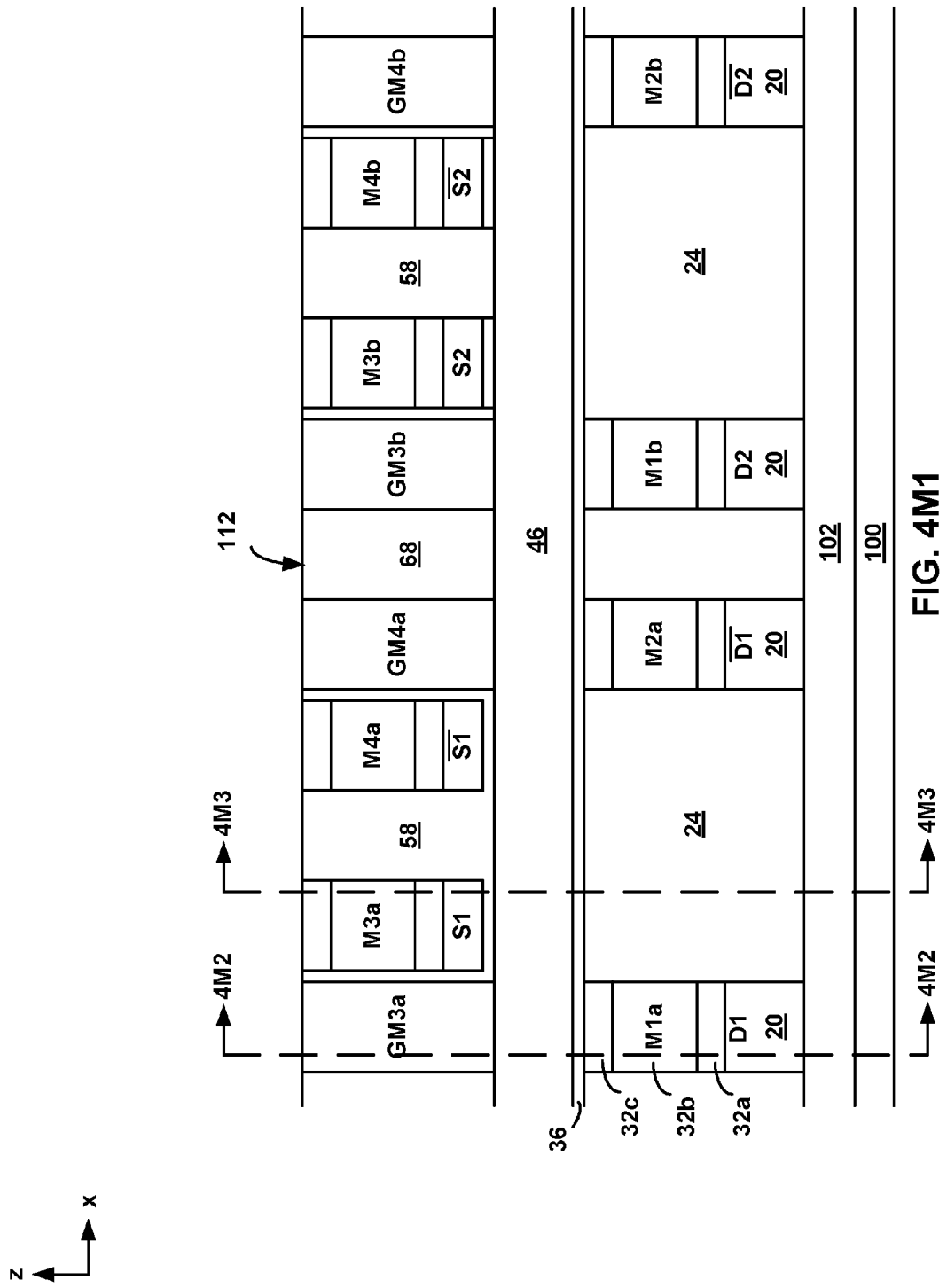
FIG. 4M1

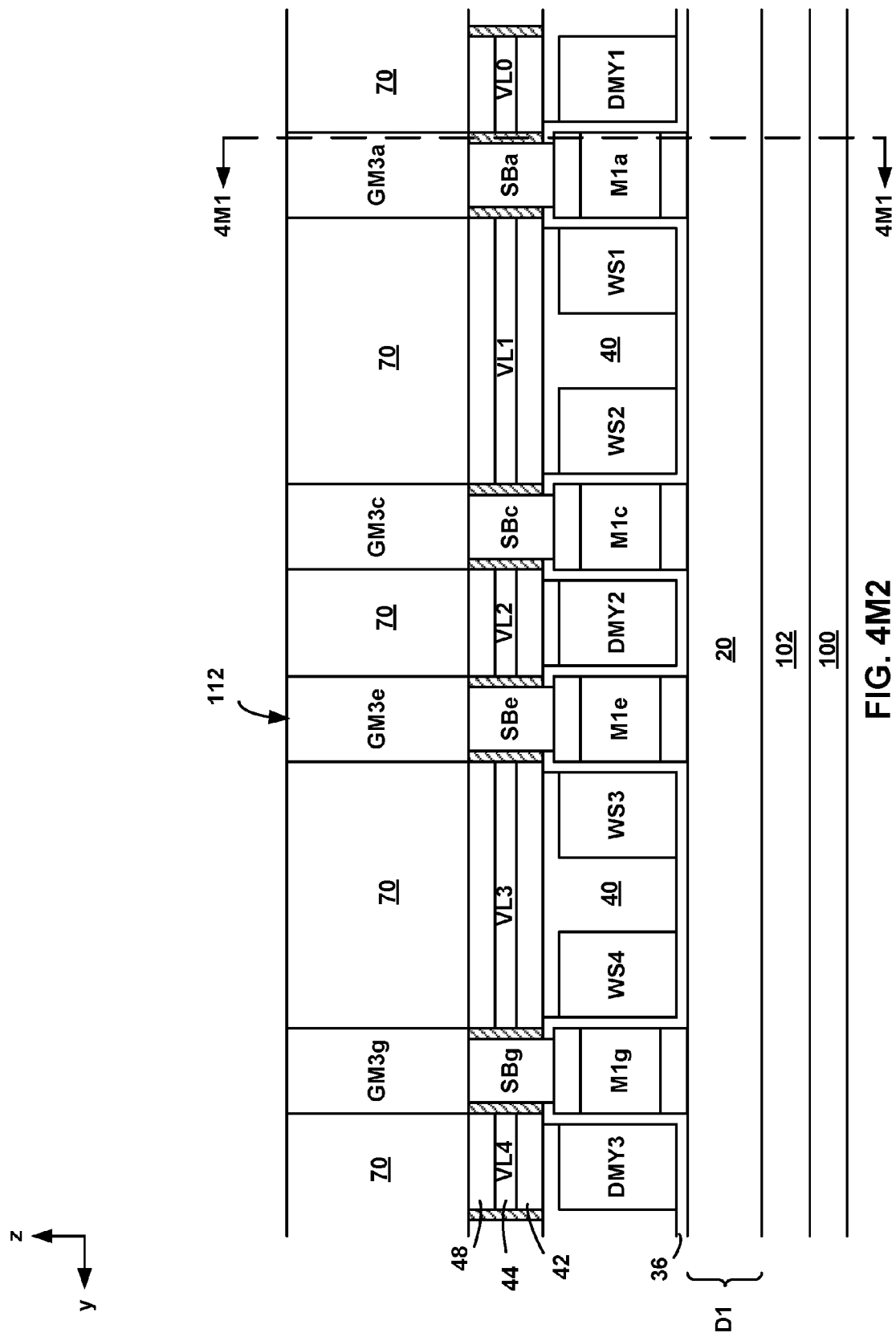
FIG. 4M2

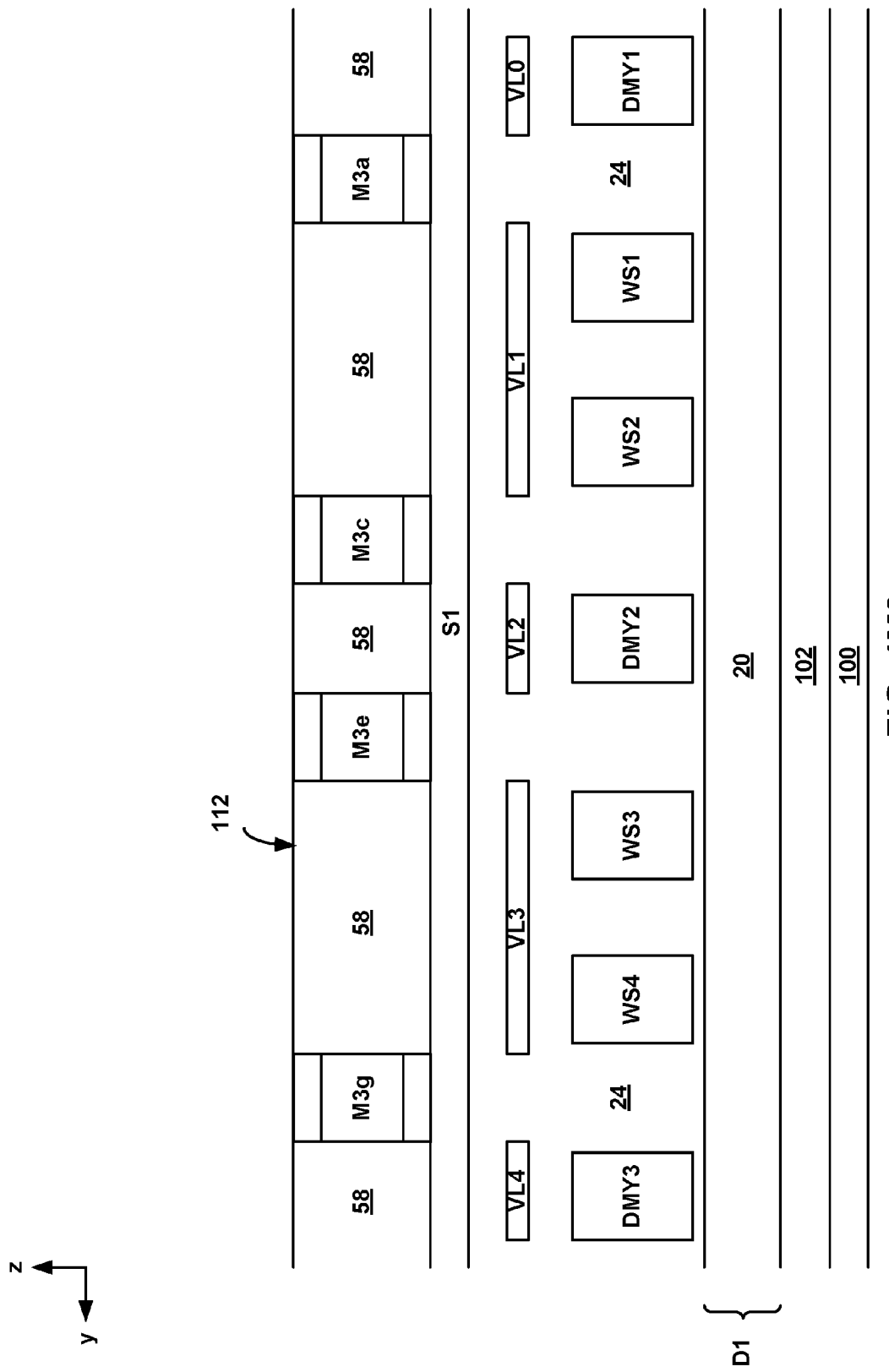
FIG. 4M3

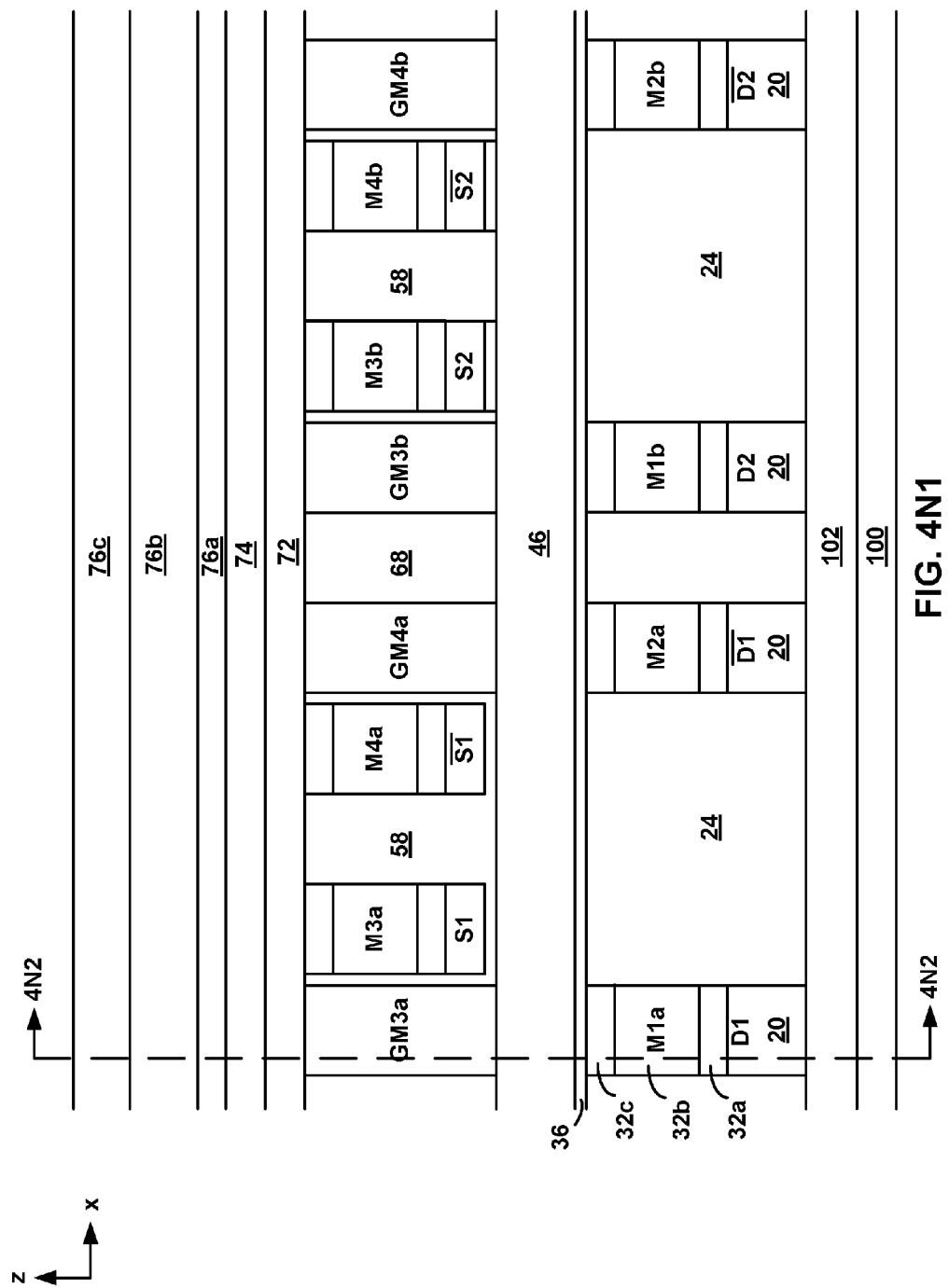
FIG. 4N1

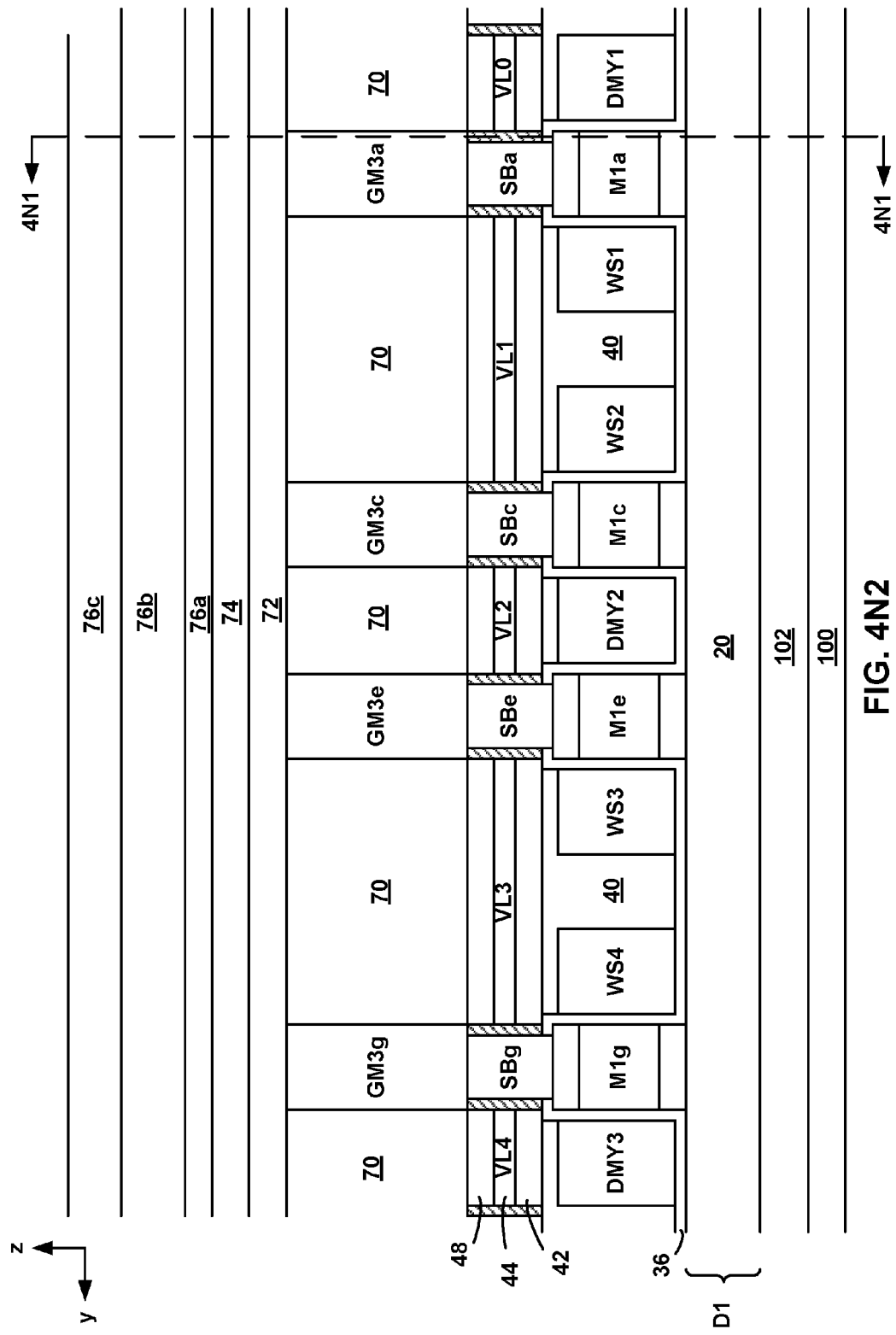
FIG. 4N2

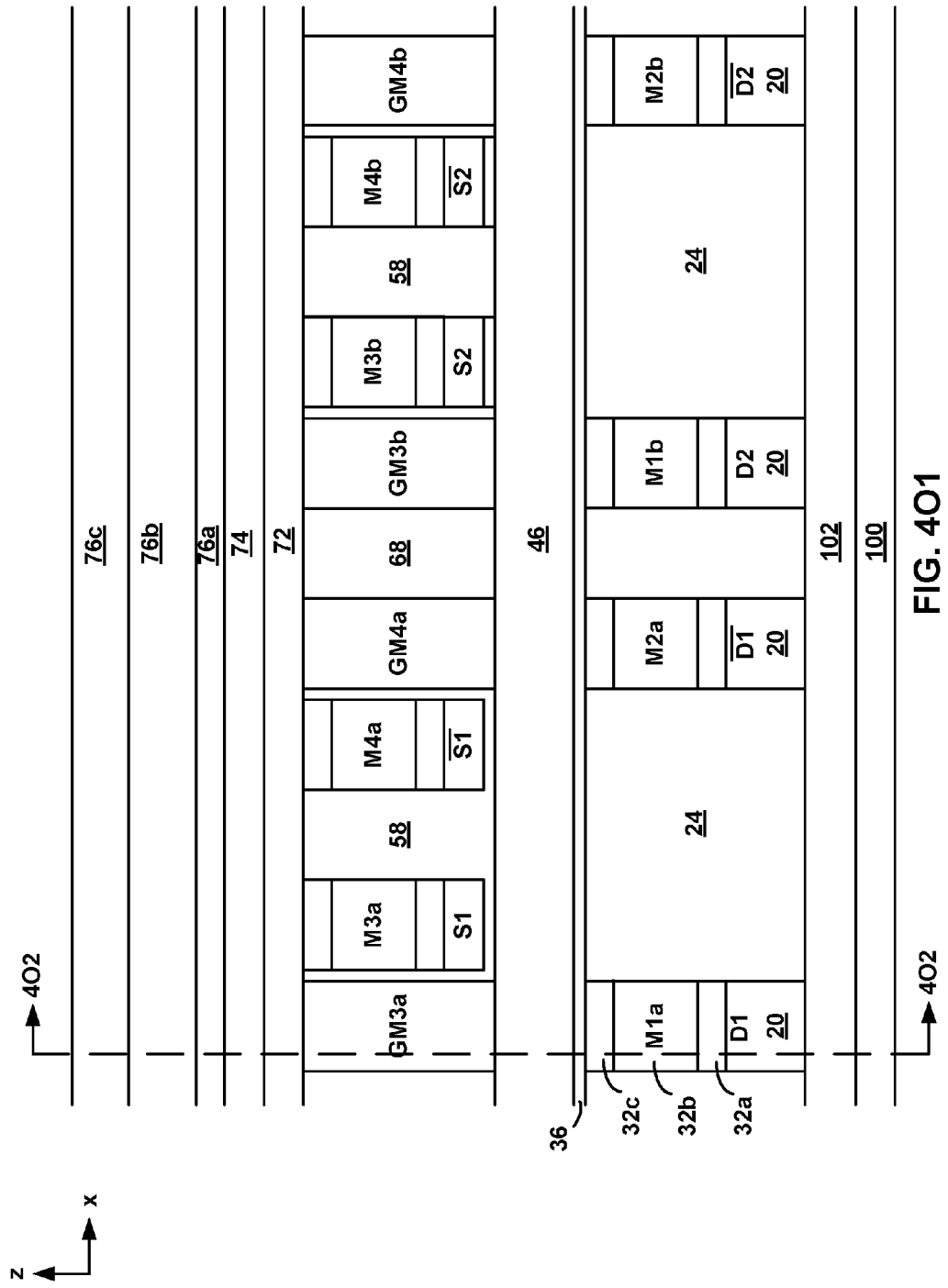
FIG. 4O1

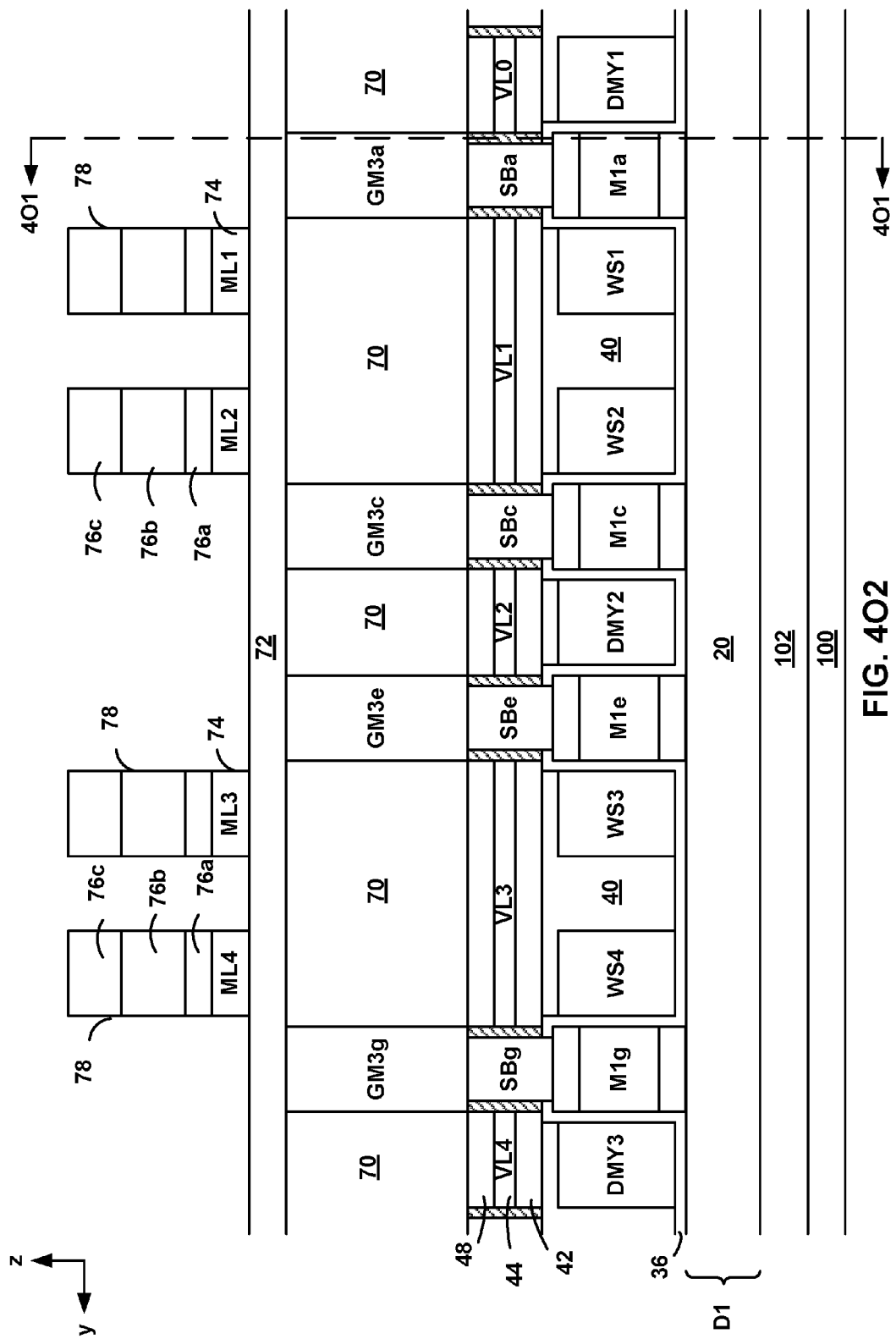
FIG. 4O2

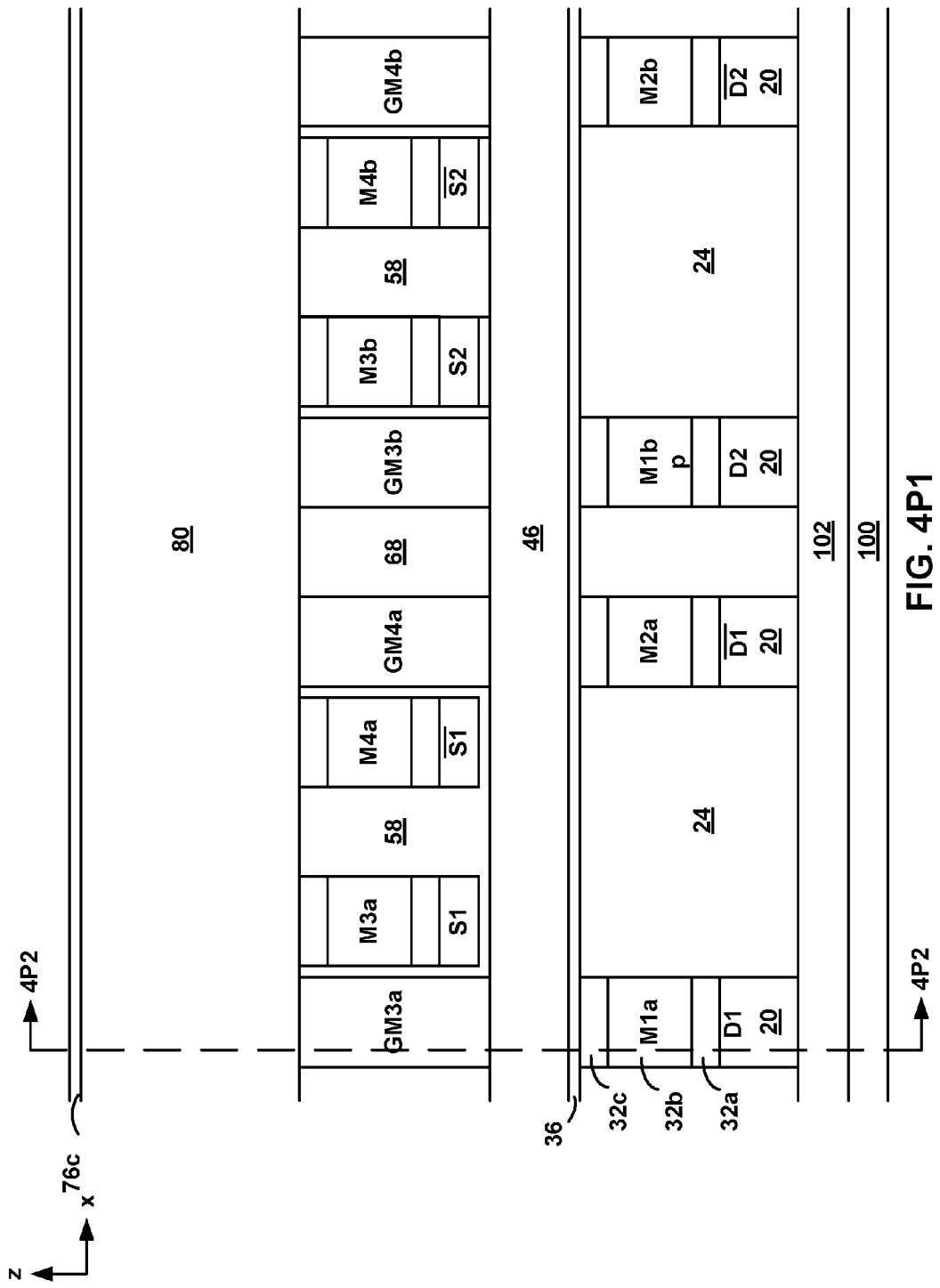

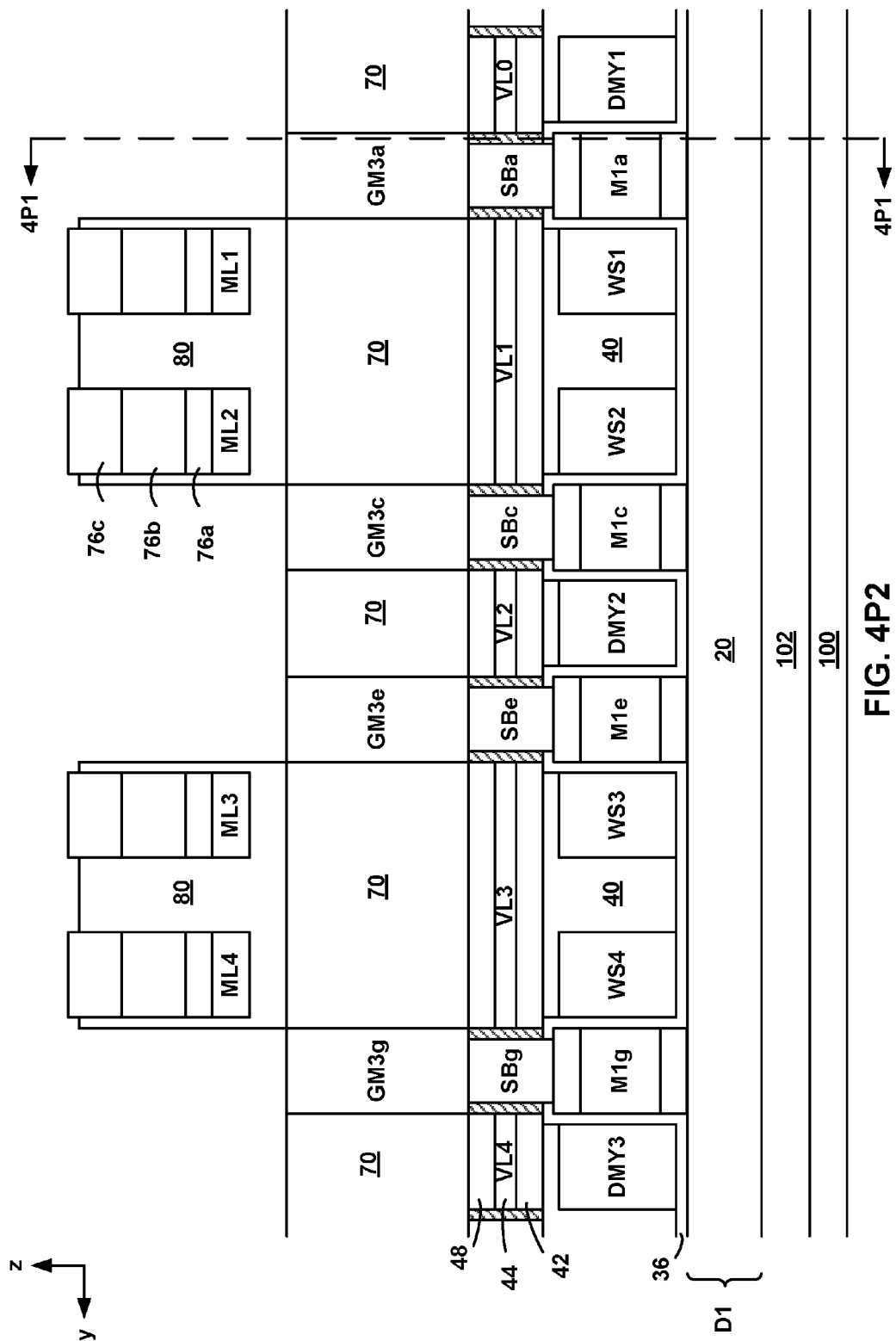
FIG. 4P2

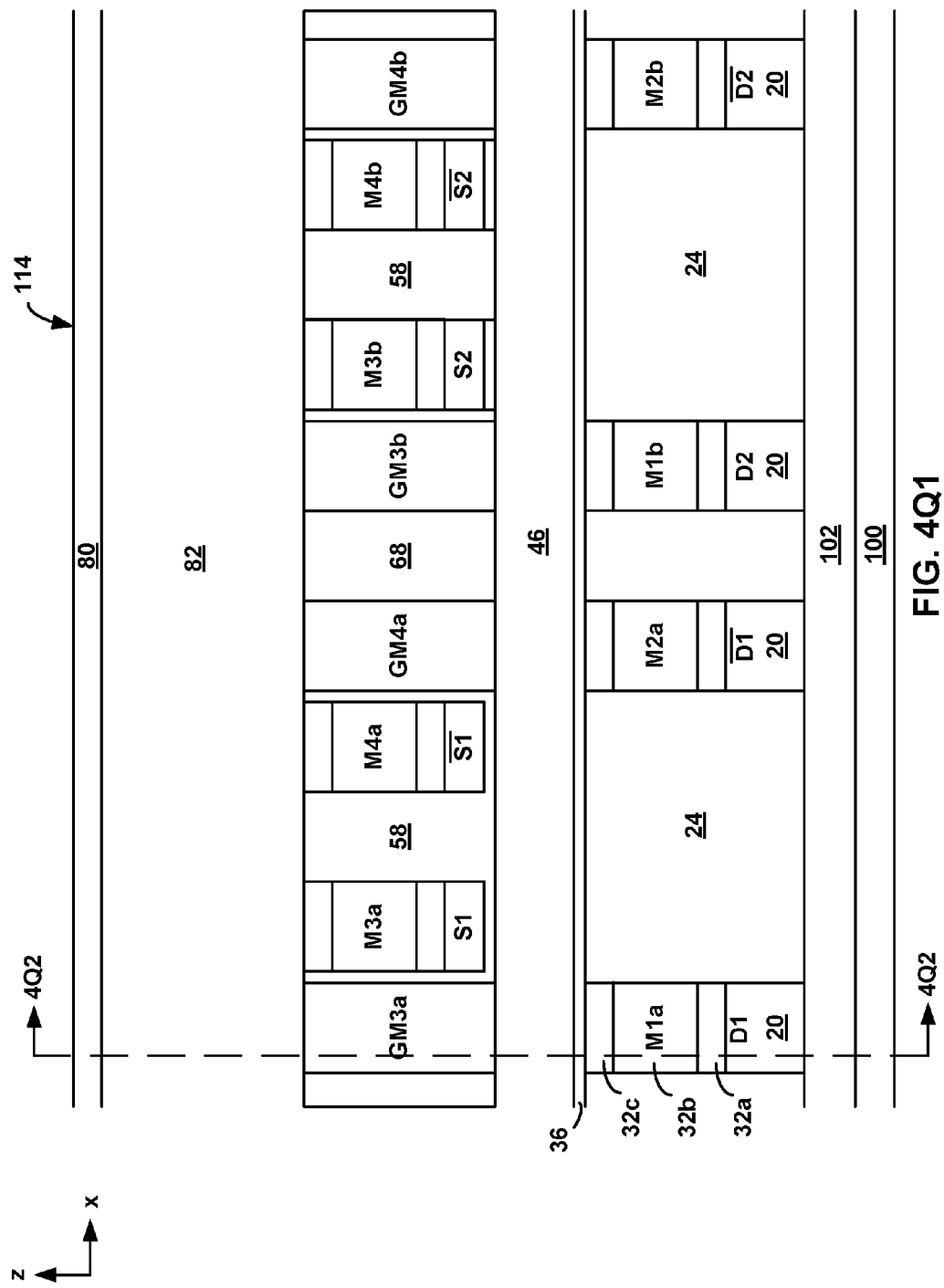
FIG. 4Q1

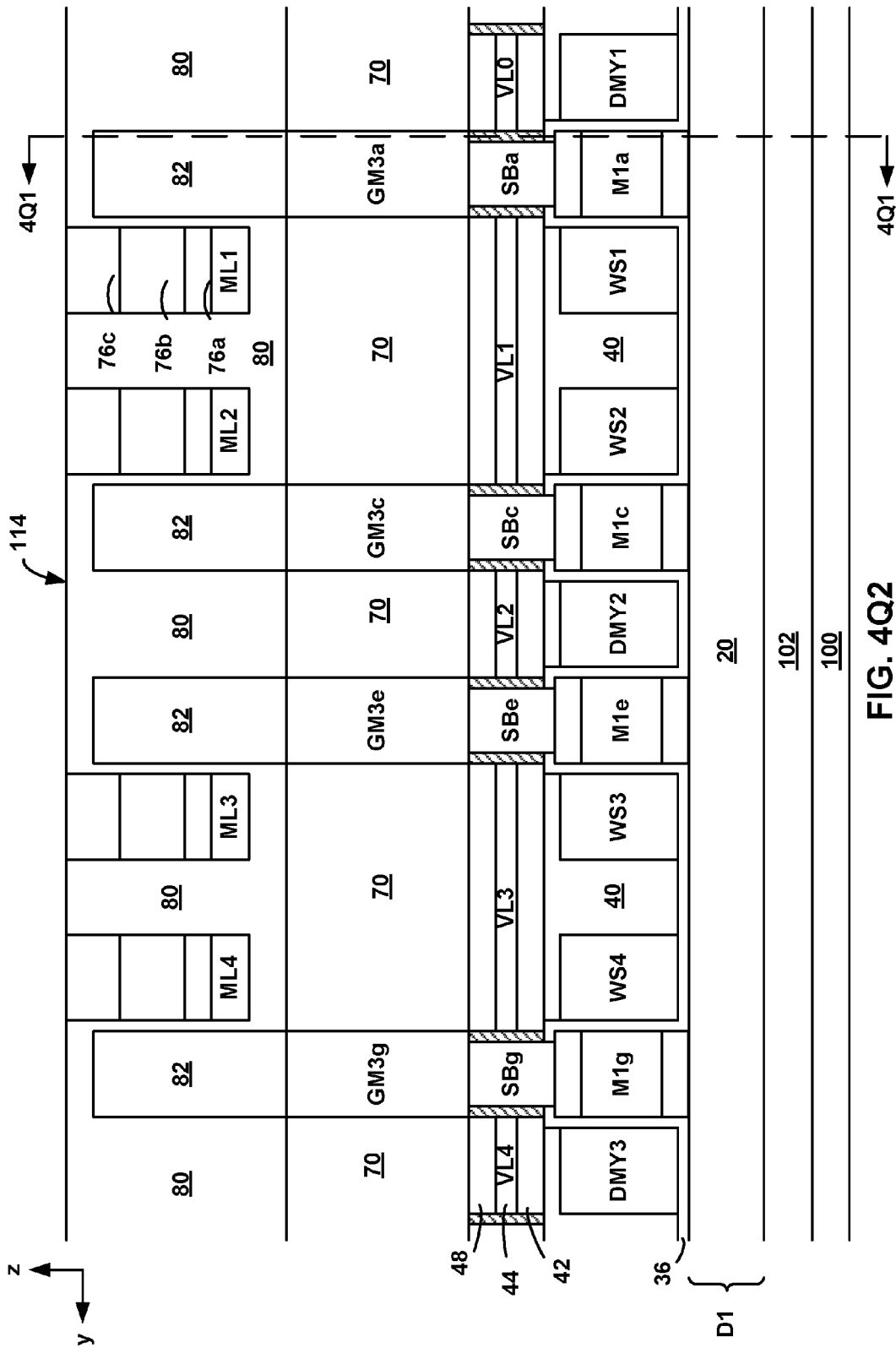
FIG. 4Q2

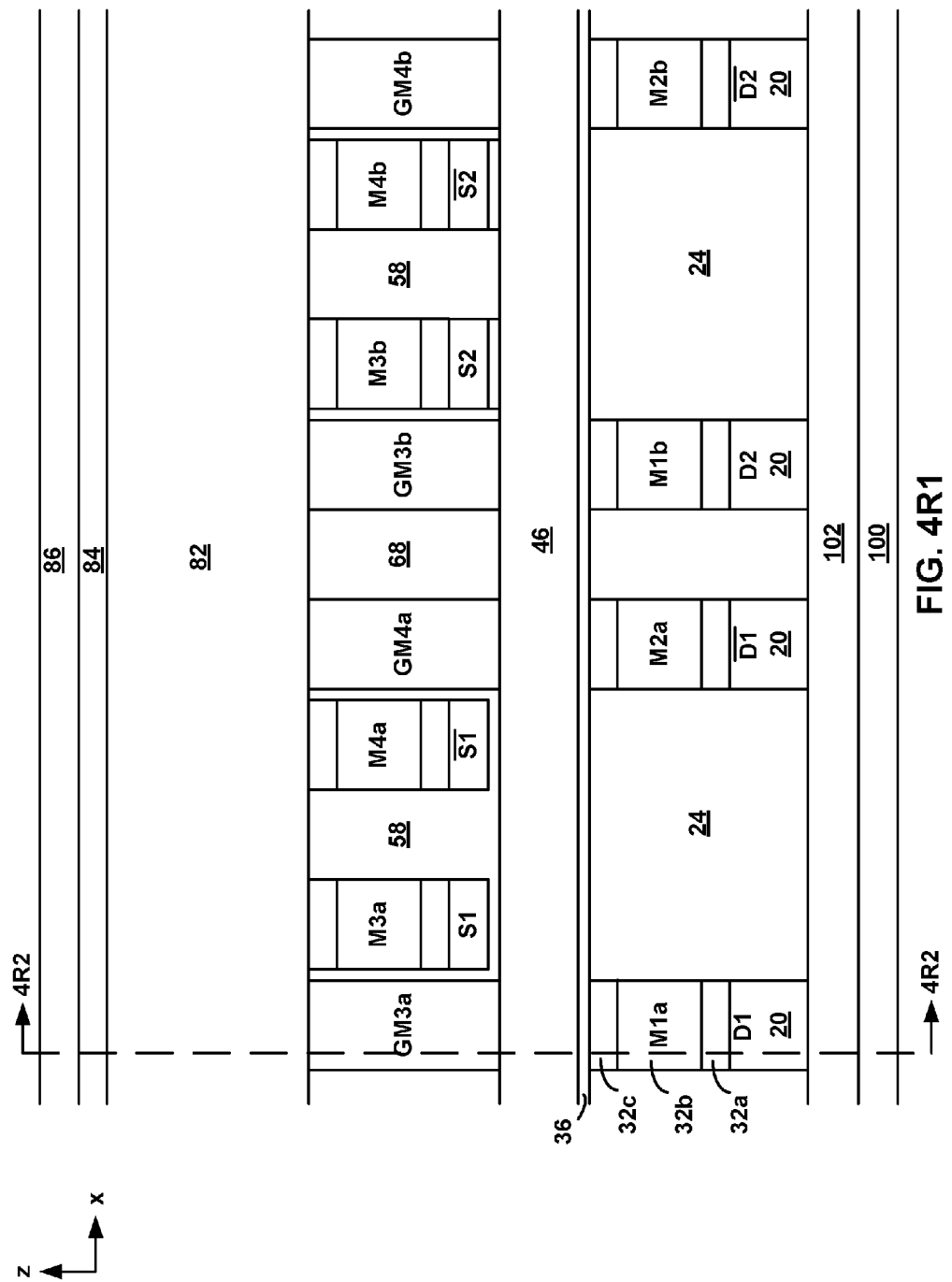
FIG. 4R1

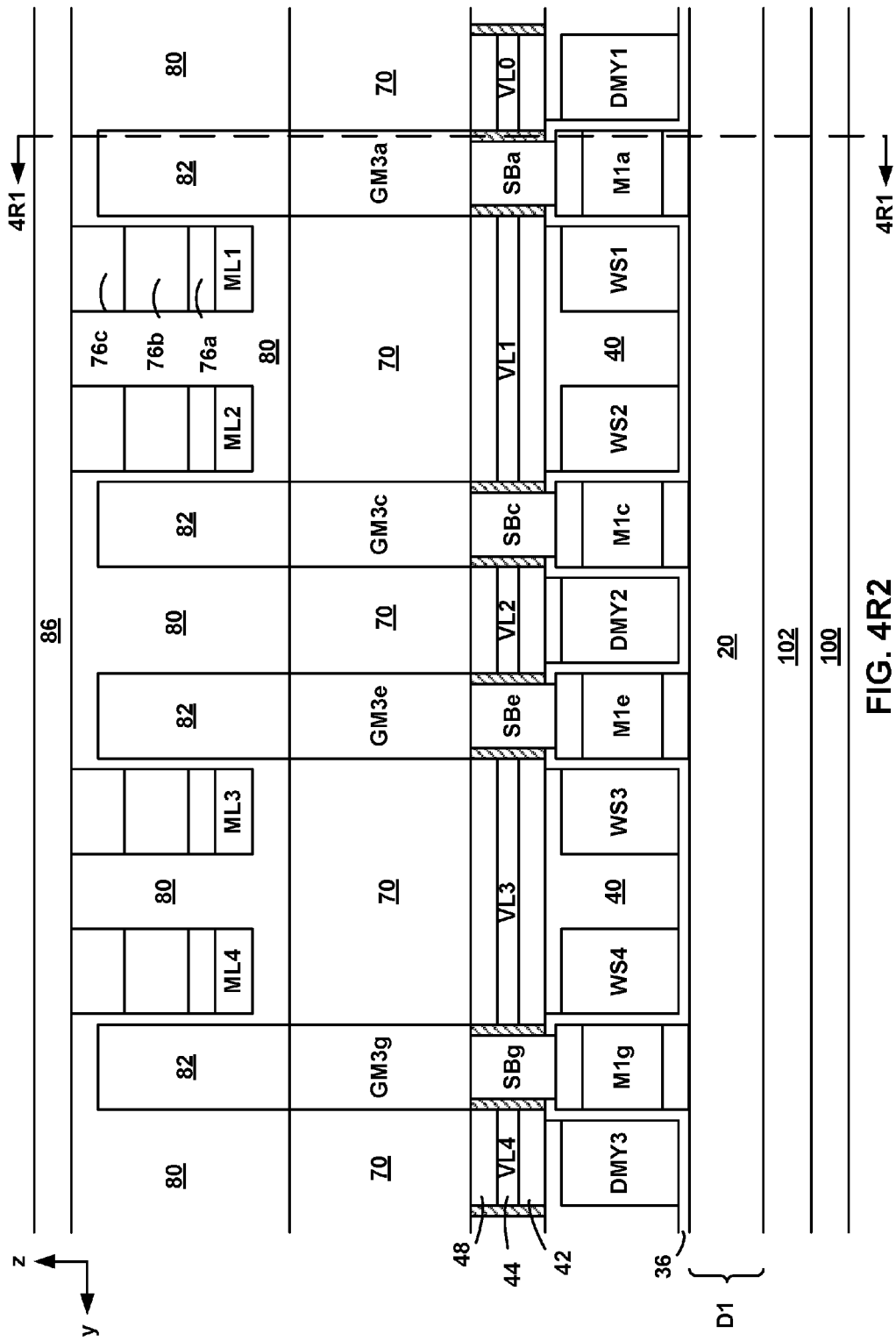
FIG. 4R2

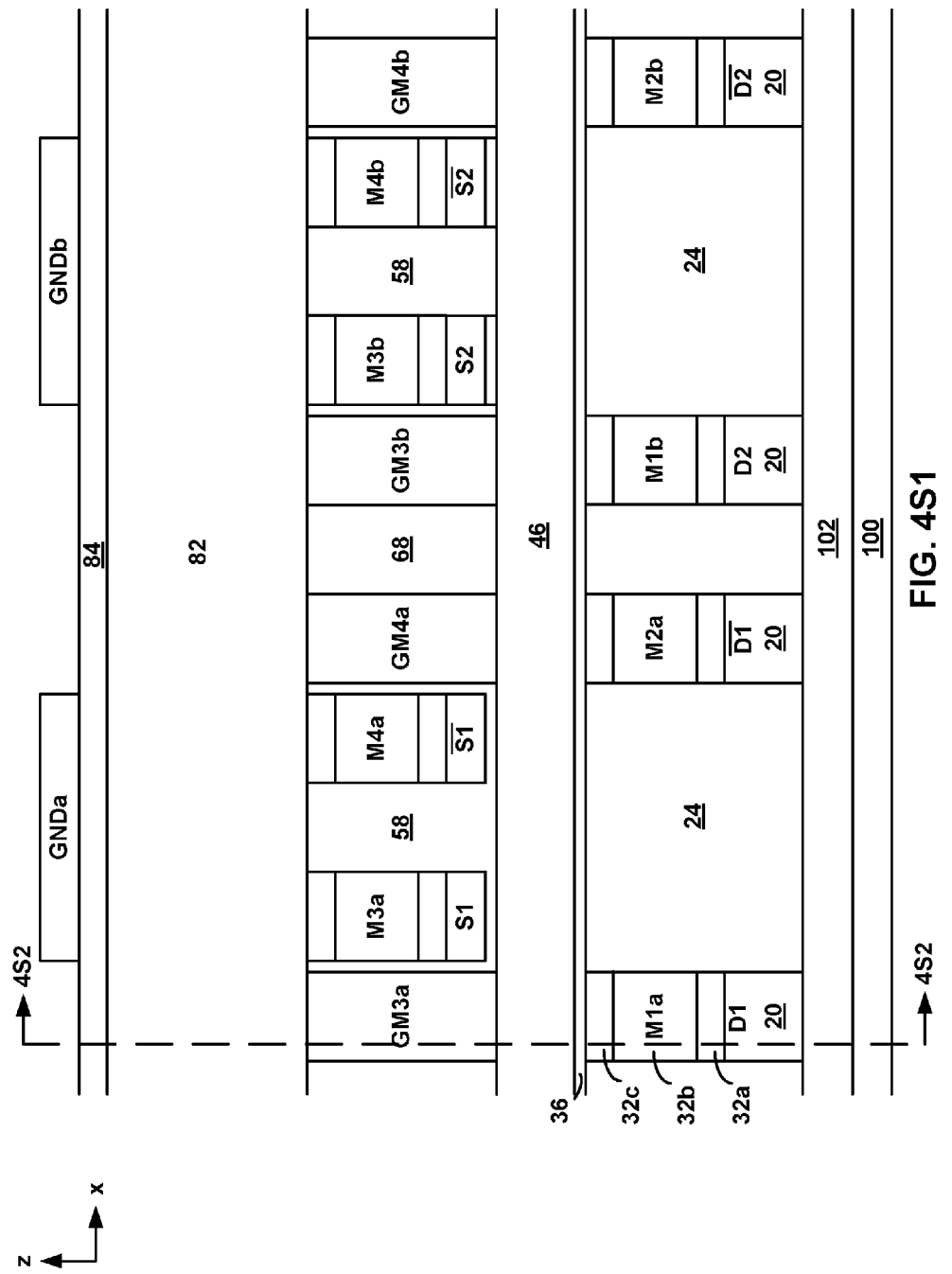

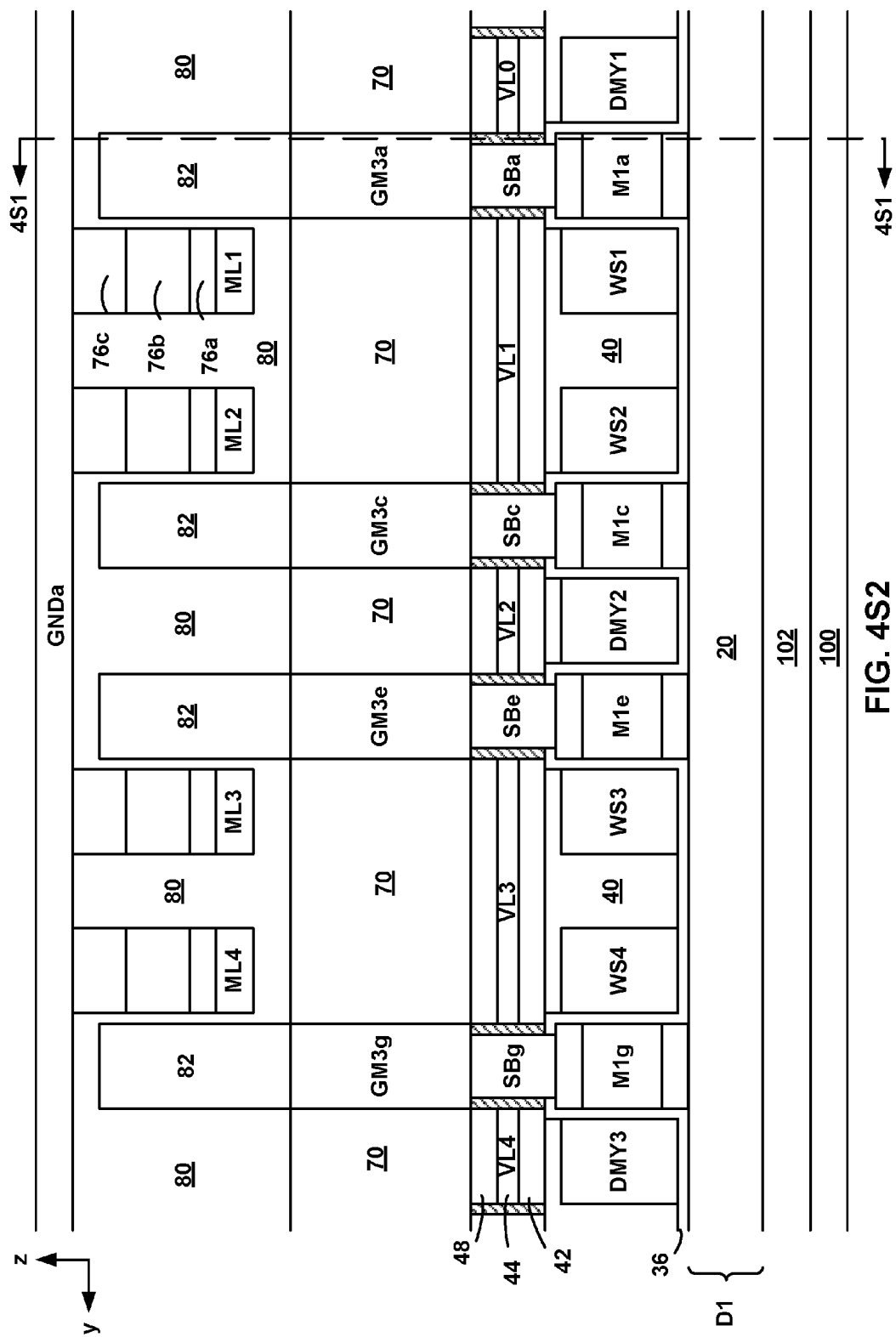
FIG. 4S2

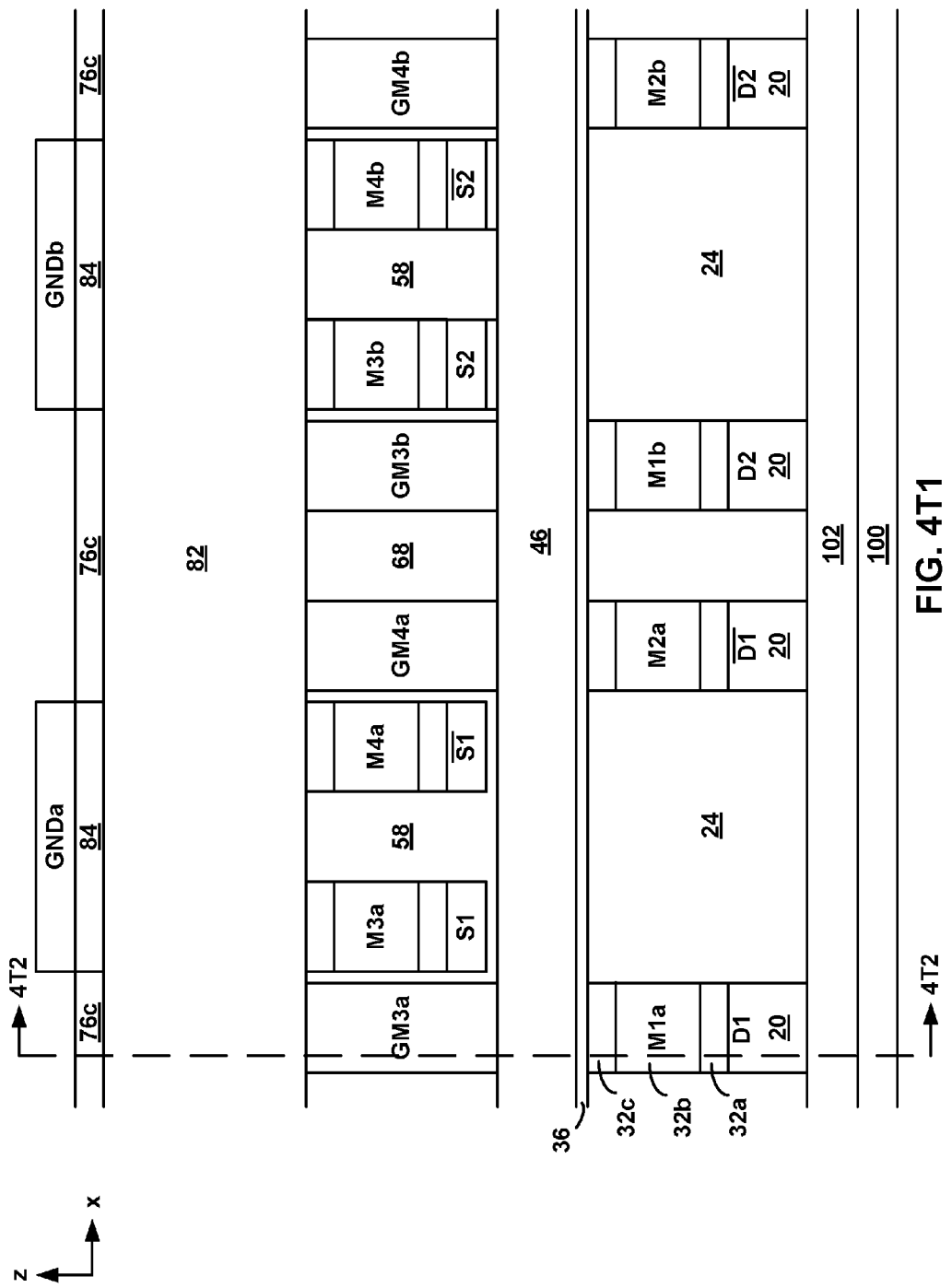
FIG. 4T1

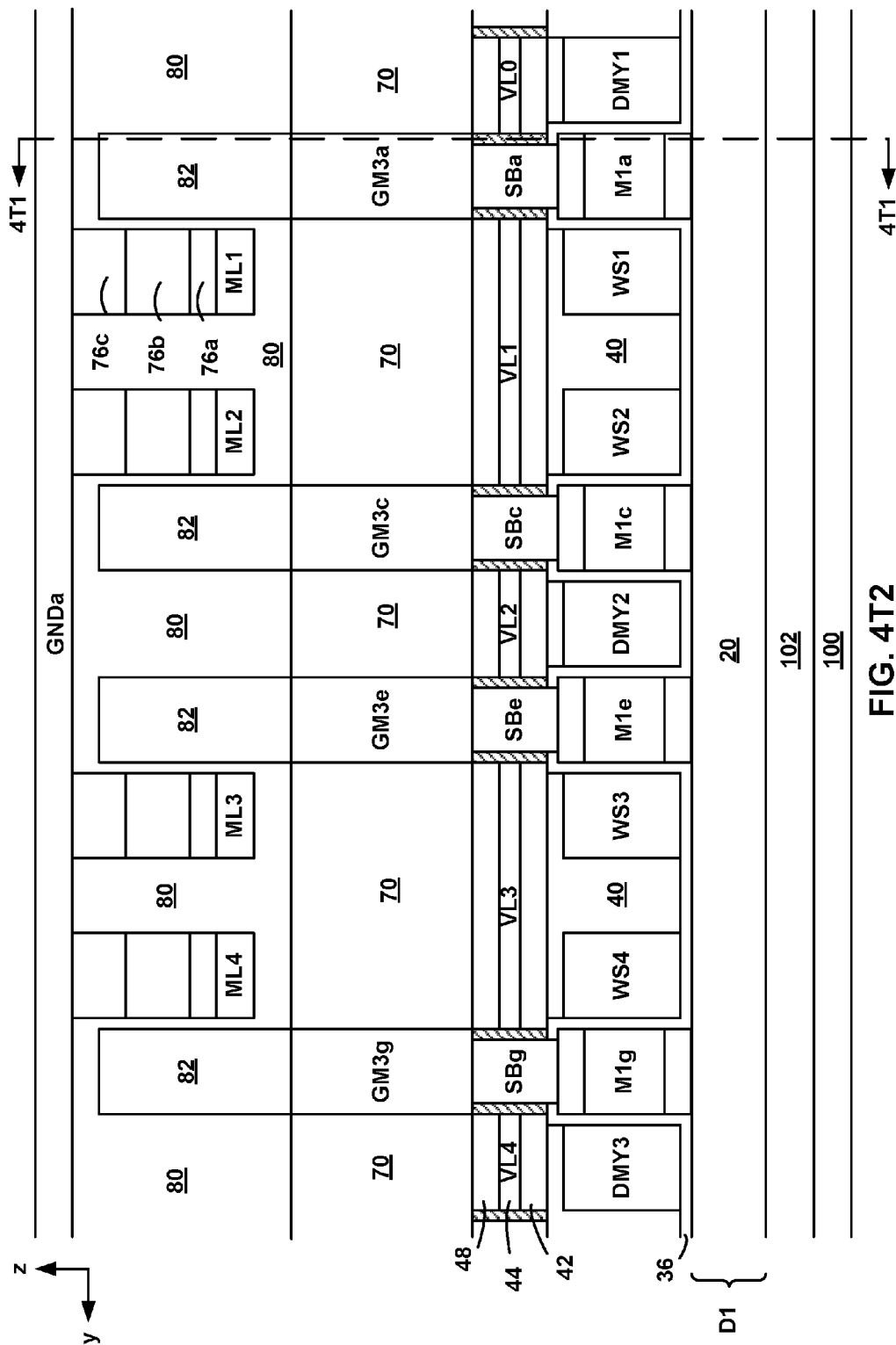
FIG. 4T2

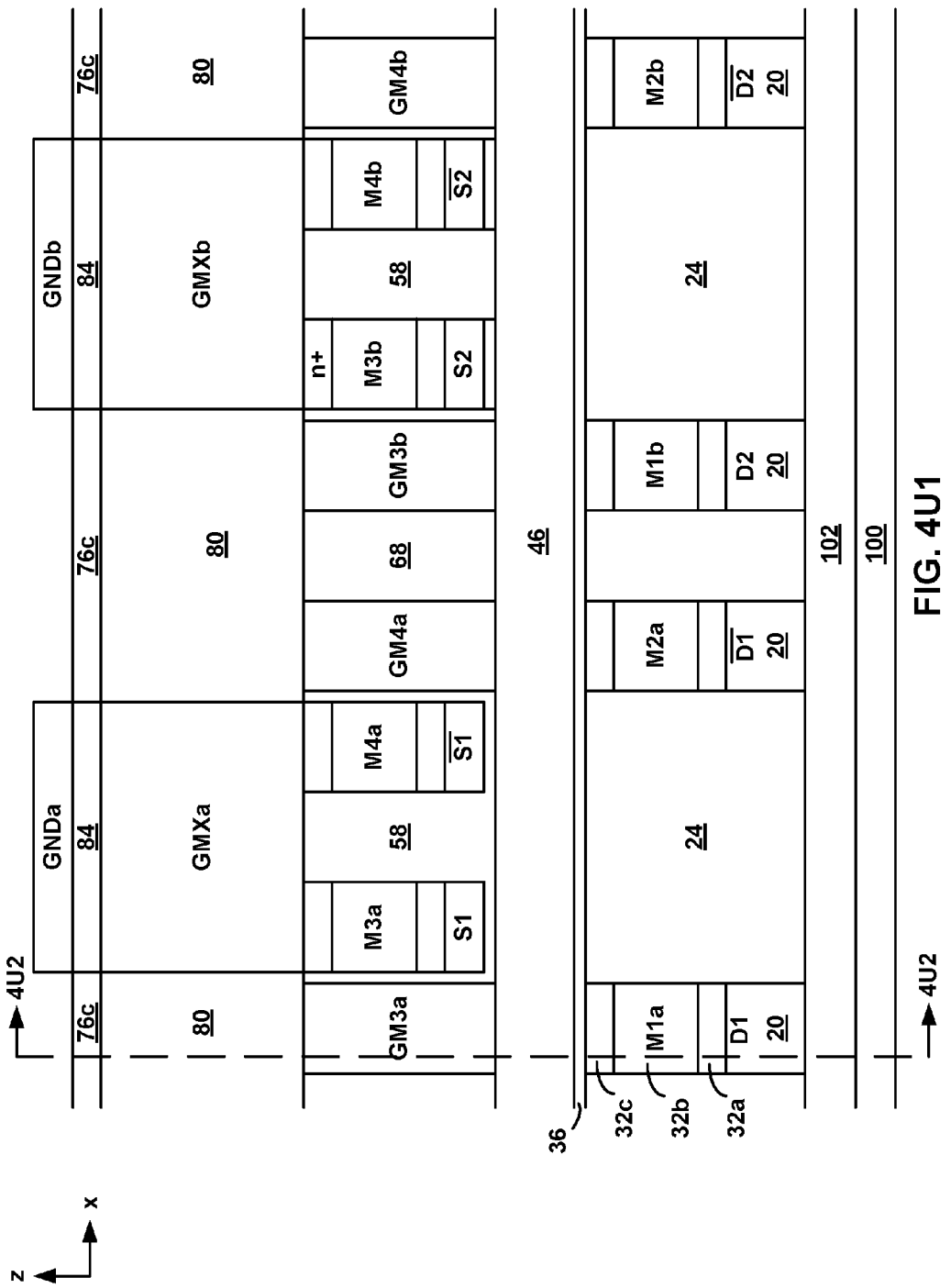
FIG. 4U1

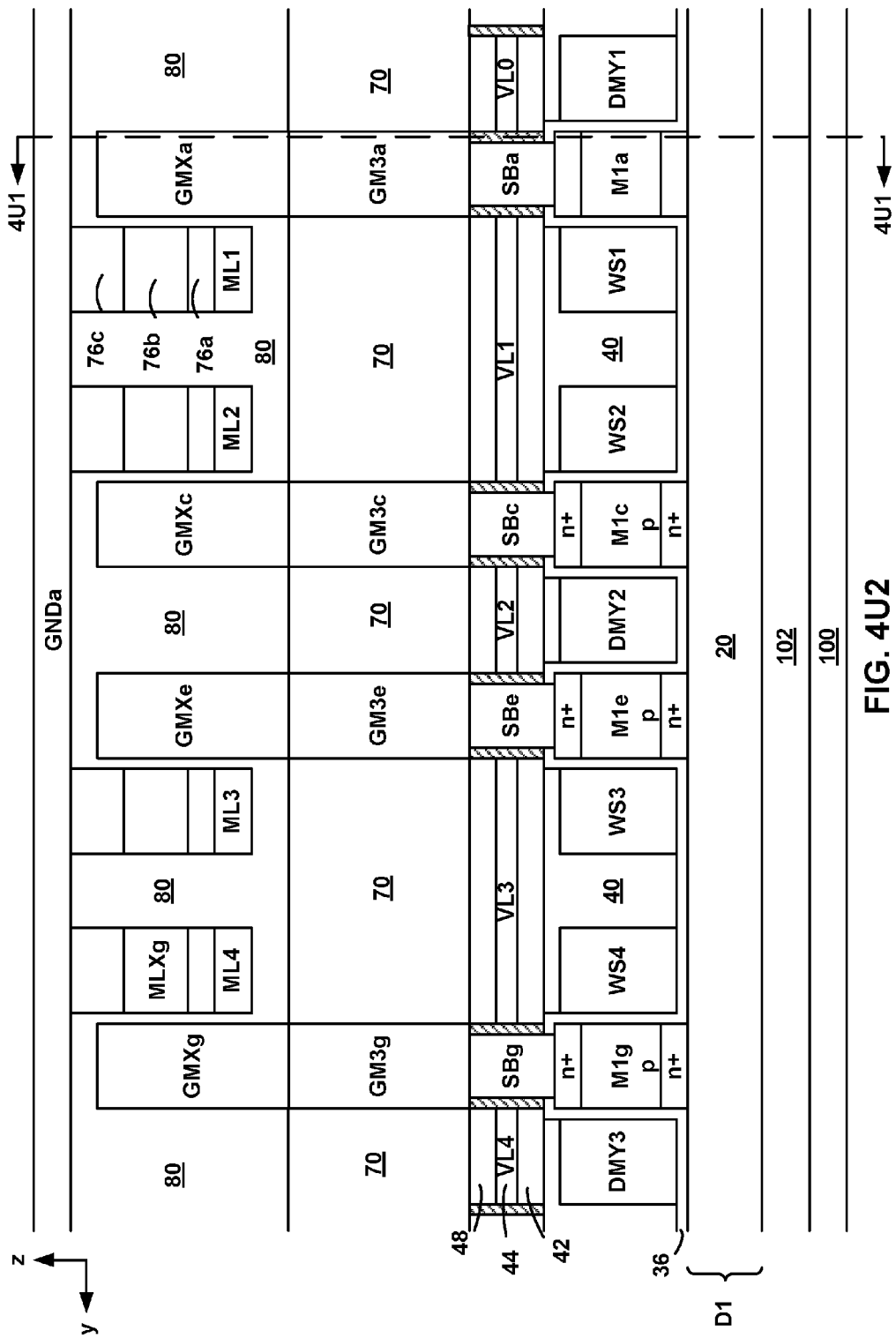
FIG. 4U2

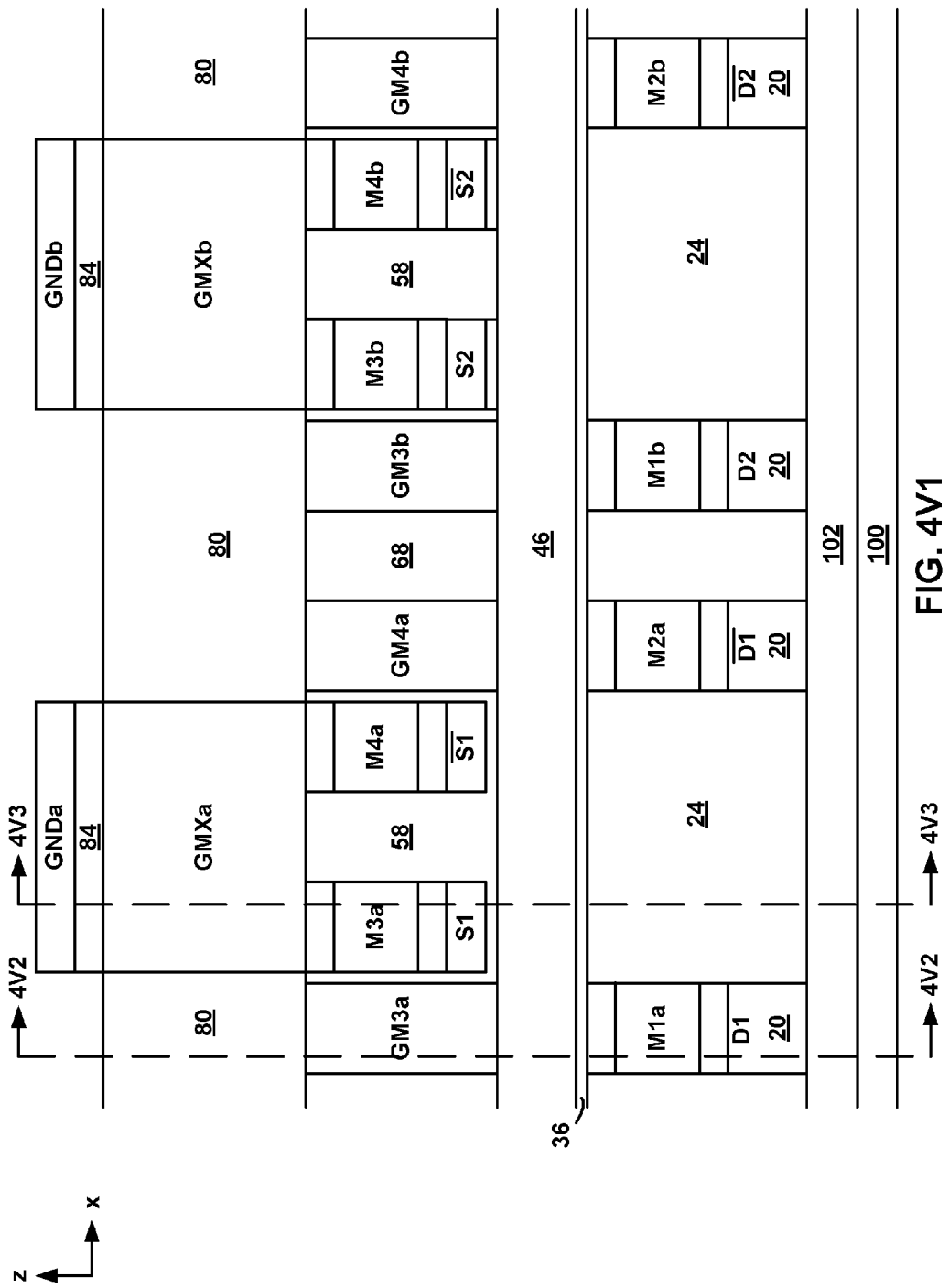
FIG. 4V1

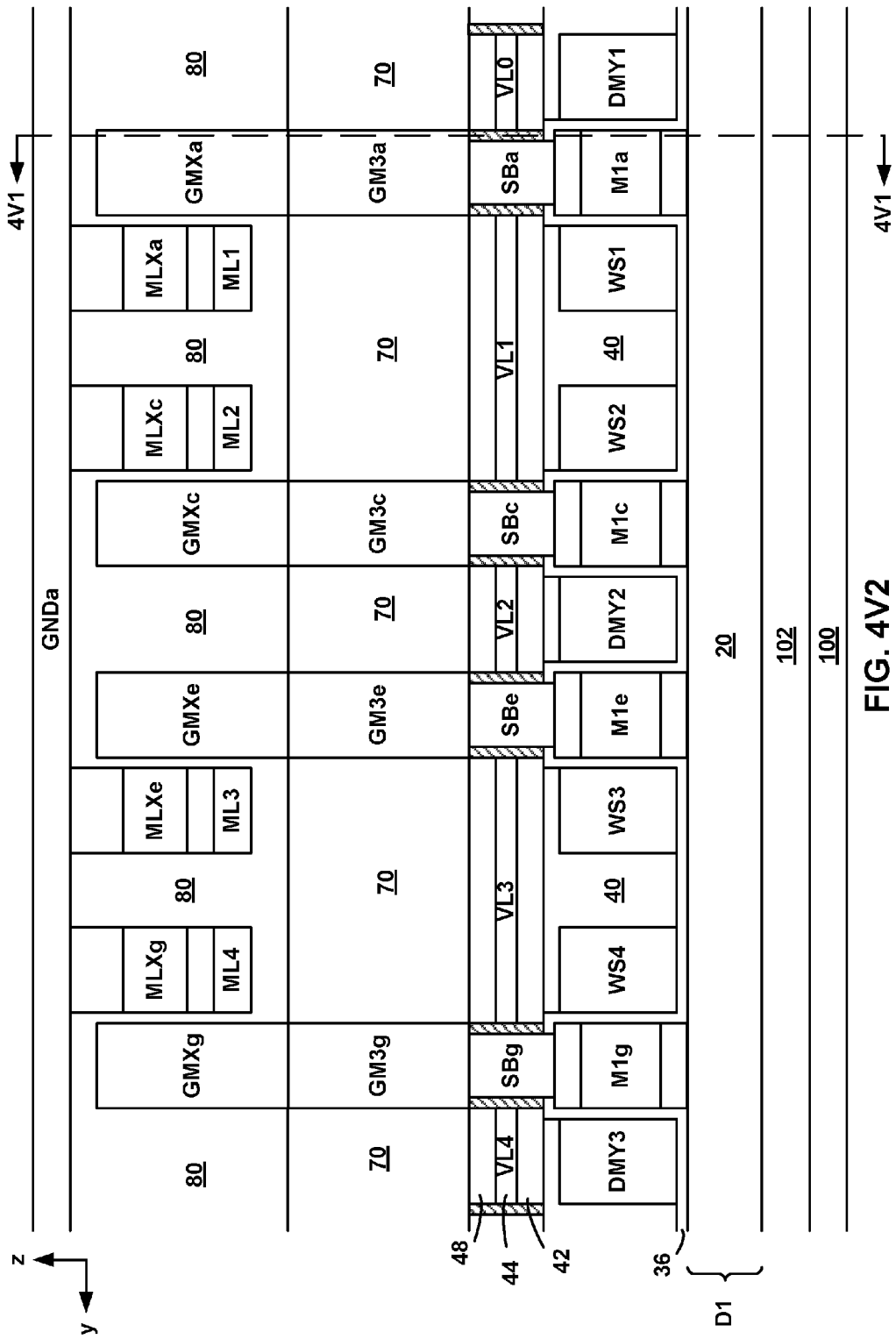

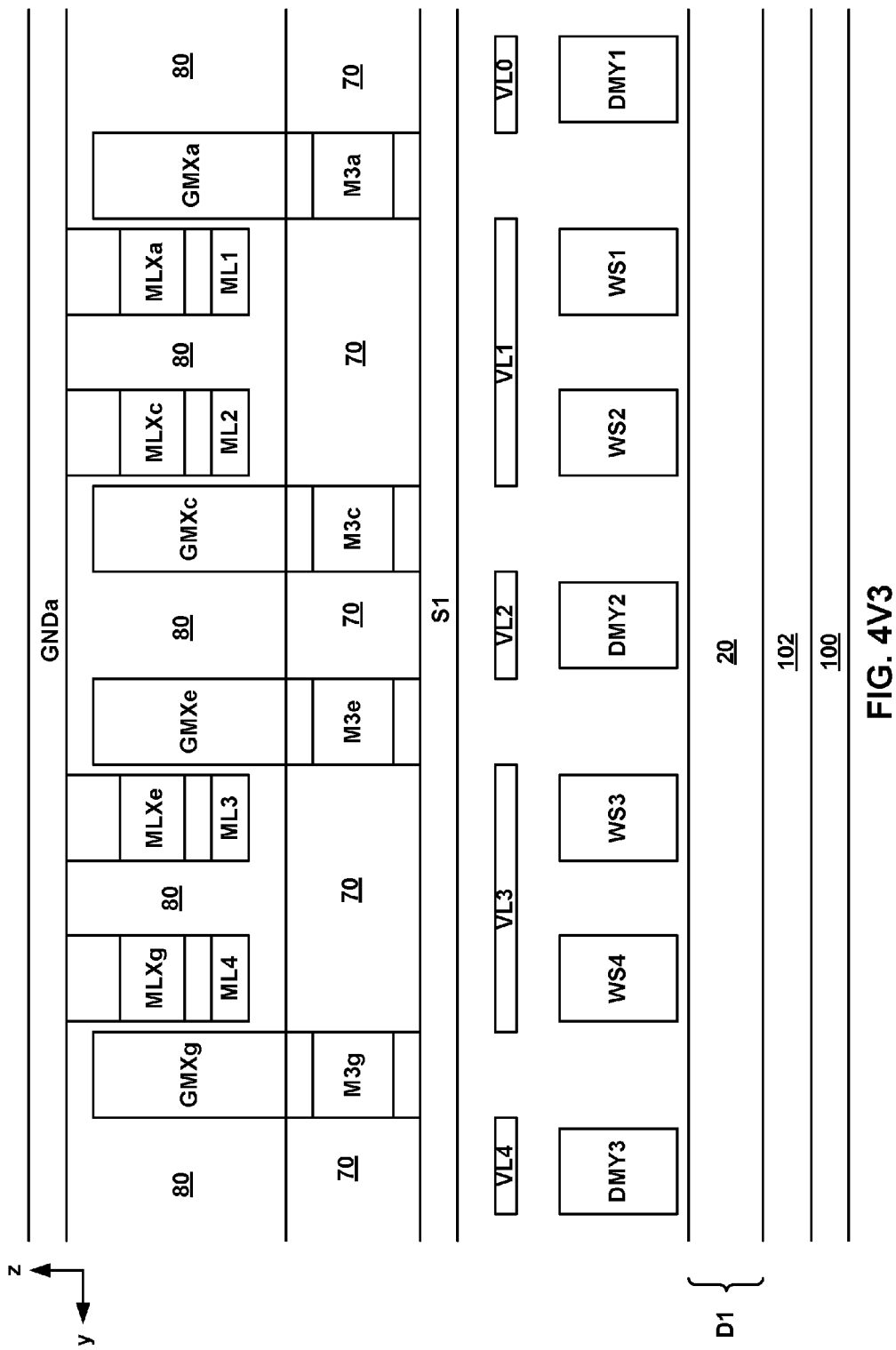
FIG. 4V3

CONTENT ADDRESSABLE MEMORY CELLS AND MEMORY ARRAYS

CLAIM OF PRIORITY

This application is a divisional of U.S. patent application Ser. No. 14/512,552, filed on Oct. 13, 2014, which is incorporated herein by reference in its entirety for all purposes.

BACKGROUND

This application relates to technology for non-volatile data storage having reversible resistivity-switching behavior. In particular, this application relates to content addressable memory cells and memory arrays that include ReRAM devices and vertical transistors.

A variety of materials show reversible resistivity-switching behavior, and may be suitable for use in resistance-switching memory devices, sometimes referred to as "ReRAM" devices. Transition metal oxides exhibit reversible resistivity-switching behavior, and have been proposed for use in ReRAM devices. Upon application of sufficient voltage, current, or other stimulus, the reversible resistivity-switching material switches to a stable low-resistance state. This resistivity-switching is reversible, such that subsequent application of an appropriate voltage, current, or other stimulus can return the reversible resistivity-switching material to a stable high-resistance state. This conversion can be repeated many times. The low resistance state is sometimes referred to as an "ON" state, and the high resistance state is sometimes referred to as an "OFF" state. For some switching materials, the initial state is low-resistance rather than high-resistance.

ReRAM devices may be used in nonvolatile memory arrays. One type of memory array is referred to as a cross-point array, which is a matrix of memory elements typically arranged along x-axes (e.g., word lines) and along y-axes (e.g., bit lines). A digital value may be stored as a memory resistance (HIGH or LOW). The memory state of a memory cell can be read by supplying appropriate voltages to the bit line and word line connected to the selected memory element. The resistance or memory state can be read as an output voltage or current of the bit line connected to the selected memory cell. One resistance state may correspond to a data "0," for example, whereas the other resistance state corresponds to a data "1." Some switching materials may have more than two stable resistance states, and thus may be used to represent more than one bit of data.

ReRAM devices also may be used in content addressable memory (CAM). CAM cells typically include two complimentary memory elements with built-in XOR circuitry for fast matching of the stored data to a reference. CAM cells typically are made using CMOS SRAM cells or the like. Such existing CAM cells may require up to ten transistors, and thus can be quite large. CAM cell architectures with two ReRAM devices and seven transistors implemented in a CMOS process have been proposed.

BRIEF DESCRIPTION OF THE DRAWINGS

FIGS. 4A1-4V3 are cross-sectional views of a portion of a substrate during an example fabrication of the memory array of FIGS. 3A-3C.

DETAILED DESCRIPTION

Figure 1A:
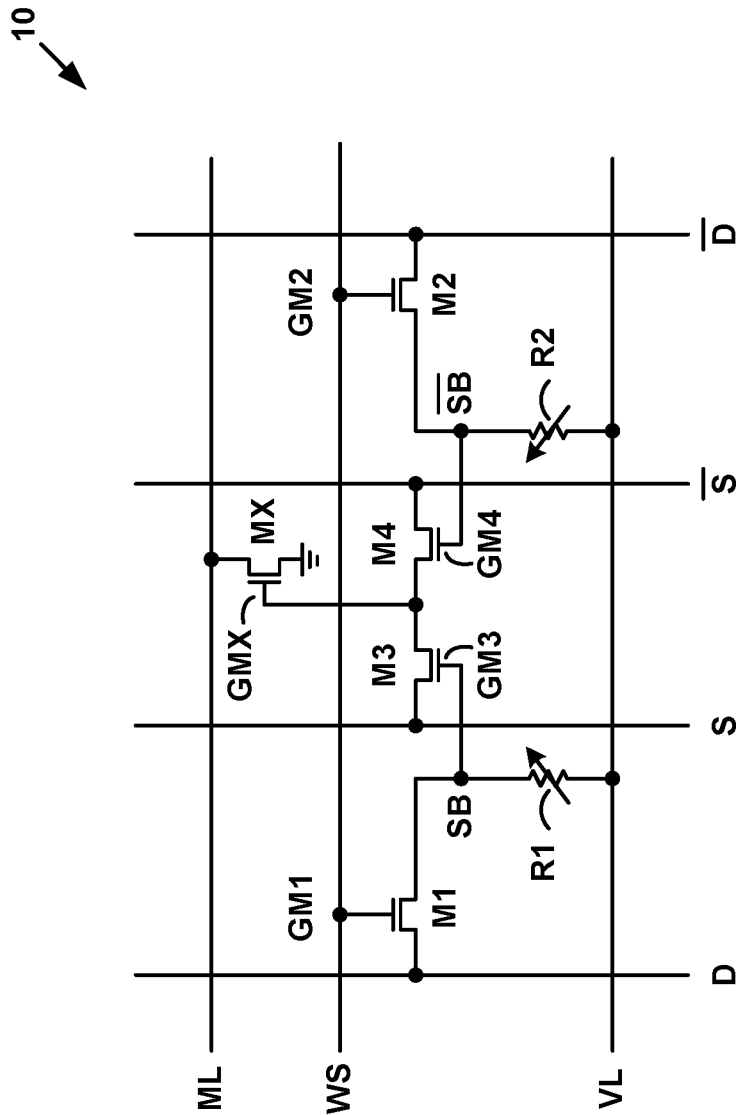
FIG. 1A is a simplified schematic diagrams of an example embodiment of a ReRAM CAM memory cell.

FIG. 1A is a simplified schematic diagram of an example ReRAM CAM memory cell 10 that includes a first memory element R1, a second memory element R2, a first transistor M1, a second transistor M2, a third transistor M3, a fourth transistor M4 and a fifth transistor MX. ReRAM CAM memory cell 10 is coupled to bit lines D and $\overline{D}$, complementary search lines S and $\overline{S}$, a match line ML, a word select line WS, and a read/write line VL. In an embodiment, memory elements R1 and R2 each are reversible resistance-switching memory elements.

Transistor M1 has a first terminal (e.g., a drain/source terminal) coupled to bit line D, a second terminal (e.g., a controlling electrode, or a gate terminal) coupled to word select line WS, and a third terminal (e.g., a source/drain terminal) coupled at node SB to a first terminal of reversible resistance-switching element R1, which has a second terminal coupled to read/write line VL. For simplicity, the second terminal of transistor M1 will be referred to as gate terminal GM1 of transistor M1.

Transistor M2 has a first terminal (e.g., a drain/source terminal) coupled to complementary bit line $\overline{D}$, a second terminal (e.g., a controlling electrode, or a gate terminal) coupled to word select line WS, and a third terminal (e.g., a source/drain terminal) coupled at node $\overline{SB}$ to a first terminal of reversible resistance-switching element R2, which has a second terminal coupled to read/write line VL. For simplicity, the second terminal of transistor M2 will be referred to as gate terminal GM2 of transistor M2.

Transistor M3 has a first terminal (e.g., a drain/source terminal) coupled to search line S, a second terminal (e.g., a controlling electrode, or a gate terminal) coupled at node SB to the first terminal of reversible resistance-switching element R1 and the third terminal of transistor M1, and a third terminal (e.g., a source/drain terminal) coupled at node GMX to transistors M4 and MX. For simplicity, the second terminal of transistor M3 will be referred to as gate terminal GM3 of transistor M3.

Transistor M4 has a first terminal (e.g., a drain/source terminal) coupled to complementary search line $\overline{S}$, a second terminal (e.g., a controlling electrode, or a gate terminal) coupled at node $\overline{SB}$ to the first terminal of reversible resistance-switching element R2 and the third terminal of transistor M2, and a third terminal (e.g., a source/drain terminal) coupled at node GMX to transistors M3 and MX. For simplicity, the second terminal of transistor M4 will be referred to as gate terminal GM4 of transistor M4.

Transistor MX includes a first terminal (e.g., a drain/source terminal) coupled to match line ML, a second terminal (e.g., a controlling electrode, or a gate terminal) coupled to the third terminal of transistor M3 and the third terminal of transistor M4, and a third terminal (e.g., a source/drain terminal) coupled to GROUND. For simplicity, the second terminal of transistor MX will be referred to as gate terminal GMX of transistor MX.

In an embodiment, transistors M1, M2, M3 M4 and MX are each vertically-oriented pillar-shaped transistors (Vertical Transistors). Vertical Transistors M1, M2, M3 M4 and MX each may be a field-effect transistor, as shown, or a bipolar transistor, or other similar transistor.

ReRAM CAM memory cell 10 can be written, for example, using the following method:

Write Step 1:

A positive voltage is applied to WS, VL, and $\overline{D}$, and D is grounded. In this way, transistor M1 is turned ON, and a voltage is applied to ReRAM element R1. The polarity of this voltage is such that the VL side of ReRAM element R1 more positive than node SB. In this polarity, the ReRAM element R1 will switch to a low-resistance state (LRS). Meanwhile, the voltage across ReRAM element R2 is 0 volts, so no switching event occurs on that element.

Write Step 2:

Still with a positive voltage applied to WS, VL and D are now grounded, and a positive voltage is applied to $\overline{D}$. Now transistor M2 is turned ON, and a voltage is applied to ReRAM element R2. The polarity of this voltage is opposite that of the voltage applied to ReRAM element R1 in Write Step 1. That is, the $\overline{SB}$ side of element R2 is more positive than the VL side. In this polarity, the element R2 will switch to a high-resistance state (HRS). The voltage across the element R1 is 0 volts during this step, so no switching event will occur on this element.

The foregoing describes writing a "01" (or LRS-HRS) state to ReRAM CAM memory cell 10. To write a "10" (or HRS-LRS) state, VL and $\overline{D}$ are grounded, and D is brought to a positive voltage in step 1. In step 2, VL and D are brought to a positive voltage, and $\overline{D}$ is grounded. Again, WS is kept at a positive voltage for both steps.

In some embodiments, ReRAM CAM memory cell 10 may contain parasitic ReRAM elements, not shown, connected between nodes SB and $\overline{SB}$ and a neighboring VL line. In this case, the neighboring VL line should be held at a voltage intermediate between 0V and the positive voltage used to switch elements R1 and R2 during the write operation.

Alternatively, the two write steps 1 and 2 may be combined into a single step, where VL is held at an intermediate voltage, and $\overline{D}$ and D are set to voltages above and below the VL voltage, respectively, in order to write the "01" state to the ReRAM CAM memory cell 10. To write the "10" state using a combined step, the voltages on $\overline{D}$ and D are reversed. Again, WS is kept at a positive voltage throughout the write operation.

To use ReRAM CAM memory cell 10 for a "data compare" read operation, the following steps are taken:

Comparison Read step 1: line ML is pre-charged to a positive voltage. Lines D, $\overline{D}$, and VL are all set to ground, and WS is raised to a positive voltage. This will pre-discharge the nodes SB and $\overline{SB}$ (to 0V). Lines S and $\overline{S}$ are set to 0V and a positive voltage V, respectively (or vice-versa, depending on the data to compare).

Comparison Read step 2: WS is brought low (to 0V), and shortly thereafter, VL is raised to a positive voltage $V_1$ that is greater than the threshold voltage of transistors M3, M4, and MX, but less than the voltages required to change the state of the ReRAM elements R1 and R2. The node SB or $\overline{SB}$ that is connected to the ReRAM element in its low-resistance state will rise from 0 to $V_1$ volts, while the other node will stay at 0V. Thus, either M3 or M4 will be turned ON. If the turned-ON transistor M3 or M4 is connected to the search line S or $\overline{S}$ which has been raised high, then transistor MX will turn ON and bring the pre-charged "match" line ML low. That is, if R1 is in the LRS and S is high, or if R2 is in the LRS and $\overline{S}$ is high, then a "match" is detected and ML is pulled low. Otherwise, ML remains high.

Figure 1B:
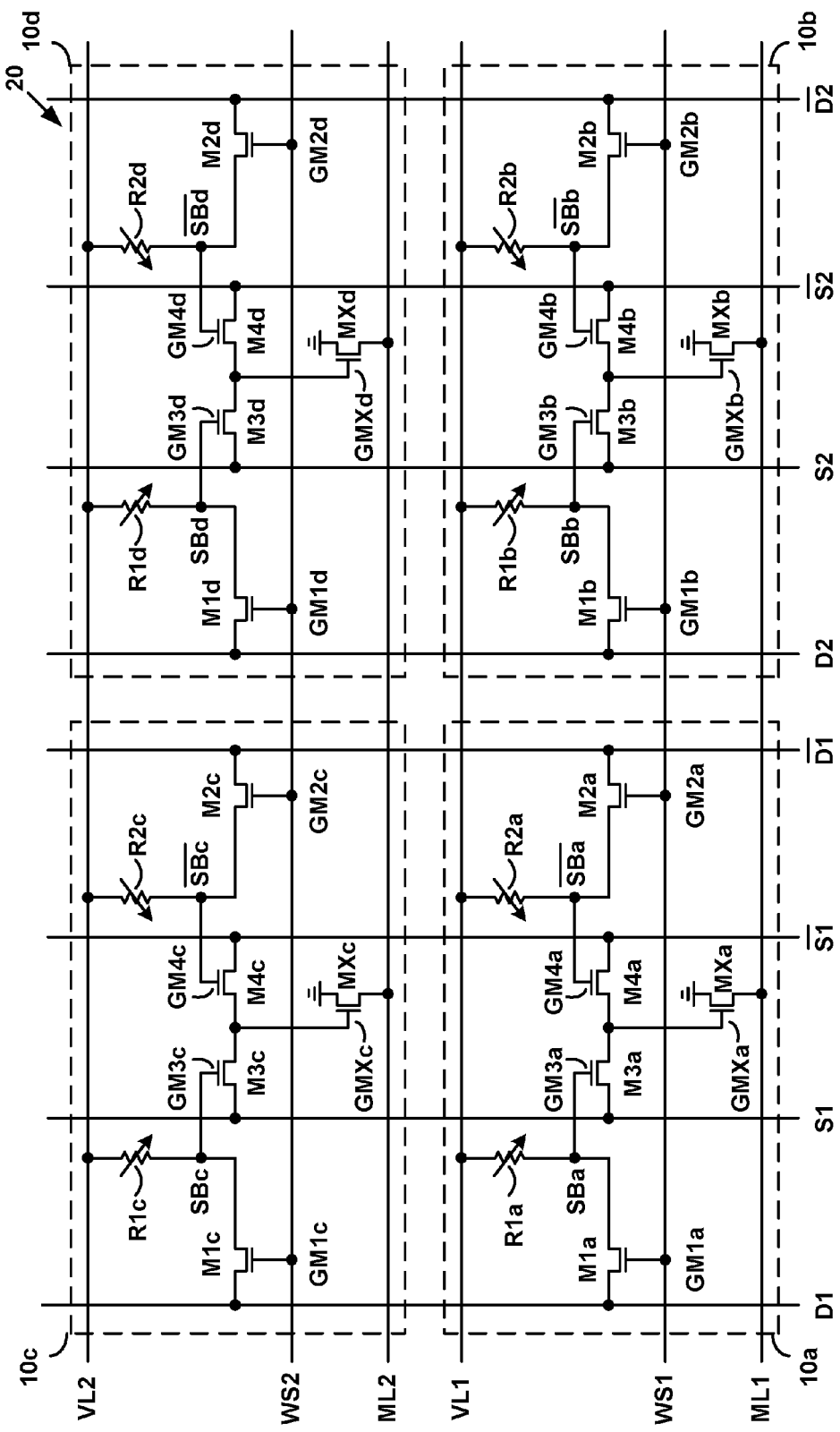
FIG. 1B is a simplified schematic diagrams of an example embodiment of an array of the ReRAM CAM memory cells of FIG. 1A.

In example embodiments, ReRAM CAM memory cells, such as ReRAM CAM memory cell 10, may be configured into ReRAM CAM memory cell arrays. FIG. 1B is a simplified schematic diagram of an example ReRAM CAM memory cell array 20 that includes four ReRAM CAM memory cells 10a, 10b, 10c and 10d. Persons of ordinary skill in the art will understand that ReRAM CAM memory cell arrays may include more or fewer than four ReRAM CAM memory cells.

ReRAM CAM memory cell 10a includes reversible resistance-switching elements R1a and R2a, and Vertical Transistors M1a, M2a, M3a, M4a and MXa. ReRAM CAM memory cell 10a is coupled to first bit lines D1 and $\overline{D1}$, first search lines S1 and $\overline{S1}$, a first match line ML1, a first word select line WS1, and a read/write line VL1.

ReRAM CAM memory cell 10b includes reversible resistance-switching elements R1b and R2b, and Vertical Transistors M1b, M2b, M3b, M4b and MXb. ReRAM CAM memory cell 10b is coupled to second bit lines D2 and $\overline{D2}$, second search lines S2 and $\overline{S2}$, first match line ML1, first word select line WS1, and read/write line VL1.

ReRAM CAM memory cell 10c includes reversible resistance-switching elements R1c and R2c, and Vertical Transistors M1c, M2c, M3c, M4c and MXc. ReRAM CAM memory cell 10c is coupled to first bit lines D1 and $\overline{D1}$, first search lines S1 and $\overline{S1}$, a second match line ML2, a second word select line WS2, and read/write line VL2.

ReRAM CAM memory cell 10d includes reversible resistance-switching elements R1d and R2d, and Vertical Transistors M1d, M2d, M3d, M4d and MXd. ReRAM CAM memory cell 10d is coupled to second bit lines D2 and $\overline{D2}$, second search lines S2 and $\overline{S2}$, second match line ML2, second word select line WS2, and read/write line VL1.

Vertical Transistor M1a has a first terminal (e.g., a drain/source terminal) coupled to first bit line D1, a second terminal (e.g., a controlling electrode, or a gate terminal) coupled to first word select line WS1, and a third terminal (e.g., a source/drain terminal) coupled at node SBa to a first terminal of reversible resistance-switching element R1a, which has a second terminal coupled to read/write line VL1. For simplicity, the second terminal of Vertical Transistor M1a will be referred to as gate terminal GM1a of Vertical Transistor M1a.

Vertical Transistor M2a has a first terminal (e.g., a drain/source terminal) coupled to first complementary bit line $\overline{D1}$, a second terminal (e.g., a controlling electrode, or a gate terminal) coupled to first word select line WS1, and a third terminal (e.g., a source/drain terminal) coupled at node $\overline{SBa}$ to a first terminal of reversible resistance-switching element R2a, which has a second terminal coupled to read/write line VL1. For simplicity, the second terminal of Vertical Transistor M2a will be referred to as gate terminal GM2a of Vertical Transistor M2a.

Vertical Transistor M3a has a first terminal (e.g., a drain/source terminal) coupled to first search line S1, a second terminal (e.g., a controlling electrode, or a gate terminal) coupled at node SBa to the first terminal of reversible resistance-switching element R1a and the third terminal of Vertical Transistor M1a, and a third terminal (e.g., a source/drain terminal) coupled at node GMXa to Vertical Transistors M4a and MXa. For simplicity, the second terminal of Vertical Transistor M3a will be referred to as gate terminal GM3a of Vertical Transistor M3a.

Vertical Transistor M4a has a first terminal (e.g., a drain/source terminal) coupled to first complementary search line $\overline{S1}$, a second terminal (e.g., a controlling electrode, or a gate terminal) coupled at node $\overline{SBa}$ to the first terminal of reversible resistance-switching element R2a and the third terminal of Vertical Transistor M2a, and a third terminal (e.g., a source/drain terminal) coupled at node GMXa to Vertical Transistors M3a and MXa. For simplicity, the second terminal of Vertical Transistor M4a will be referred to as gate terminal GM4a of Vertical Transistor M4a.

Vertical Transistor MXa includes a first terminal (e.g., a drain/source terminal) coupled to first match line ML1, a second terminal (e.g., a controlling electrode, or a gate terminal) coupled to the third terminal of Vertical Transistor M3a and the third terminal of Vertical Transistor M4a, and a third terminal (e.g., a source/drain terminal) coupled to GROUND. For simplicity, the second terminal of Vertical Transistor MXa will be referred to as gate terminal GMXa of Vertical Transistor MXa.

Vertical Transistor M1b has a first terminal (e.g., a drain/source terminal) coupled to second bit line D2, a second terminal (e.g., a controlling electrode, or a gate terminal) coupled to first word select line WS1, and a third terminal (e.g., a source/drain terminal) coupled at node SBb to a first terminal of reversible resistance-switching element R1b, which has a second terminal coupled to read/write line VL1. For simplicity, the second terminal of Vertical Transistor M1b will be referred to as gate terminal GM1b of Vertical Transistor M1b.

Vertical Transistor M2b has a first terminal (e.g., a drain/source terminal) coupled to second complementary bit line $\overline{D2}$, a second terminal (e.g., a controlling electrode, or a gate terminal) coupled to first word select line WS1, and a third terminal (e.g., a source/drain terminal) coupled at node $\overline{SBb}$ to a first terminal of reversible resistance-switching element R2b, which has a second terminal coupled to read/write line VL1. For simplicity, the second terminal of Vertical Transistor M2b will be referred to as gate terminal GM2b of Vertical Transistor M2b.

Vertical Transistor M3b has a first terminal (e.g., a drain/source terminal) coupled to second search line S2, a second terminal (e.g., a controlling electrode, or a gate terminal) coupled at node SBb to the first terminal of reversible resistance-switching element R1b and the third terminal of Vertical Transistor M1b, and a third terminal (e.g., a source/drain terminal) coupled at node GMXb to Vertical Transistors M4b and MXb. For simplicity, the second terminal of Vertical Transistor M3b will be referred to as gate terminal GM3b of Vertical Transistor M3b.

Vertical Transistor M4b has a first terminal (e.g., a drain/source terminal) coupled to second complementary search line $\overline{S2}$, a second terminal (e.g., a controlling electrode, or a gate terminal) coupled at node $\overline{SBb}$ to the first terminal of reversible resistance-switching element R2b and the third terminal of Vertical Transistor M2b, and a third terminal (e.g., a source/drain terminal) coupled at node GMXb to Vertical Transistors M3b and MXb. For simplicity, the second terminal of Vertical Transistor M4b will be referred to as gate terminal GM4b of Vertical Transistor M4b.

Vertical Transistor MXb includes a first terminal (e.g., a drain/source terminal) coupled to first match line ML1, a second terminal (e.g., a controlling electrode, or a gate terminal) coupled to the third terminal of Vertical Transistor M3b and the third terminal of Vertical Transistor M4b, and a third terminal (e.g., a source/drain terminal) coupled to GROUND. For simplicity, the second terminal of Vertical Transistor MXb will be referred to as gate terminal GMXb of Vertical Transistor MXb.

Vertical Transistor M1c has a first terminal (e.g., a drain/source terminal) coupled to first bit line D1, a second terminal (e.g., a controlling electrode, or a gate terminal) coupled to second word select line WS2, and a third terminal (e.g., a source/drain terminal) coupled at node SBc to a first terminal of reversible resistance-switching element R1c, which has a second terminal coupled to read/write line VL1. For simplicity, the second terminal of Vertical Transistor M1c will be referred to as gate terminal GM1c of Vertical Transistor M1c.

Vertical Transistor M2c has a first terminal (e.g., a drain/source terminal) coupled to first complementary bit line $\overline{D1}$, a second terminal (e.g., a controlling electrode, or a gate terminal) coupled to second word select line WS2, and a third terminal (e.g., a source/drain terminal) coupled at node $\overline{SBc}$ to a first terminal of reversible resistance-switching element R2c, which has a second terminal coupled to read/write line VL1. For simplicity, the second terminal of Vertical Transistor M2c will be referred to as gate terminal GM2c of Vertical Transistor M2c.

Vertical Transistor M3c has a first terminal (e.g., a drain/source terminal) coupled to first search line S1, a second terminal (e.g., a controlling electrode, or a gate terminal) coupled at node SBc to the first terminal of reversible resistance-switching element R1c and the third terminal of Vertical Transistor M1c, and a third terminal (e.g., a source/drain terminal) coupled at node GMXc to Vertical Transistors M4c and MXc. For simplicity, the second terminal of Vertical Transistor M3c will be referred to as gate terminal GM3c of Vertical Transistor M3c.

Vertical Transistor M4c has a first terminal (e.g., a drain/source terminal) coupled to first complementary search line $\overline{S1}$, a second terminal (e.g., a controlling electrode, or a gate terminal) coupled at node $\overline{SBc}$ to the first terminal of reversible resistance-switching element R2c and the third terminal of Vertical Transistor M2c, and a third terminal (e.g., a source/drain terminal) coupled at node GMXc to Vertical Transistors M3c and MXc. For simplicity, the second terminal of Vertical Transistor M4c will be referred to as gate terminal GM4c of Vertical Transistor M4c.

Vertical Transistor MXc includes a first terminal (e.g., a drain/source terminal) coupled to second match line ML2, a second terminal (e.g., a controlling electrode, or a gate terminal) coupled to the third terminal of Vertical Transistor M3c and the third terminal of Vertical Transistor M4c, and a third terminal (e.g., a source/drain terminal) coupled to GROUND. For simplicity, the second terminal of Vertical Transistor MXc will be referred to as gate terminal GMXc of Vertical Transistor MXc.

Vertical Transistor M1d has a first terminal (e.g., a drain/source terminal) coupled to second bit line D2, a second terminal (e.g., a controlling electrode, or a gate terminal) coupled to second word select line WS2, and a third terminal (e.g., a source/drain terminal) coupled at node SBd to a first terminal of reversible resistance-switching element R1d, which has a second terminal coupled to read/write line VL1. For simplicity, the second terminal of Vertical Transistor M1d will be referred to as gate terminal GM1d of Vertical Transistor M1d.

Vertical Transistor M2d has a first terminal (e.g., a drain/source terminal) coupled to second complementary bit line $\overline{D2}$, a second terminal (e.g., a controlling electrode, or a gate terminal) coupled to second word select line WS2, and a third terminal (e.g., a source/drain terminal) coupled at node $\overline{SBd}$ to a first terminal of reversible resistance-switching element R2d, which has a second terminal coupled to read/write line VL1. For simplicity, the second terminal of Vertical Transistor M2d will be referred to as gate terminal GM2d of Vertical Transistor M2d.

Vertical Transistor M3d has a first terminal (e.g., a drain/source terminal) coupled to second search line S2, a second terminal (e.g., a controlling electrode, or a gate terminal) coupled at node SBd to the first terminal of reversible resistance-switching element R1d and the third terminal of Vertical Transistor M1d, and a third terminal (e.g., a source/drain terminal) coupled at node GMXd to Vertical Transistors M4d and MXd. For simplicity, the second terminal of Vertical Transistor M3d will be referred to as gate terminal GM3d of Vertical Transistor M3d.

Vertical Transistor M4d has a first terminal (e.g., a drain/source terminal) coupled to second complementary search line $\overline{S2}$, a second terminal (e.g., a controlling electrode, or a gate terminal) coupled at node $\overline{SBd}$ to the first terminal of reversible resistance-switching element R2d and the third terminal of Vertical Transistor M2d, and a third terminal (e.g., a source/drain terminal) coupled at node GMXd to Vertical Transistors M3d and MXd. For simplicity, the second terminal of Vertical Transistor M4d will be referred to as gate terminal GM4d of Vertical Transistor M4d.

Vertical Transistor MXd includes a first terminal (e.g., a drain/source terminal) coupled to second match line ML2, a second terminal (e.g., a controlling electrode, or a gate terminal) coupled to the third terminal of Vertical Transistor M3d and the third terminal of Vertical Transistor M4d, and a third terminal (e.g., a source/drain terminal) coupled to GROUND. For simplicity, the second terminal of Vertical Transistor MXd will be referred to as gate terminal GMXd of Vertical Transistor MXd.

Figure 2A:
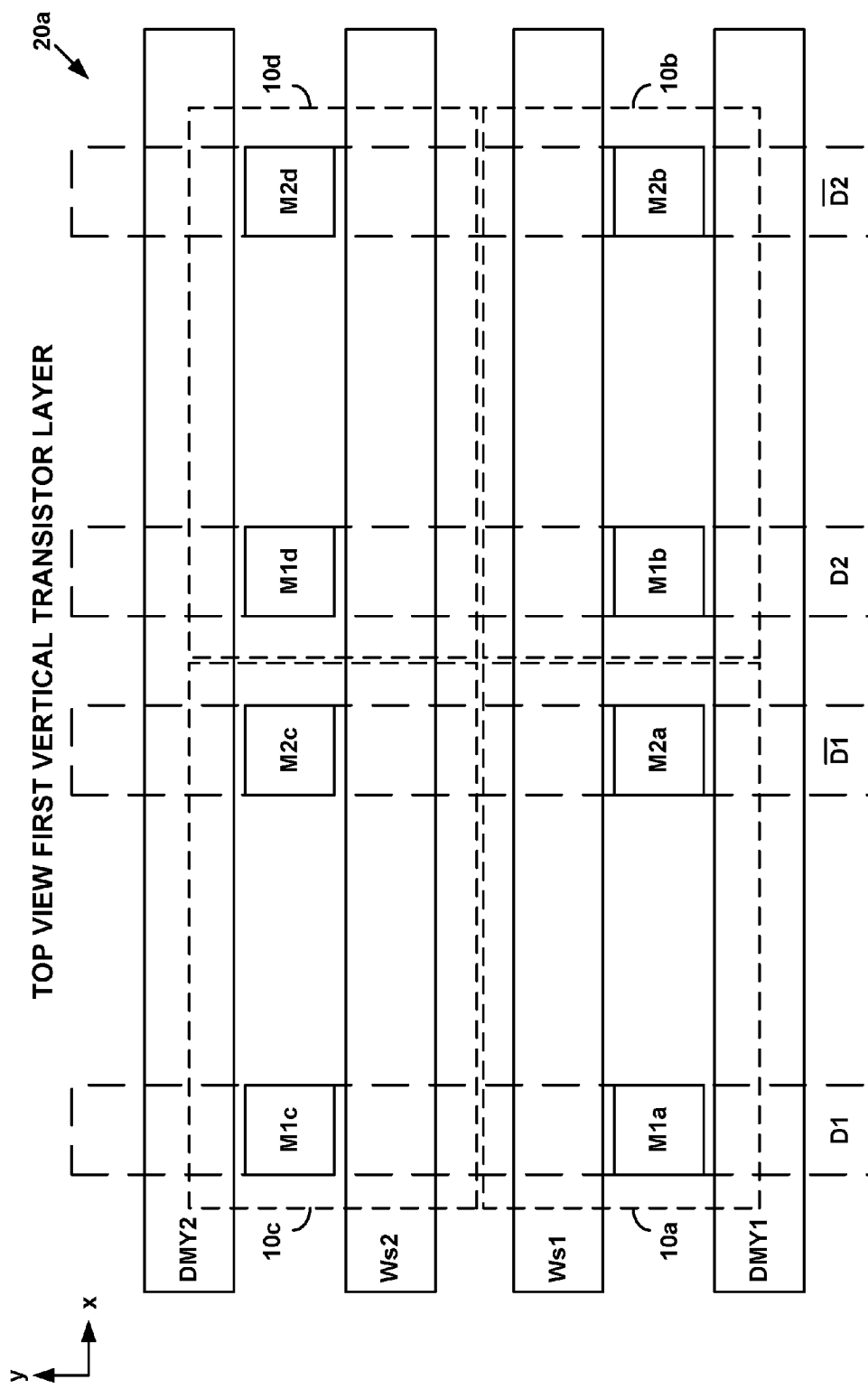
FIGS. 2A-2D are top-level diagrams of example levels of the memory array of FIG. 1B.
Figure 2B:
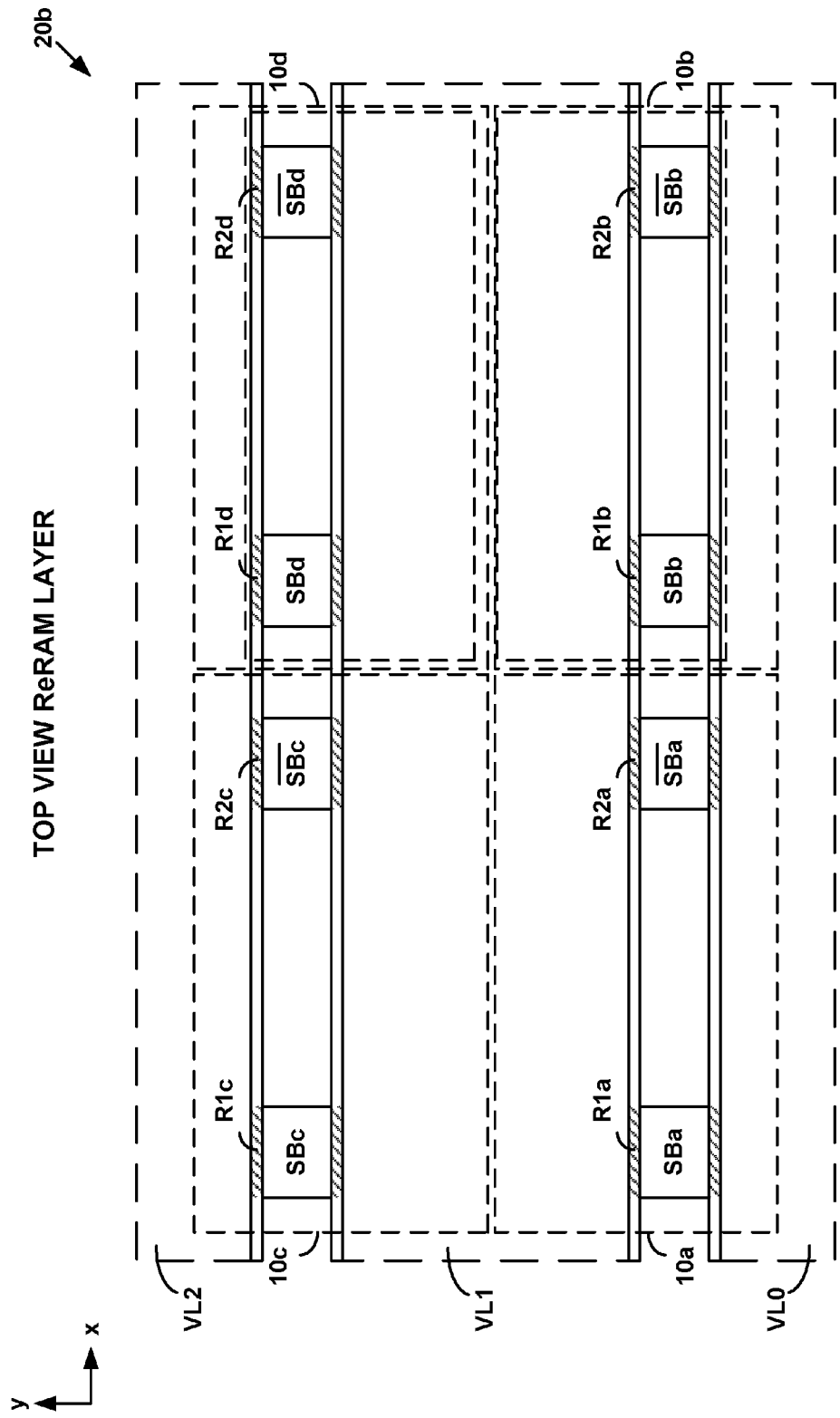
Figure 2C:
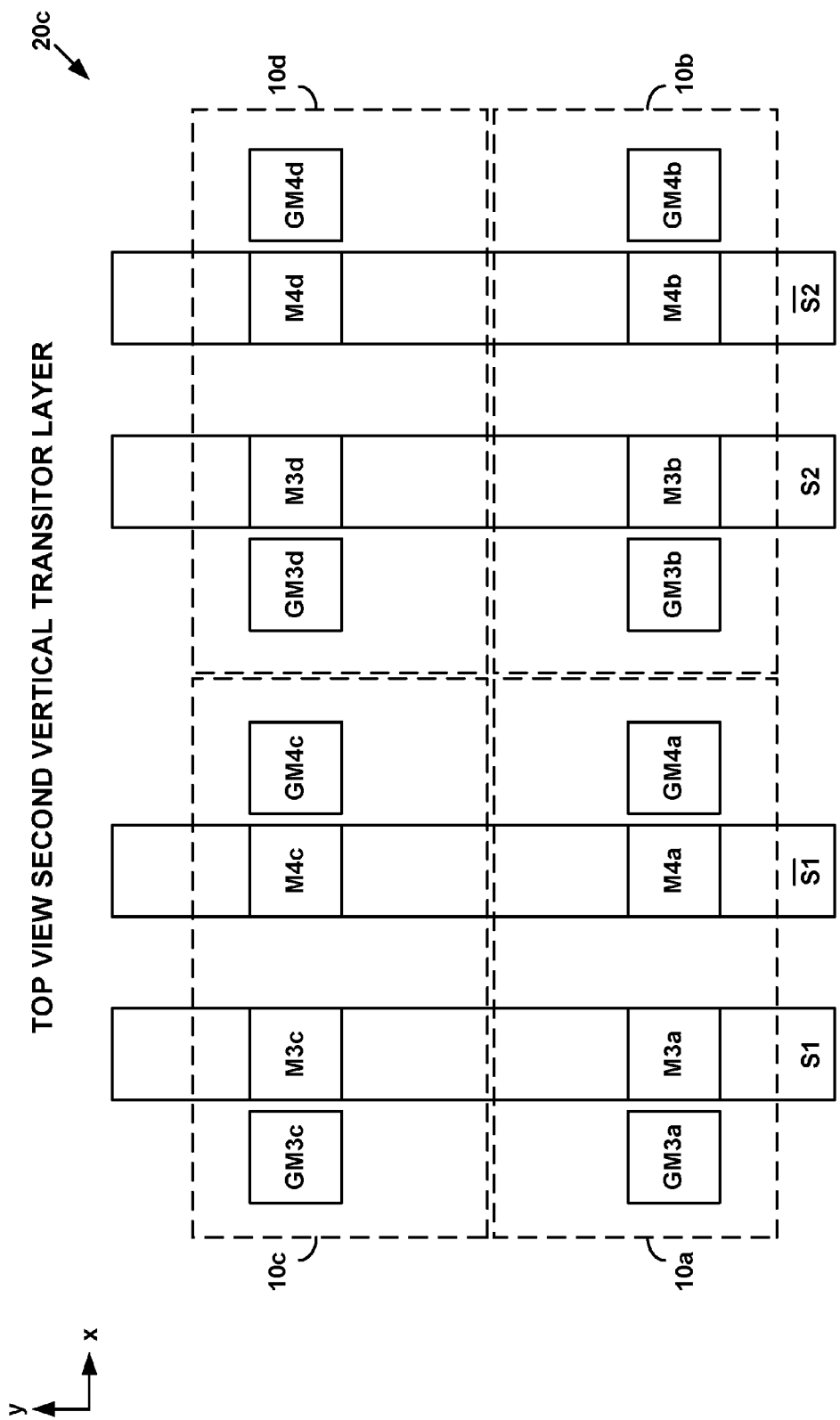
Figure 2D:
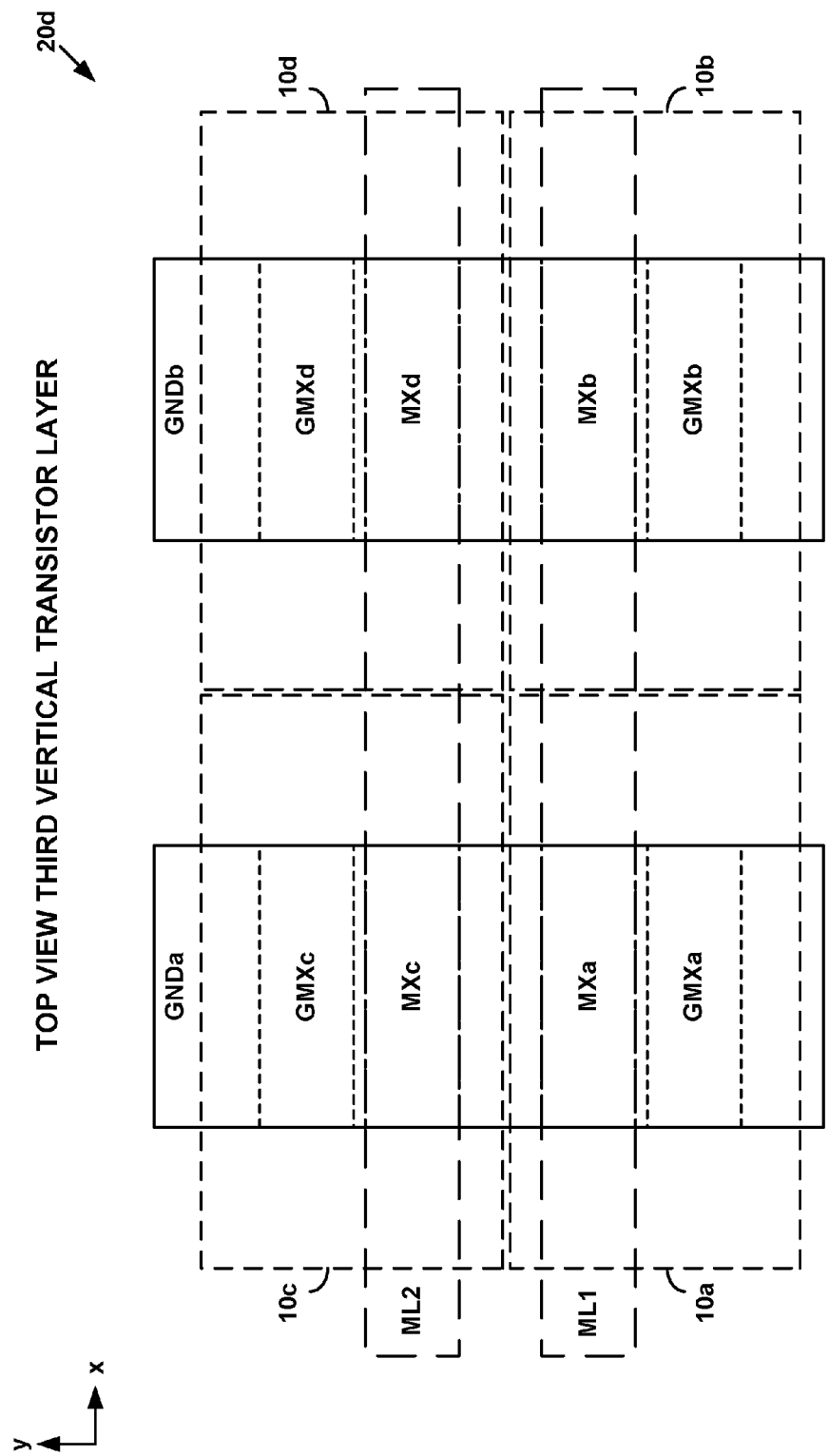
Figure 3A:
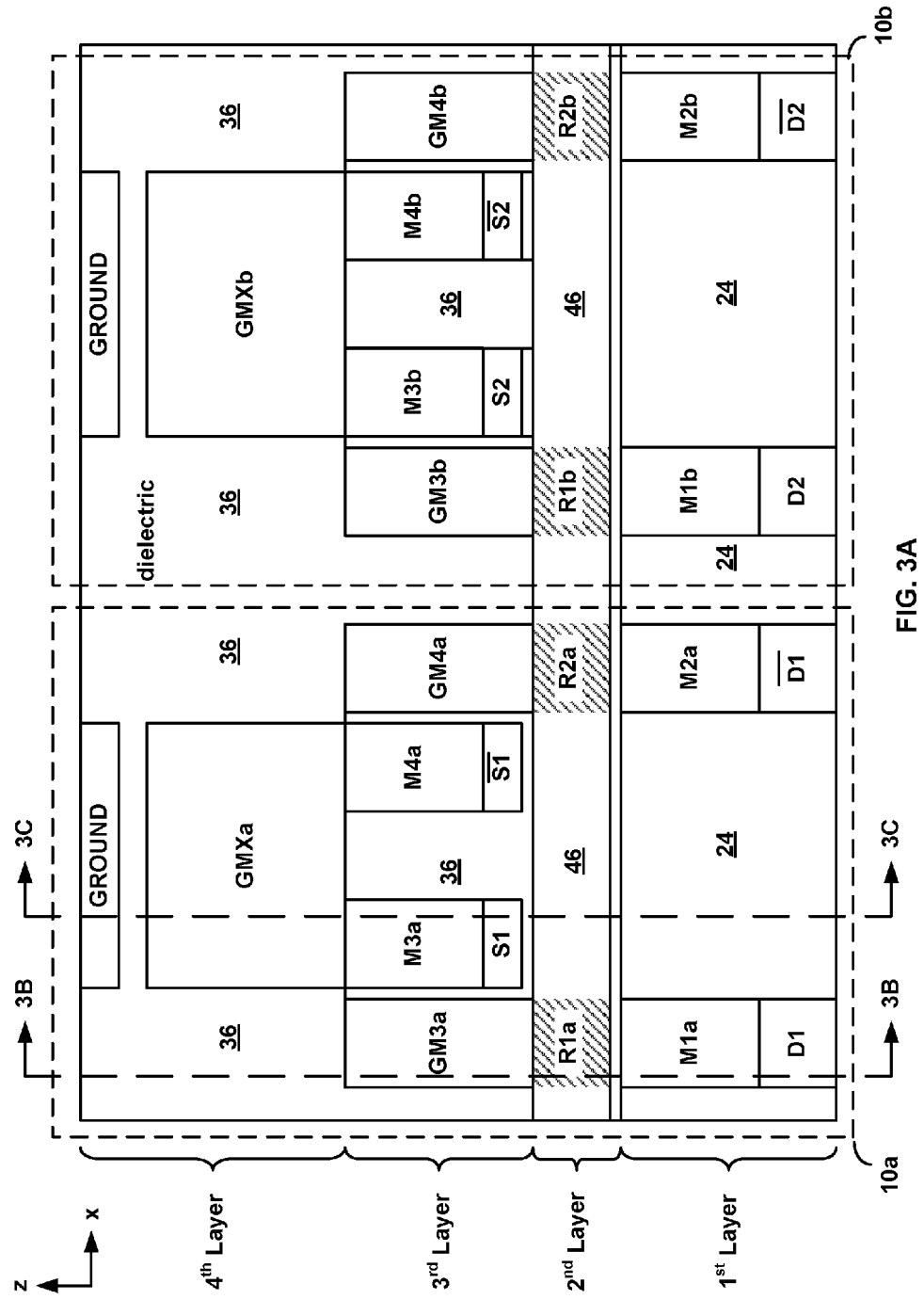
FIGS. 3A-3C are perspective views of an example embodiment of the memory array of FIG. 1B.
Figure 3B:
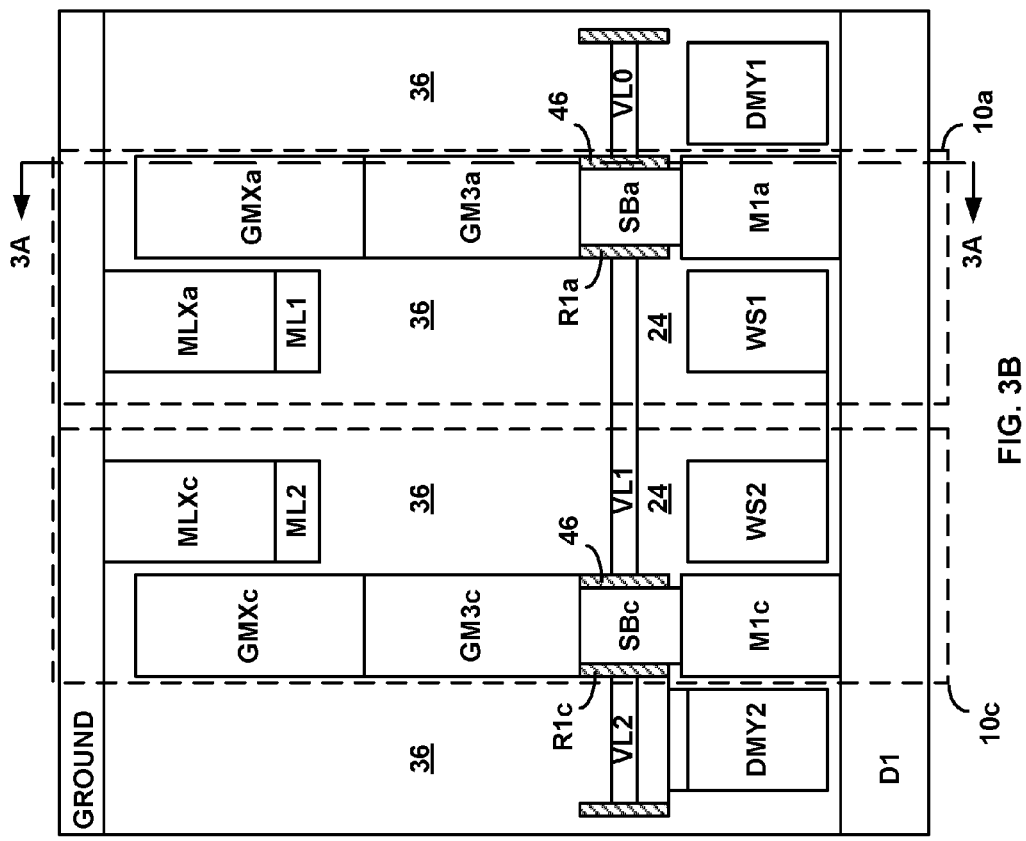
Figure 3C:
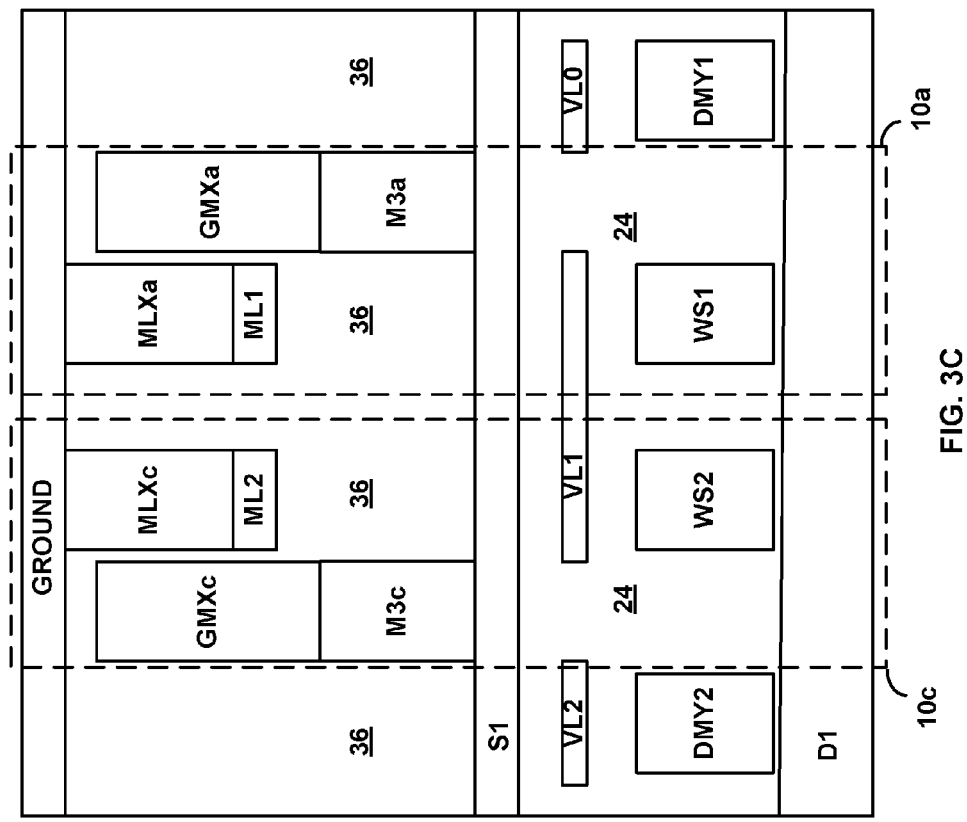
Figure 3C:
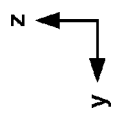

FIGS. 2A-2D illustrate an example embodiment of ReRAM CAM memory cell array 20 of FIG. 1B, which includes three layers of Vertical Transistors, and one ReRAM layer. FIGS. 3A-3C illustrate side-elevation views of the example embodiment of FIGS. 2A-2D. In particular, FIG. 2A illustrates a top view of a first Vertical Transistor layer 20a of ReRAM CAM memory cell array 20, FIG. 2B illustrates a top view of a ReRAM layer 20b of ReRAM CAM memory cell array 20, FIG. 2C illustrates a top view of a second Vertical Transistor layer 20c of ReRAM CAM memory cell array 20, and FIG. 2D illustrates a top view of a third Vertical Transistor layer 20d of ReRAM CAM memory cell array 20.

As illustrated in FIG. 3A, ReRAM layer 20b is disposed above (e.g., vertically above along a z-axis) first Vertical Transistor layer 20a, second Vertical Transistor layer 20c is disposed above ReRAM layer 20b, and third Vertical Transistor layer 20d is disposed above second Vertical Transistor layer 20c.

As shown in FIG. 2A, first bit lines D1, $\overline{D1}$ and second bit lines D2, $\overline{D2}$, are disposed in parallel along a first axis (e.g., an x-axis), and first word select line WS1 and second word select line WS2 are disposed in parallel along a second axis (e.g., a y-axis) substantially perpendicular to the first axis. Dummy word select lines DMY1 and DMY2 are disposed in parallel on either side of first word select line WS1 and second word select line WS2, respectively.

As shown in FIGS. 2A and FIGS. 3A-3C, Vertical Transistors M1a and M1c are disposed on and make conductive contact to first bit line D1, Vertical Transistors M2a and M2c are disposed on and make conductive contact to first complementary bit line $\overline{D1}$, Vertical Transistors M1b and M1d are disposed on and make conductive contact to second bit line D2, and Vertical Transistors M2b and M2d are disposed on and make conductive contact to second complementary bit line $\overline{D2}$. Vertical Transistors M1a, M2a, M1b and M2b are disposed between first word select line WS1 and dummy word select line DMY1, and Vertical Transistors M1c, M2c, M1d and M2d are disposed between second word select line WS2 and dummy word select line DMY2.

Although Vertical Transistors M1a, M2a, M1b, M2b, M1c, M2c, M1d and M2d are shown as having a square cross-sectional shape, persons of ordinary skill in the art will understand that Vertical Transistors M1a, M2a, M1b, M2b, M1c, M2c, M1d and M2d may have rectangular, elliptical, or other shapes.

As shown in FIG. 2B and FIGS. 3A-3C, read/write lines VL0, VL1 and VL2 are disposed in parallel along the second (y) axis. Nodes SBa, $\overline{SBa}$, SBb and $\overline{SBb}$ are disposed between read/write lines VL0 and VL1 and nodes SBc, $\overline{SBc}$, SBd and $\overline{SBd}$ are disposed between read/write lines VL1 and VL2. In addition, nodes SBa, $\overline{SBa}$, SBb and $\overline{SBb}$ are disposed on and make conductive contact to Vertical Transistors M1a, M2a, M1b and M2b, respectively, and nodes SBc, $\overline{SBc}$, SBd and $\overline{SBd}$ are disposed on and make conductive contact to Vertical Transistors M1c, M2c, M1d and M2d, respectively.

First search line S1, first complementary search line $\overline{S1}$, second search line S2 and second complementary search line $\overline{S2}$ are disposed in parallel along the first (x) axis. Vertical Transistors M3a and M3c are disposed on and make conductive contact to first search line S1, Vertical Transistors M4a and M4c are disposed on and make conductive contact to first complementary search line $\overline{S1}$, Vertical Transistors M3b and M3d are disposed on and make conductive contact to second search line S2, and Vertical Transistors M4b and M4d are disposed on and make conductive contact to second complementary Search line $\overline{S2}$. Gate terminal GM3a, GM4a, GM3b and GM4b are disposed on and make conductive contact to nodes SBa, $\overline{SBa}$, SBb and $\overline{SBb}$, respectively (FIG. 2B), and gate terminals GM3c, GM4c, GM3d and GM4d are disposed on and make conductive contact to nodes SBc, $\overline{SBc}$, SBd and $\overline{SBd}$, respectively (FIG. 2B).

Although Vertical Transistors M3a, M4a, M3b, M4b, M3c, M4c, M3d and M4d are shown as having a square cross-sectional shape, persons of ordinary skill in the art will understand that Vertical Transistors M3a, M4a, M3b, M4b, M3c, M4c, M3d and M2d may have rectangular, elliptical, or other shapes.

As shown in FIG. 2D and FIGS. 3A-3C, first match line ML1 and second match line ML2 are disposed in parallel along the second (y) axis, and ground lines GNDa and GNDb are disposed in parallel along the first (x) axis. Vertical Transistors MXa and MXb are disposed on and make conductive contact to first match line ML1, and Vertical Transistors MXc and MXd are disposed on and make conductive contact to second match line ML2. Gate terminals GMXa and GMXc are disposed under ground line GNDa, and gate terminals GMXb and GMXd are disposed under ground line GNDb. Gate terminal GMXa is disposed on and makes conductive contact to Vertical Transistors M3a and M4a, gate terminal GMXb is disposed on and makes conductive contact to Vertical Transistors M3b and M4b, gate terminal GMXc is disposed on and makes conductive contact to Vertical Transistors M3c and M4c, and gate terminal GMXd is disposed on and makes conductive contact to Vertical Transistors M3d and M4d.

Although Vertical Transistors MXa, MXb, MXc and MXd are shown as having a rectangular cross-sectional shape, persons of ordinary skill in the art will understand that Vertical Transistors MXa, MXb, MXc and MXd may have other shapes.

In the example embodiment of ReRAM CAM memory cell array 20 of FIGS. 2A-2D and FIGS. 3A-3C, each of first bit lines D1, $\overline{D1}$, second bit lines D2, D2, first search lines, second search lines S1, $\overline{S1}$, second search lines S2, $\overline{S2}$, first and second match lines ML1 and ML2, and first and second word select lines WS1 and WS2 has a width "F," which may be the minimum feature size of the device. Thus, each of ReRAM CAM memory cells 10a, 10b, 10c and 10d occupies an area $A_{cell}=18F^2$.

In some embodiments, it may be desirable to increase the width of Vertical Transistors M1 and M2 (e.g., M1a, M2a, M1b, M2b, . . . , M1d, M2d) to increase the drive current capability for write operations on reversible resistance-switching elements R1 and R2 (e.g., R1a, R2a, R1b, R2b, . . . , R1d, R2d). For example, in some embodiments, Vertical Transistors M1 and M2 may have a width up to 4F. In such embodiments, each of ReRAM CAM memory cells 10a, 10b, 10c and 10d occupies an area $A_{cell}=36F^2$. Thus, in various embodiments, each of ReRAM CAM memory cells 10a, 10b, 10c and 10d occupies an area $A_{cell}$ of between $18F^2$ and $36F^2$.

Each of first bit lines D1, $\overline{D1}$ and second bit lines D2, $\overline{D2}$ is formed above a substrate (not shown), and includes a conductor such as tungsten or other similar conductive material, and optionally may include an adhesion layer (not shown), such as titanium nitride or other similar adhesion layer material. A dielectric material 24 or 36, such as SiO₂ or other similar dielectric material is disposed between adjacent first bit lines D1, $\overline{D1}$ and second bit lines D2, $\overline{D2}$. Persons of ordinary skill in the art will understand that other materials may be used.

Each of word select lines WS1 and WS2, and dummy lines DMY1 and DMY2 is formed above a substrate (not shown), and includes a conductor such as tungsten or other similar conductive material, and optionally may include an adhesion layer (not shown), such as titanium nitride or other similar adhesion layer material. A dielectric material 24 or 36, such as SiO₂ or other similar dielectric material is disposed between adjacent word select lines WS1 and WS2, and dummy lines DMY1 and DMY2. Persons of ordinary skill in the art will understand that other materials may be used.

Each of read/write lines VL0, VL1, VL2 is formed above a substrate (not shown), and includes a conductor such as tungsten or other similar conductive material, and optionally may include an adhesion layer (not shown), such as titanium nitride or other similar adhesion layer material. Alternatively, the lines VL0, VL1, VL2 may comprise a single layer of titanium nitride. A dielectric material 24 or 36, such as SiO₂ or other similar dielectric material is disposed between adjacent read/write lines VL0, VL1, VL2. Persons of ordinary skill in the art will understand that other materials may be used.

Each of first search line S1, first complementary search line $\overline{S1}$, second search line S2 and second complementary search line $\overline{S2}$ is formed above a substrate (not shown), and includes a conductor such as tungsten or other similar conductive material, and optionally may include an adhesion layer (not shown), such as titanium nitride or other similar adhesion layer material. A dielectric material 24 or 36, such as SiO₂ or other similar dielectric material is disposed between adjacent first complementary search line $\overline{S1}$, second search line S2 and second complementary search line $\overline{S2}$. Persons of ordinary skill in the art will understand that other materials may be used.

Each of first and second match lines ML1 and ML2 is formed above a substrate (not shown), and includes a conductor such as tungsten or other similar conductive material, and optionally may include an adhesion layer (not shown), such as titanium nitride or other similar adhesion layer material. A dielectric material 24 or 36, such as SiO₂ or other similar dielectric material is disposed between adjacent first and second match lines ML1 and ML2. Persons of ordinary skill in the art will understand that other materials may be used.

Each of GROUND lines GNDa and GNDb is formed above a substrate (not shown), and includes a conductor such as tungsten or other similar conductive material, and optionally may include an adhesion layer (not shown), such as titanium nitride or other similar adhesion layer material. A dielectric material 24 or 36, such as SiO₂ or other similar dielectric material is disposed between adjacent GROUND lines GNDa and GNDb. Persons of ordinary skill in the art will understand that other materials may be used.

Figure 3F:
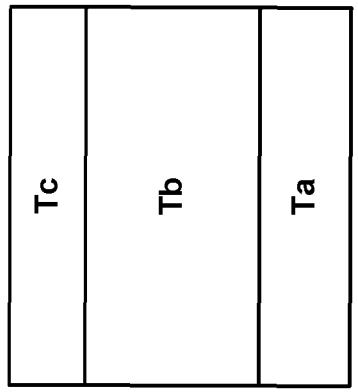
FIGS. 3D-3F are perspective view of example vertical transistors of the memory array of FIG. 1B.
Figure 3E:
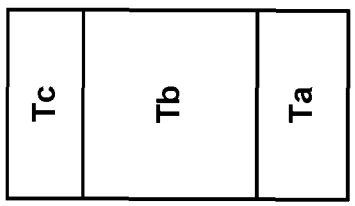
Figure 3D:
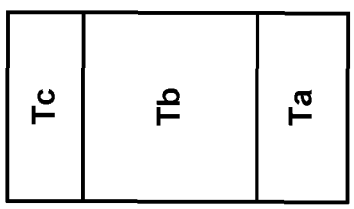

As illustrated in FIGS. 3D-3F, each of Vertical Transistors M1a, M2a, M1b, M2b, M1c, M2c, M1d, M3a, M4a, M3b, M4b, M3c, M4c, M3d, M4d, MLXa, MLXb, MLXc and MLXd may include a first region Ta having a first conductivity type (e.g., n+ polysilicon), a second region Tb having a second conductivity type (e.g., p polysilicon) above first region Ta, and a third region Tc having the first conductivity type (e.g., n+ polysilicon) above second region Tb, to form drain/source, body, and source/drain regions, respectively, of a vertical FET. In some embodiments, each of Vertical Transistors M1a, M2a, M1b, M2b, M1c, M2c, M1d, M3a, M4a, M3b, M4b, M3c, M4c, M3d, M4d, MLXa, MLXb, MLXc and MLXd may have a total height (e.g., in the z-direction) of about 800 angstroms to about 4000 angstroms, although other dimensions may be used.

In some embodiments, first region Ta may have a height of about 100 angstroms to about 500 angstroms, second region Tb may have a height of about 600 angstroms to about 3000 angstroms, and third region Tc may have a height of about 100 angstroms to about 500 angstroms, although other dimensions may be used. As described in more detail below, Vertical Transistors M1a, M2a, M1b, M2b, M1c, M2c, M1d, M3a, M4a, M3b, M4b, M3c, M4c, M3d, M4d, MLXa, MLXb, MLXc and MLXd may be formed by depositing semiconductor material, doping the semiconductor material to form drain/source, body, and source/drain regions, and then etching the semiconductor material to form Vertical Transistors M1a, M2a, M1b, M2b, M1c, M2c, M1d, M3a, M4a, M3b, M4b, M3c, M4c, M3d, M4d, MLXa, MLXb, MLXc and MLXd.

Persons of ordinary skill in the art will understand that Vertical Transistors M1a, M2a, M1b, M2b, M1c, M2c, M1d, M3a, M4a, M3b, M4b, M3c, M4c, M3d, M4d, MLXa, MLXb, MLXc and MLXd also may be formed using layer-transfer techniques that provide a single-crystal layer. In addition, persons of ordinary skill in the art will understand that Vertical Transistors M1a, M2a, M1b, M2b, M1c, M2c, M1d, M3a, M4a, M3b, M4b, M3c, M4c, M3d, M4d, MLXa, MLXb, MLXc and MLXd alternatively may be doped p+/n/p+, or may be doped with a single type of dopant to produce a junctionless-FET. Vertical Transistors M1a, M2a, M1b, M2b, M1c, M2c, M1d, M3a, M4a, M3b, M4b, M3c, M4c, M3d, M4d, MLXa, MLXb, MLXc and MLXd may include silicon, germanium, silicon-germanium alloys, or other similar semiconductor materials. In addition, Vertical Transistors M1a, M2a, M1b, M2b, M1c, M2c, M1d, M3a, M4a, M3b, M4b, M3c, M4c, M3d, M4d, MLXa, MLXb, MLXc and MLXd may include wide band-gap semiconductor materials, such as ZnO, InGaZnO, or SiC, which may provide a high breakdown voltage, and typically may be used to provide junctionless FETs.

A gate dielectric layer 36, e.g., $SiO_2$, $SiN_x$, or other similar dielectric material, is disposed on sidewalls of vertical transistors M1a, M2a, M1b, M2b, M1c, M2c, M1d, M3a, M4a, M3b, M4b, M3c, M4c, M3d, M4d, MLXa, MLXb, MLXc and MLXd, separating gate terminals GM1a, GM2a, GM1b, GM2b, GM1c, GM2c, GM1d, GM2d, GM3a, GM4a, GM3b, GM4b, GM3c, GM4c, GM3d, GM4d, GMXa, GMXb, GMXc and GMXd from adjacent vertical transistors M1a, M2a, M1b, M2b, M1c, M2c, M1d, M3a, M4a, M3b, M4b, M3c, M4c, M3d, M4d, MLXa, MLXb, MLXc and MLXd, respectively.

In some embodiments, gate dielectric layer 36 may have a thickness of about 15 angstroms to about 100 angstroms, although other thicknesses may be used. Gate terminals GM1a, GM2a, GM1b, GM2b, GM1c, GM2c, GM1d, GM2d, GM3a, GM4a, GM3b, GM4b, GM3c, GM4c, GM3d, GM4d, GMXa, GMXb, GMXc and GMXd may be a metal, such as titanium nitride or other similar metal, a highly-doped semiconductor, such as n+ polysilicon, p+ polysilicon, or other similar conductive material. In some embodiments, each of gate terminals GM1a, GM2a, GM1b, GM2b, GM1c, GM2c, GM1d, GM2d, GM3a, GM4a, GM3b, GM4b, GM3c, GM4c, GM3d, GM4d, GMXa, GMXb, GMXc and GMXd may have a thickness that may be the minimum dimension F minus two times the thickness of the gate dielectric, although other thicknesses may be used.

Gate terminals GM1a, GM2a, GM1b and GM2b are those portions of first word selected line WS1 adjacent Vertical Transistors M1a, M2a, M1b and M2b, respectively. Likewise, gate terminals GM1c, GM2c, GM1d and GM2d are those portions of second word selected line WS2 adjacent Vertical Transistors M1c, M2c, M1d and M2d, respectively.

A resistivity-switching material layer 46 is formed on sidewalls of nodes SBa, $\overline{SBa}$, SBb, $\overline{SBb}$, SBc, $\overline{SBc}$, SBd and $\overline{SBd}$. Resistivity-switching material layer 46 may be a metal oxide, solid electrolyte, phase-change material, magnetic material, a carbon material, such as carbon nanotubes, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN. In some embodiments, resistivity-switching material layer 46 may have a thickness of about 8 angstroms to about 80 angstroms, although other thicknesses may be used. Persons of ordinary skill in the art will understand that other metal oxide materials and other resistivity-switching materials may be used. CS layer 48 is formed above resistivity-switching material layer 46.

The portions of resistivity-switching material layer 46 adjacent each of nodes SBa, $\overline{SBa}$, SBb, $\overline{SBb}$, SBc, $\overline{SBc}$, SBd and $\overline{SBd}$ is illustrated using cross-hatching to represent resistivity-switching elements R1a, R2a, R1b, R2b, R1c, R2c, R1d and R2d, respectively. Persons of ordinary skill in the art will understand that resistivity-switching material layer 46 may be deposited and remain as a blanket layer, such that resistivity-switching elements R1a, R2a, R1b, R2b, R1c, R2c, R1d and R2d, are not distinct elements, but instead are portions of resistivity-switching material layer 46. Alternatively, resistivity-switching material may be selectively formed as individual resistivity-switching elements R1a, R2a, R1b, R2b, R1c, R2c, R1d and R2d. For example, resistivity-switching material layer 46 may be deposited as a blanket layer and subsequently etched to form individual resistivity-switching elements R1a, R2a, R1b, R2b, R1c, R2c, R1d and R2d. Persons of ordinary skill in the art will understand that other techniques may be used to selectively form individual resistivity-switching elements R1a, R2a, R1b, R2b, R1c, R2c, R1d and R2d.

Referring now to FIGS. 4A1-4V3, an example method of forming a ReRAM CAM memory cell array is described. In particular, FIGS. 4A1-4V3 illustrate an example method of forming a ReRAM CAM memory cell array, such as ReRAM CAM memory cell array 20 of FIGS. 2A-3F. With reference to FIGS. 4A1-4A2, substrate 100 is shown as having already undergone several processing steps. Substrate 100 may be any suitable substrate such as a silicon, germanium, silicon-germanium, undoped, doped, bulk, silicon-on-insulator ("SOT") or other substrate with or without additional circuitry. For example, substrate 100 may include one or more n-well or p-well regions (not shown). Isolation layer 102 is formed above substrate 100. In some embodiments, isolation layer 102 may be a layer of silicon dioxide, silicon nitride, silicon oxynitride or any other suitable insulating layer.

Following formation of isolation layer 102, a conductive layer 20 is deposited over isolation layer 102. Conductive layer 20 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 20 may comprise between about 200 and about 2500 angstroms of tungsten. Other conductive layer materials and/or thicknesses may be used. In some embodiments, an adhesion layer (not shown), such as titanium nitride or other similar adhesion layer material, may be disposed between isolation layer 102 and conductive layer 20, and/or between the conductive layer 20 and subsequent Vertical Transistor layers.

Persons of ordinary skill in the art will understand that adhesion layers may be formed by PVD or another method on conductive layers, such as conductive layer 20. For example, adhesion layers may be between about 20 and about 500 angstroms, and in some embodiments about 100 angstroms, of titanium nitride or another suitable adhesion layer such as tantalum nitride, tungsten nitride, tungsten, molybdenum, combinations of one or more adhesion layers, or the like. Other adhesion layer materials and/or thicknesses may be employed. To simplify the figures, adhesion layers have not been depicted in FIGS. 4A1-4V3. Persons of ordinary skill in the art will understand that such adhesion layers may be used.

Following formation of conductive layer 20, deposition of the semiconductor material used to form Vertical Transistor transistors M1a, M2a, M1b, M2b . . . , M1h and M2h. In some embodiments, each Vertical Transistor is formed from a polycrystalline semiconductor material such as polysilicon, a polycrystalline silicon-germanium alloy, polygermanium or any other suitable material. Alternatively, the Vertical Transistors may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, each Vertical Transistor may include a first region (e.g., n+ polysilicon), a second region (e.g., p polysilicon) and a third region (e.g., n+ polysilicon) to form drain/source, body, and source/drain regions, respectively, of a vertical FET. For example, following formation of conductive layer 20, a heavily doped n+ silicon layer 32a may be deposited on conductive layer 20. In some embodiments, n+ silicon layer 32a is in an amorphous state as deposited. In other embodiments, n+ silicon layer 32a is in a polycrystalline state as deposited. CVD or another suitable process may be employed to deposit n+ silicon layer 32a.

In at least one embodiment, n+ silicon layer 32a may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ silicon layer 32a may be doped in situ, for example, by flowing a donor gas during deposition. Other doping methods may be used (e.g., implantation).

After deposition of n+ silicon layer 32a, a doped p-type silicon layer 32b may be formed over n+ silicon layer 32a. P-type silicon may be either deposited and doped by ion implantation or may be doped in situ during deposition to form a p-type silicon layer 32b. For example, an intrinsic silicon layer may be deposited on n+ silicon layer 32a, and a blanket p-type implant may be employed to implant boron a predetermined depth within the intrinsic silicon layer. Example implantable molecular ions include $BF_2$, $BF_3$, B and the like. In some embodiments, an implant dose of about $1\text{-}10\times10^{13}$ ions/cm$^2$ may be employed. Other implant species and/or doses may be used. Further, in some embodiments, a diffusion process may be employed. In at least one embodiment, the resultant p-type silicon layer 32b has a thickness of from about 800 to about 4000 angstroms, although other p-type silicon layer sizes may be used.

Following formation of p-type silicon layer 32b, a heavily doped n+ silicon layer 32c is deposited on p-type silicon layer 32b. In some embodiments, n+ silicon layer 32c is in an amorphous state as deposited. In other embodiments, n+ silicon layer 32c is in a polycrystalline state as deposited. CVD or another suitable process may be employed to deposit n+ silicon layer 32c.

In at least one embodiment, n+ silicon layer 32c may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ silicon layer 32c may be doped in situ, for example, by flowing a donor gas during deposition. Other doping methods may be used (e.g., implantation). Persons of ordinary skill in the art will understand that silicon layers 32a, 32b and 32c alternatively may be doped p+/n/p+, respectively, or may be doped with a single type of dopant to produce junctionless-FETs.

In a first masking step, silicon layers 32a, 32b and 32c, and conductive layer 20 are patterned and etched to form etched rows 50. For example, silicon layers 32a, 32b and 32c, and conductive layer 20 may be patterned and etched using conventional lithography techniques, with a soft or hard mask, and wet or dry etch processing. In at least one embodiment, silicon layers 32a, 32b and 32c and conductive layer 20 are patterned and etched to form substantially parallel, substantially co-planar first bit line D1, first complementary bit line $\overline{D1}$, second bit line D2 and second complementary bit line $\overline{D2}$, with patterned and etched silicon layers 32a, 32b and 32c disposed above the bit lines. Example widths for first bit line D1, first complementary bit line $\overline{D1}$, second bit line D2 and second complementary bit line $\overline{D2}$ and/or spacings between bit lines range between about 100 and about 2500 angstroms, although other conductor widths and/or spacings may be used.

Silicon layers 32a, 32b and 32c, and conductive layer 20 may be patterned and etched in a single pattern/etch procedure or using separate pattern/etch steps. For example, photoresist may be deposited, patterned using standard photolithography techniques, layers 32c-32a, and 20 may be etched, and then the photoresist may be removed. Alternatively, a hard mask of some other material, for example silicon dioxide, may be formed on top of conductive contact layer 34, with bottom antireflective coating ("BARC") on top, then patterned and etched. Similarly, dielectric antireflective coating ("DARC") and/or amorphous carbon film (e.g., the Advanced Patterning Film from Applied Materials, Santa Clara, Calif.) may be used as a hard mask.

Any suitable masking and etching process may be used to form etched rows 50. For example, layers 32c-32a, and 20 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 50 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

After first bit line D1, first complementary bit line $\overline{D1}$, second bit line D2 and second complementary bit line $\overline{D2}$ have been formed, a dielectric material layer 24 is formed over substrate 100 to fill the voids between first bit line D1, first complementary bit line $\overline{D1}$, second bit line D2 and second complementary bit line $\overline{D2}$. For example, approximately 3000-7000 angstroms of silicon dioxide may be deposited on the substrate 100 and planarized using chemical mechanical polishing or an etchback process to form a planar surface 104, resulting in the structure shown in FIGS. 4A1-4A2. Planar surface 104 includes exposed top surfaces of silicon material 32c separated by dielectric material 24. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In other embodiments, first bit line D1, first complementary bit line $\overline{D1}$, second bit line D2 and second complementary bit line $\overline{D2}$ may be formed using a damascene process in which dielectric material layer 24 is formed, patterned and etched to create openings or voids for first bit line D1, first complementary bit line $\overline{D1}$, second bit line D2 and second complementary bit line $\overline{D2}$ and silicon layers 32a, 32b and 32c. The openings or voids then may be filled with conductive layer 20 (and/or a conductive seed, conductive fill and/or barrier layer if needed) and silicon layers 32a, 32b and 32c. Silicon material 32c then may be planarized to form planar surface 104. In such an embodiment, conductive layer 20 will line the bottom and sidewalls of each opening or void.

Following planarization, in a second masking step, the structure shown in FIGS. 4A1-4A2 is patterned and etched in a direction along the y-axis to form Vertical Transistors M1a, M2a, M1b, M2b . . . , M1h and M2h. For example, etched rows 50 may be patterned and etched using conventional lithography techniques, with a soft or hard mask, and wet or dry etch processing. In at least one embodiment, etched rows 50 are patterned and etched to form Vertical Transistors M1a, M2a, M1b, M2b . . . , M1h and M2, resulting in the structure shown in FIGS. 4B1-4B2

A gate dielectric layer 36 is deposited conformally over Vertical Transistors M1a, M2a, M1b, M2b . . . , M1h and M2h. For example, between about 15 to about 100 angstroms of silicon dioxide may be deposited, resulting in the structure illustrated in FIGS. 4C1-4C2. Other dielectric materials such as silicon nitride, silicon oxynitride, low K dielectrics, etc., and/or other dielectric material layer thicknesses may be used.

Gate electrode material 38 is deposited over rows 50 and gate dielectric layer 36 to fill the voids between rows 50. For example, approximately 100 to 2000 angstroms of such as titanium nitride or other similar metal, a highly-doped semiconductor, such as n+ polysilicon, p+ polysilicon, or other similar conductive material may be deposited. The as-deposited gate electrode material 38 is subsequently etched back to recess the gate electrodes below the top surface of gate dielectric layer 36, resulting in the structure shown in FIGS. 4D1-4D2. The gate material 38 may be recessed between 100 and 500 Angstroms from the top of gate dielectric layer 36. Dry etching, chemical-mechanical polishing, or a combination of the two may be used to planarize and recess gate material 38.

A dielectric material layer 40 is deposited over the recessed gate electrode material 38. For example, approximately 100 to 800 angstroms of silicon dioxide may be deposited and planarized using chemical mechanical polishing or an etch-back process to form a planar surface 106, resulting in the structure illustrated in FIGS. 4E1 4E2.

A stack of a dielectric layer 42, a conductive layer 44 and a dielectric layer 48 are formed on planar surface 106, resulting in the structure illustrated in FIGS. 4F1-4F2. For example, dielectric layer 42 may be approximately 3000-7000 angstroms of silicon dioxide. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Conductive layer 44 may include any suitable conductive material such as titanium nitride, tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 44 may comprise between about 50 and 200 Angstroms of titanium nitride. In another embodiment, conductive layer 44 may comprise between about 200 and about 2500 angstroms of tungsten. In this alternative embodiment, an optional conductive adhesion layer (not shown), such as titanium nitride, tantalum nitride, or other conductive material may be deposited prior to the Tungsten deposition. This adhesion layer may be, for example, between 20 and 250 Angstroms thick. Other conductive layer materials and/or thicknesses may be used.

Dielectric layer 48 may be approximately 3000-7000 angstroms of silicon dioxide. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

In a third masking step, dielectric layer 48, conductive layer 44 and dielectric layer 42, are patterned and etched to form etched read/write lines VL0, VL1, . . . , VL4, resulting in the structure shown in FIGS. 4G1-4G2. Dielectric layer 48, conductive layer 44 and dielectric layer 42 may be patterned and etched in a single pattern/etch procedure or using separate pattern/etch steps. For example, photoresist may be deposited, patterned using standard photolithography techniques, layers 48, 44 and 42 may be etched, and then the photoresist may be removed. Alternatively, a hard mask of some other material, for example silicon dioxide, may be formed on top of dielectric layer 48, with BARC on top, then patterned and etched. Similarly, DARC and/or amorphous carbon film (e.g., the Advanced Patterning Film from Applied Materials, Santa Clara, Calif.) may be used as a hard mask.

Any suitable masking and etching process may be used to form etched read/write lines VL0, VL1, . . . , VL4. For example, layers 48, 44 and 42 may be patterned with about 1 to about 1.5 micron, more preferably about 1.2 to about 1.4 micron, of photoresist PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, layers 48, 44 and 42 may be cleaned using a dilute hydrofluoric/sulfuric acid clean. Such cleaning may be performed in any suitable cleaning tool, such as a Raider tool. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

A resistivity-switching material layer 46 is deposited over substrate 100, and an anisotropic etch is used to remove lateral portions of resistivity-switching material layer 46 and gate dielectric layer 36, leaving only sidewall portions of resistivity-switching material layer 46 on the sides of layers 48, 44 and 42 in voids 52, resulting in the structure shown in FIGS. 4H1-4H2. Resistivity-switching material layer 46 may be a metal oxide, solid electrolyte, phase-change material, magnetic material, or other similar resistivity-switching material. Various metal oxides can be used, such as transition metal-oxides. Examples of metal-oxides include, but are not limited to, NiO, $Nb_2O_5$, $TiO_2$, $HfO_2$, $Al_2O_3$, $MgO_x$, $CrO_2$, VO, BN, $TaO_2$, $Ta_2O_3$, and AlN. Resistivity-switching material layer 46 may be deposited by any suitable method (e.g., CVD, PVD, etc.). In at least one embodiment, resistivity-switching material layer 46 may be between about 8 and about 80 angstroms of $HfO_2$. Persons of ordinary skill in the art will understand that other metal oxide materials, other resistivity-switching materials, thicknesses and other deposition techniques may be used.

Conductive material layer 54 is deposited over substrate 100 to fill voids 52. For example, approximately 100 to 2000 angstroms of such as titanium nitride or other similar metal, a highly-doped semiconductor, such as n+ polysilicon, p+ polysilicon, or other similar conductive material may be deposited. In a fourth masking step, using the same mask used to form to form first bit line D1, first complementary bit line $\overline{D1}$, second bit line D2 and second complementary bit line $\overline{D2}$, conductive material layer 54 is patterned and etched to form nodes SBa, $\overline{SBa}$, . . . , node $\overline{SBh}$, and a dielectric material layer 56 is formed over substrate 100 to fill the voids between etched conductive material layer 54. For example, approximately 3000 7000 angstroms of silicon dioxide may be deposited on the substrate 100 and planarized using chemical mechanical polishing or an etchback process to form a planar surface 108, resulting in the structure shown in FIG. 4I1 FIG. 4I2. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

A layer stack of dielectric layer 58, a conductive layer 60, and the semiconductor material 62 used to form the second Vertical Transistor layer is deposited planar surface 108. For example, the dielectric layer 58 may comprise between about 100 and 300 Angstroms silicon dioxide. Conductive layer 60 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 60 may comprise between about 200 and about 2500 angstroms of tungsten. Other conductive layer materials and/or thicknesses may be used.

In some embodiments, semiconductor material 62 is formed from a polycrystalline semiconductor material such as polysilicon, a polycrystalline silicon-germanium alloy, polygermanium or any other suitable material. Alternatively, semiconductor material 62 may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, semiconductor material 62 may include a first region (e.g., n+ polysilicon), a second region (e.g., p polysilicon) and a third region (e.g., n+ polysilicon) to form drain/source, body, and source/drain regions, respectively, of a vertical FET. For example, following formation of conductive layer 60, a heavily doped n+ silicon layer 62a may be deposited on conductive layer 60. In some embodiments, n+ silicon layer 62a is in an amorphous state as deposited. In other embodiments, n+ silicon layer 62a is in a polycrystalline state as deposited. CVD or another suitable process may be employed to deposit n+ silicon layer 62a.

In at least one embodiment, n+ silicon layer 62a may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ silicon layer 62a may be doped in situ, for example, by flowing a donor gas during deposition. Other doping methods may be used (e.g., implantation).

After deposition of n+ silicon layer 62a, a doped p-type silicon layer 62b may be formed over n+ silicon layer 62a. P-type silicon may be either deposited and doped by ion implantation or may be doped in situ during deposition to form a p-type silicon layer 62b. For example, an intrinsic silicon layer may be deposited on n+ silicon layer 62a, and a blanket p-type implant may be employed to implant boron a predetermined depth within the intrinsic silicon layer. Example implantable molecular ions include BF$_2$, BF$_3$, B and the like. In some embodiments, an implant dose of about 1-10×10$^{13}$ ions/cm$^2$ may be employed. Other implant species and/or doses may be used. Further, in some embodiments, a diffusion process may be employed. In at least one embodiment, the resultant p-type silicon layer 62b has a thickness of from about 800 to about 4000 angstroms, although other p-type silicon layer sizes may be used.

Following formation of p-type silicon layer 62b, a heavily doped n+ silicon layer 62c is deposited on p-type silicon layer 62b. In some embodiments, n+ silicon layer 62c is in an amorphous state as deposited. In other embodiments, n+ silicon layer 62c is in a polycrystalline state as deposited. CVD or another suitable process may be employed to deposit n+ silicon layer 62c.

In at least one embodiment, n+ silicon layer 62c may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ silicon layer 62c may be doped in situ, for example, by flowing a donor gas during deposition. Other doping methods may be used (e.g., implantation). Persons of ordinary skill in the art will understand that silicon layers 62a, 62b and 62c alternatively may be doped p+/n/p+, respectively, or may be doped with a single type of dopant to produce junctionless-FETs.

In a fifth masking step, semiconductor layers 62c, 62b and 62a, conductive layer 60 and dielectric layer 58 are patterned and etched to form etched rows 64, resulting in the structure shown in FIGS. 4J1-4J2. In at least one embodiment, semiconductor layers 62c, 62b and 62a, conductive layer 60 and dielectric layer 58 are patterned and etched to form substantially parallel, substantially co-planar semiconductor layers on first search line S1, first complementary search line $\overline{S1}$, second search line S2 and second complementary search line $\overline{S2}$. Example widths for first search line S1, first complementary search line $\overline{S1}$, second search line S2 and second complementary search line $\overline{S2}$ and/or spacings between the search lines range between about 100 and about 2500 angstroms, although other conductor widths and/or spacings may be used.

Semiconductor layers 62c, 62b and 62a, conductive layer 60 and dielectric layer 58 may be patterned and etched in a single pattern/etch procedure or using separate pattern/etch steps. For example, photoresist may be deposited, patterned using standard photolithography techniques, layers 62c, 62b, 62a, 60 and 58 may be etched, and then the photoresist may be removed. Alternatively, a hard mask of some other material, for example silicon dioxide, may be formed on top of semiconductor layer 62c, with BARC on top, then patterned and etched. Similarly, DARC and/or amorphous carbon film (e.g., the Advanced Patterning Film from Applied Materials, Santa Clara, Calif.) may be used as a hard mask.

Any suitable masking and etching process may be used to form etched rows 64. For example, layers 62c, 62b, 62a, 60 and 58 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 64 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 60 seconds and/or ultra-dilute HF acid (e.g., about 0.4-0.6 wt %) for 60 seconds. Megasonics may or may not be used. Other clean chemistries, times and/or techniques may be employed.

Additional dielectric material 58 is deposited conformally over rows 64 to fill the voids between rows 64. For example, between about 15 to about 100 angstroms of silicon dioxide may be deposited. Other dielectric materials such as silicon nitride, silicon oxynitride, low K dielectrics, etc., and/or other dielectric material layer thicknesses may be used.

An etch is used to remove portions of dielectric material 58 between adjacent pairs of rows 64, leaving only sidewall portions of dielectric material 58 on the sides of rows 64. These sidewall portions of dielectric material 58 form gate dielectric regions of Vertical Transistors M3a, M3b, . . . , M4h. In addition, semiconductor layers 62c, 62b and 62a are etched to form Vertical Transistors M3a, M3b, . . . , M4h, resulting in the structure shown in FIGS. 4K1-K2. For example, a sputter etch or other suitable process may be used to anisotropically etch gate dielectric layer 58. To clear gate dielectric layer 58 from the bottom of the trenches, gate dielectric layer 58 typically may be over-etched somewhat to compensate for variations across a wafer. This may cause the top of the dielectric to recess below the top of semiconductor layer 62c, as shown in FIG. 4K1.

Gate electrode material is deposited over rows 64 and gate dielectric layer 58 to fill the voids between rows 64. Using the same mask used to form etched rows 50 (FIG. 4A1), the gate electrode material is patterned and etched to form rows 66 of gate electrode material. For example, approximately 100 to 2000 angstroms of such as titanium nitride or other similar metal, a highly-doped semiconductor, such as n+ polysilicon, p+ polysilicon, or other similar conductive material may be deposited. A dielectric material layer 68 is deposited over the rows of gate electrode material 66. For example, approximately 100 to 800 angstroms of silicon dioxide may be deposited and planarized using chemical mechanical polishing or an etch-back process to form a planar surface 110, resulting in the structure illustrated in FIGS. 4L1 4L2.

Following planarization, using the same mask used to form Vertical Transistors M1a, M2a, M1b, M2b . . . , M1h and M2h, the structure shown in FIGS. 4L1-4L2 is etched in a direction along the y-axis to form Vertical Transistors M3a, M4a, M3b, M4b . . . , M3h and M4h and corresponding gate terminals GM3a, GM4a, GM3b, GM4b . . . , GM3h and GM4h, respectively. For example, etched rows 64 and gate electrode material 66 may be patterned and etched using conventional lithography techniques, with a soft or hard mask, and wet or dry etch processing. In at least one embodiment, etched rows 64 gate electrode material 66 are patterned and etched to form Vertical Transistors M3a, M4a, M3b, M4b . . . , M3h and M4h, and corresponding gate terminals GM3a, GM4a, GM3b, GM4b . . . , GM3h and GM4h, respectively resulting in the structure shown in FIGS. 4M1-4M2.

As illustrated in FIGS. 4M1-4M2, in this embodiment, gate terminals GM3a, GM4a, GM3b, GM4b . . . , GM3h and GM4h are aligned with drain/source terminals of Vertical Transistors M1a, M2a, M1b, M2b . . . , M1h and M2h, respectively.

A dielectric material layer 70 is deposited over Vertical Transistors M3a, M4a, M3b, M4b . . . , M3h and M4h, and corresponding gate terminals GM3a, GM4a, GM3b, GM4b . . . , GM3h and GM4h, respectively. For example, approximately 100 to 800 angstroms of silicon dioxide may be deposited and planarized using chemical mechanical polishing or an etch-back process to form a planar surface 112, resulting in the structure illustrated in FIGS. 4M1 4M2.

A layer stack of a dielectric layer 72, a conductive layer 74, and the semiconductor material 76 used to form the third Vertical Transistor layer is deposited planar surface 112, resulting in the structure shown in FIGS. 4N1-4N2. For example, dielectric layer 72 may be between about 15 to about 100 angstroms of silicon dioxide. Conductive layer 74 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 74 may comprise between about 200 and about 2500 angstroms of tungsten. Other conductive layer materials and/or thicknesses may be used.

In some embodiments, semiconductor material 76 is formed from a polycrystalline semiconductor material such as polysilicon, a polycrystalline silicon-germanium alloy, polygermanium or any other suitable material. Alternatively, semiconductor material 76 may be formed from a wide band-gap semiconductor material, such as ZnO, InGaZnO, or SiC, which may provide a high breakdown voltage, and typically may be used to provide junctionless FETs. Persons of ordinary skill in the art will understand that other materials may be used.

In some embodiments, semiconductor material 76 may include a first region (e.g., n+ polysilicon), a second region (e.g., p polysilicon) and a third region (e.g., n+ polysilicon) to form drain/source, body, and source/drain regions, respectively, of a vertical FET. For example, following formation of conductive layer 74, a heavily doped n+ silicon layer 76a may be deposited on conductive layer 74. In some embodiments, n+ silicon layer 76a is in an amorphous state as deposited. In other embodiments, n+ silicon layer 76a is in a polycrystalline state as deposited. CVD or another suitable process may be employed to deposit n+ silicon layer 76a.

In at least one embodiment, n+ silicon layer 76a may be formed, for example, from about 100 to about 500 angstroms, of phosphorus or arsenic doped silicon having a doping concentration of about $10^{21}$ cm$^{-3}$. Other layer thicknesses, doping types and/or doping concentrations may be used. N+ silicon layer 76a may be doped in situ, for example, by flowing a donor gas during deposition. Other doping methods may be used (e.g., implantation).

After deposition of n+ silicon layer 76a, a doped p-type silicon layer 76b may be formed over n+ silicon layer 76a. P-type silicon may be either deposited and doped by ion implantation or may be doped in situ during deposition to form a p-type silicon layer 76b. For example, an intrinsic silicon layer may be deposited on n+ silicon layer 76a, and a blanket p-type implant may be employed to implant boron a predetermined depth within the intrinsic silicon layer. Example implantable molecular ions include BF$_2$, BF$_3$, B and the like. In some embodiments, an implant dose of about 1-10×10$^{13}$ ions/cm$^2$ may be employed. Other implant species and/or doses may be used. Further, in some embodiments, a diffusion process may be employed. In at least one embodiment, the resultant p-type silicon layer 76b has a thickness of from about 800 to about 4000 angstroms, although other p-type silicon layer sizes may be used.

Following formation of p-type silicon layer 76b, a heavily doped n+ silicon layer 76c is deposited on p-type silicon layer 76b. In some embodiments, n+ silicon layer 76c is in an amorphous state as deposited. In other embodiments, n+ silicon layer 76c is in a polycrystalline state as deposited. CVD or another suitable process may be employed to deposit n+ silicon layer 76c.

In at least one embodiment, n+ silicon layer 76c may be formed, for example, from about 100 to about 500 angstroms of phosphorus or arsenic doped silicon having a doping concentration of about $10^{21}$ cm$^{-3}$. Other layer thicknesses, doping types and/or doping concentrations may be used. N+ silicon layer 76c may be doped in situ, for example, by flowing a donor gas during deposition. Other doping methods may be used (e.g., implantation). Persons of ordinary skill in the art will understand that silicon layers 76a, 76b and 76c alternatively may be doped p+/n/p+, respectively, or may be doped with a single type of dopant to produce junctionless-FETs.

In a sixth masking step, semiconductor layers 76c, 76b and 76a, conductive layer 74 and gate dielectric layer 72 are patterned and etched to form etched rows 78, resulting in the structure shown in FIGS. 4O1-4O2. In at least one embodiment, semiconductor layers 76c, 76b and 76a, conductive layer 74 and dialectic layer 72 are patterned and etched to form substantially parallel, substantially co-planar semiconductor layers on first match line ML1, second match line ML2, third match line ML3 and fourth match line ML4. Example widths for first match line ML1, second match line ML2, third match line ML3 and fourth match line ML4 and/or spacings between the match lines range between about 100 and about 2500 angstroms, although other conductor widths and/or spacings may be used.

Semiconductor layers 76c, 76b and 76a, conductive layer 74 and gate dielectric layer 72 may be patterned and etched in a single pattern/etch procedure or using separate pattern/etch steps. For example, photoresist may be deposited, patterned using standard photolithography techniques, layers 76c, 76b, 76a, 74 and 72 may be etched, and then the photoresist may be removed. Alternatively, a hard mask of some other material, for example silicon dioxide, may be formed on top of semiconductor layer 76c, with BARC on top, then patterned and etched. Similarly, DARC and/or amorphous carbon film (e.g., the Advanced Patterning Film from Applied Materials, Santa Clara, Calif.) may be used as a hard mask.

Any suitable masking and etching process may be used to form etched rows 78. For example, layers 76c, 76b, 76a, 74 and 72 may be patterned with about 1 to about 1.5 micron, more preferably about 1.2 to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, rows 78 may be cleaned using a dilute hydrofluoric/sulfuric acid clean. Such cleaning may be performed in any suitable cleaning tool, such as a Raider tool, available from Semitool of Kalispell, Mont. Example post-etch cleaning may include using ultra-dilute sulfuric acid (e.g., about 1.5 1.8 wt %) for about 74 seconds and/or ultra-dilute HF acid (e.g., about 0.4-0.6 wt %) for 74 seconds. Megasonics may or may not be used. Other clean chemistries, times and/or techniques may be employed.

Gate dielectric material 80 is deposited conformally over rows 78 to fill the voids between rows 78. For example, between about 15 to about 100 angstroms of silicon dioxide may be deposited. Other dielectric materials such as silicon nitride, silicon oxynitride, low K dielectrics, etc., and/or other dielectric material layer thicknesses may be used.

An etch is used to remove portions of gate dielectric material 80 between adjacent pairs of rows 78, leaving only sidewall portions of gate dielectric material 80 on the sides of rows 78. In addition, semiconductor layers 76c, 76b and 76a are etched, resulting in the structure shown in FIGS. 4P1-4P2. For example, a sputter etch or other suitable process may be used to anisotropically etch gate dielectric layer 80. To clear gate dielectric layer 80 from the bottom of the trenches, gate dielectric layer 80 typically may be over-etched somewhat to compensate for variations across a wafer. This may cause the top of the dielectric to recess below the top of semiconductor layer 76c, as shown in FIG. 4P1.

Gate electrode material is deposited over rows 78 and gate dielectric layer 80 to fill the voids between rows 78. In an seventh masking step, the gate electrode material is patterned and etched to form rows 82 of gate electrode material. For example, approximately 100 to 2000 angstroms of such as titanium nitride or other similar metal, a highly-doped semiconductor, such as n+ polysilicon, p+ polysilicon, or other similar conductive material may be deposited. A dielectric material layer 80 is deposited over the rows of gate electrode material 82. For example, approximately 100 to 800 angstroms of silicon dioxide may be deposited and planarized using chemical mechanical polishing or an etch-back process to form a planar surface 114.

Following planarization, the structure shown in FIGS. 4Q1-4Q2 is etched in a direction along the y-axis. For example, etched rows 78 and gate electrode material 80 may be patterned and etched using conventional lithography techniques, with a soft or hard mask, and wet or dry etch processing.

A stack of a dielectric layer 84 and a conductive layer 86 are formed on planar surface 114, resulting in the structure illustrated in FIGS. 4R1-4R2. For example, dielectric layer 84 may be approximately 3000-7000 angstroms of silicon dioxide. Other dielectric materials such as silicon nitride, silicon oxynitride, low K dielectrics, etc., and/or other dielectric material layer thicknesses may be used. Example low K dielectrics include carbon doped oxides, silicon carbon layers, or the like.

Conductive layer 86 may include any suitable conductive material such as tungsten or another appropriate metal, heavily doped semiconductor material, a conductive silicide, a conductive silicide-germanide, a conductive germanide, or the like deposited by any suitable method (e.g., CVD, PVD, etc.). In at least one embodiment, conductive layer 84 may comprise between about 200 and about 2500 angstroms of tungsten. An optional conductive adhesion layer (not shown), such as titanium nitride, tantalum nitride, or other conductive material may be deposited prior to the Tungsten deposition. This adhesion layer may be, for example, between 20 and 250 Angstroms thick. Other conductive layer materials and/or thicknesses may be used.

In an eighth masking step, conductive layer 86 and dielectric layer 84 are patterned and etched to form etched GROUND lines GNDa and GNDb, resulting in the structure shown in FIGS. 4S1-4S2. Conductive layer 86 and dielectric layer 84 may be patterned and etched in a single pattern/etch procedure or using separate pattern/etch steps. For example, photoresist may be deposited, patterned using standard photolithography techniques, layers 86 and 84 may be etched, and then the photoresist may be removed. Alternatively, a hard mask of some other material, for example silicon dioxide, may be formed on top of conductive layer 86, with BARC on top, then patterned and etched. Similarly, DARC and/or amorphous carbon film (e.g., the Advanced Patterning Film from Applied Materials, Santa Clara, Calif.) may be used as a hard mask.

Any suitable masking and etching process may be used to form etched GROUND lines GNDa and GNDb. For example, layers 86 and 84 may be patterned with about 1 to about 1.5 micron, more preferably about 1.2 to about 1.4 micron, of photoresist PR using standard photolithographic techniques. Thinner PR layers may be used with smaller critical dimensions and technology nodes. In some embodiments, an oxide hard mask may be used below the PR layer to improve pattern transfer and protect underlying layers during etching.

In some embodiments, after etching, layers 86 and 84 may be cleaned using a dilute hydrofluoric/sulfuric acid clean. Such cleaning may be performed in any suitable cleaning tool, such as a Raider tool. Example post-etch cleaning may include using ultra-dilute sulfuric acid (e.g., about 1.5 1.8 wt %) for about 60 seconds and/or ultra-dilute hydrofluoric ("HF") acid (e.g., about 0.4-0.6 wt %) for 60 seconds. Megasonics may or may not be used. Other clean chemistries, times and/or techniques may be employed.

GROUND lines GNDa and GNDb are used as a mask to etch dielectric layer 84, resulting in the structure shown in FIGS. 4T1-4T2. Any suitable etching process may be used to etch dielectric layer 82. Next, GROUND lines GNDa and GNDb are used as a mask to etch conductive layers 82, to form gate terminals GMXa, GMXb, . . . , GMXh, resulting in the structure shown in FIGS. 4U1-4U2. Finally, GROUND lines GNDa and GNDb are used as a mask to etch semiconductor layers 76*c*, 76*b* and 76*a* to form Vertical Transistors MLXa, MLXb, . . . , MLXg and MLXh, resulting in the structure shown in FIGS. 4V1-4V3.

As illustrated in FIGS. 4V1-4V3, in this embodiment, gate terminals GMXa, GMXb, . . . , GMXh are aligned with drain/source terminals of Vertical Transistors M3*a*, M4*a*, M3*b*, M4*b* . . . , M3*h* and M4*h*, respectively.

Thus, as described above, one embodiment includes a content addressable memory cell is that includes plurality of transistors having a minimum feature size F, and a plurality of memory elements coupled to the plurality of transistors. The content addressable memory cell occupies an area of between $18F^2$ and $36F^2$.

One embodiment includes a content addressable memory cell that includes five vertically-oriented pillar-shaped transistors and two reversible resistance-switching memory elements coupled to the five vertically-oriented pillar-shaped transistors.

One embodiment includes a content addressable memory cell for use with a bit line, a complementary bit line, a word select line, a read/write line, a search line, a complementary search line, and a match line. The content addressable memory cell includes a first transistor, a second transistor, a third transistor, a fourth transistor, a fifth transistor, and first and second reversible resistance-switching elements. The first transistor includes a first terminal coupled to the bit line, a second terminal coupled to the word select line, and a third terminal. The first reversible resistance-switching element includes a first terminal coupled to the third terminal of the first transistor, and a second terminal coupled to the read/write line. The second transistor includes a first terminal coupled to the complementary bit line, a second terminal coupled to the word select line, and a third terminal. The second reversible resistance-switching element includes a first terminal coupled to the third terminal of the second transistor, and a second terminal coupled to the read/write line. The third transistor includes a first terminal coupled to the search line, a second terminal coupled to the first terminal of the first reversible resistance-switching element and the third terminal of the first transistor, and a third terminal. The fourth transistor includes a first terminal coupled to the complementary search line, a second terminal coupled to the first terminal of the second reversible resistance-switching element and the third terminal of the second transistor, and a third terminal. The fifth transistor includes a first terminal coupled to the match line, a second terminal coupled to the third terminal of the third transistor and the third terminal of the fourth transistor, and a third terminal coupled to GROUND.

One embodiment includes a method of forming a content addressable memory cell. The method includes providing a plurality of transistors comprising a minimum feature size F, and providing a plurality of memory elements coupled to the plurality of transistors. The content addressable memory cell occupies an area of between $18F^2$ and $36F^2$.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. A content addressable memory cell comprising:
   a first vertically-oriented pillar-shaped transistor and a second vertically-oriented pillar-shaped transistor each disposed above a substrate;
   a third vertically-oriented pillar-shaped transistor and a fourth vertically-oriented pillar-shaped transistor each disposed above the first vertically-oriented pillar-shaped transistor and the second vertically-oriented pillar-shaped transistor, the third vertically-oriented pillar-shaped transistor coupled to the first vertically-oriented pillar-shaped transistor, and the fourth vertically-oriented pillar-shaped transistor coupled to the second vertically-oriented pillar-shaped transistor;
   a fifth vertically-oriented pillar-shaped transistor disposed above the third vertically-oriented pillar-shaped transistor and the fourth vertically-oriented pillar-shaped transistor, the fifth vertically-oriented pillar-shaped transistor coupled to the third vertically-oriented pillar-shaped transistor and the fourth vertically-oriented pillar-shaped transistor; and
   a first reversible resistance-switching memory element coupled to the first and third vertically-oriented pillar-shaped transistors, and a second reversible resistance-switching memory element coupled to the second and fourth vertically-oriented pillar-shaped transistors.

2. The content addressable memory cell of claim 1, wherein each of the vertically-oriented pillar-shaped transistors comprises a field-effect transistor or a bipolar transistor.

3. The content addressable memory cell of claim 1, wherein each of the reversible resistance-switching memory elements comprises one or more of a metal oxide, a solid electrolyte, a phase-change material, a magnetic material, and a carbon material.

4. The content addressable memory cell of claim 1, wherein each of the reversible resistance-switching memory elements comprises one or more of NiO, $Nb_2O_5$, $TiO_2$, $HfO_2$, $Al_2O_3$, $MgO_x$, $CrO_2$, VO, BN, $TaO_2$, $Ta_2O_3$, and AlN.

5. A content addressable memory array comprising a plurality of content addressable memory cells of claim 1.

6. A content addressable memory cell for use with a bit line, a complementary bit line, a word select line, a read/write line, a search line, a complementary search line, and a match line, the content addressable memory cell comprising:
   a first transistor comprising a first terminal coupled to the bit line, a second terminal coupled to the word select line, and a third terminal;
   a first reversible resistance-switching element comprising a first terminal coupled to the third terminal of the first transistor, and a second terminal coupled to the read/write line;
   a second transistor comprising a first terminal coupled to the complementary bit line, a second terminal coupled to the word select line, and a third terminal;
   a second reversible resistance-switching element comprising a first terminal coupled to the third terminal of the second transistor, and a second terminal coupled to the read/write line;
   a third transistor comprising a first terminal coupled to the search line, a second terminal coupled to the first terminal of the first reversible resistance-switching element and the third terminal of the first transistor, and a third terminal;
   a fourth transistor comprising a first terminal coupled to the complementary search line, a second terminal coupled to the first terminal of the second reversible resistance-switching element and the third terminal of the second transistor, and a third terminal; and
   a fifth transistor comprising a first terminal coupled to the match line, a second terminal coupled to the third terminal of the third transistor and the third terminal of the fourth transistor, and a third terminal coupled to GROUND.

7. The content addressable memory cell of claim 6, wherein each of the first, second, third, fourth and fifth transistors comprises a vertically-oriented pillar-shaped transistor.

8. The content addressable memory cell of claim 6, wherein each of the first, second, third, fourth and fifth transistors comprises a field-effect transistor or a bipolar transistor.

9. The content addressable memory cell of claim 6, wherein the first and second reversible resistance-switching elements each comprise one or more of a metal oxide, a solid electrolyte, a phase-change material, a magnetic material, and a carbon material.

10. The content addressable memory cell of claim 6, wherein the first and second reversible resistance-switching elements each comprise one or more of NiO, $Nb_2O_5$, $TiO_2$, $HfO_2$, $Al_2O_3$, $MgO_x$, $CrO_2$, VO, BN, $TaO_2$, $Ta_2O_3$, and AlN.

11. A content addressable memory array comprising a plurality of content addressable memory cells of claim 6.

* * * * *